United States Patent
Yamamoto et al.

(10) Patent No.: US 6,392,364 B1
(45) Date of Patent: May 21, 2002

(54) HIGH VOLTAGE DISCHARGE LAMP APPARATUS FOR VEHICLES

(75) Inventors: Noboru Yamamoto, Kariya; Yasutoshi Horii, Nagoya; Hiroaki Okuchi, Anjo; Hiromi Hiramatsu, Kariya; Kenji Yoneima, Anjo; Yuji Kajita, Chita-gun; Masamichi Ishikawa, Hekinan; Goichi Oda, Shimizu; Tomoyuki Ichikawa, Shimizu; Yukinobu Hiranaka, Shimizu; Yasushi Noyori, Shimizu, all of (JP)

(73) Assignee: Denso Corporation, Kariya (JP)

( * ) Notice: Subject to any disclaimer, the term of this patent is extended or adjusted under 35 U.S.C. 154(b) by 34 days.

(21) Appl. No.: 09/597,733

(22) Filed: Jun. 19, 2000

(30) Foreign Application Priority Data

| Jun. 21, 1999 | (JP) | 11-174129 |
| Jul. 30, 1999 | (JP) | 11-217887 |
| Jul. 30, 1999 | (JP) | 11-217889 |
| Jul. 30, 1999 | (JP) | 11-217891 |
| Jul. 30, 1999 | (JP) | 11-217892 |
| Jul. 30, 1999 | (JP) | 11-217893 |
| Jul. 30, 1999 | (JP) | 11-217894 |
| Jul. 30, 1999 | (JP) | 11-217895 |

(51) Int. Cl.$^7$ .............................. G05F 1/00
(52) U.S. Cl. ............ 315/291; 315/307; 315/309; 315/DIG. 7; 315/82
(58) Field of Search .......... 315/291, 82, 209 R, 315/307, 282, DIG. 7, 57, 118, 117, 209 SC, 309

(56) References Cited

U.S. PATENT DOCUMENTS

| 5,751,121 A | 5/1998 | Toyama .................. 315/307 |
| 5,939,835 A | * 8/1999 | Takeda et al. ............ 315/209 R |
| 6,127,788 A | * 10/2000 | Yamamoto et al. ......... 315/307 |

FOREIGN PATENT DOCUMENTS

| EP | 0 955 793 A2 | 11/1999 |
| JP | 63-113472 | 5/1988 |
| JP | 3-246893 | 11/1991 |
| JP | 6-70199 | 9/1994 |
| JP | 6-86203 | 12/1994 |
| JP | 7-94292 | 4/1995 |
| JP | 8-321389 | 12/1996 |
| JP | 9-251895 | 9/1997 |

* cited by examiner

*Primary Examiner*—Don Wong
*Assistant Examiner*—Tuyet Thi Vo
(74) *Attorney, Agent, or Firm*—Nixon & Vanderhye P.C.

(57) ABSTRACT

A hybrid IC of electronic circuit for a discharge lamp is disposed on the bottom of a metal case. A transformer, an inductor, a transformer, and a capacitor are disposed in a resin case. The resin case is contained in a metal case. In this instance, the transformer, the inductor, the transformer, and the capacitor are located outside the outer periphery of the IC so that the IC does not overlap on the transformer and other components. The transformer for a starter circuit has a secondary winding the inductance of which is 2.5 mH or larger, and a capacitance of a smoothing capacitor of a DC—DC converter is 0.5 $\mu F$ or smaller. The switching frequency f of a MOS transistor is selected so that $L2 \times C1$ is equal to or larger than $1 \times 10^{-1} \times f^{-1.68}$.

45 Claims, 30 Drawing Sheets

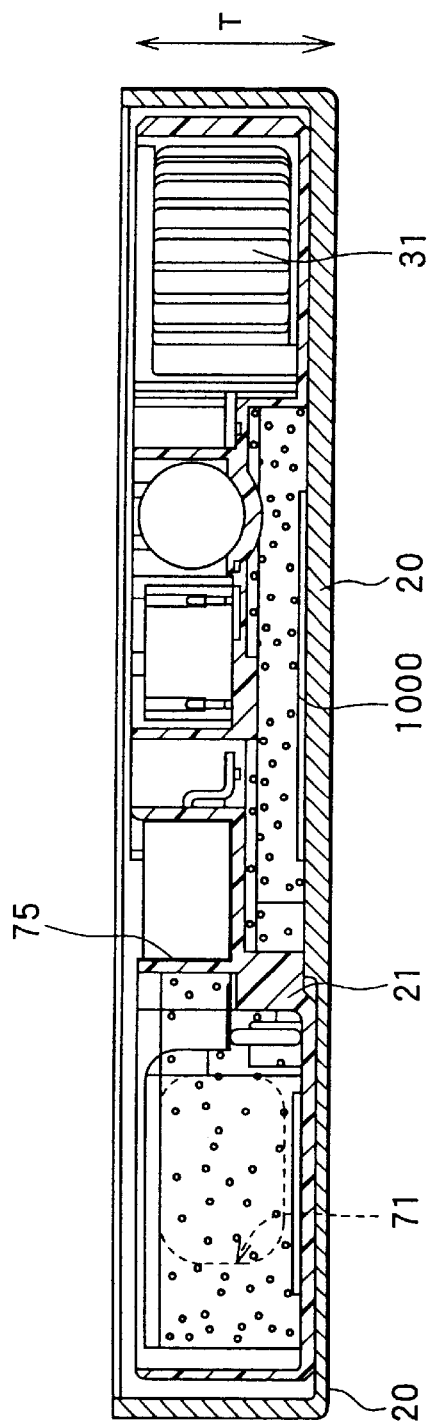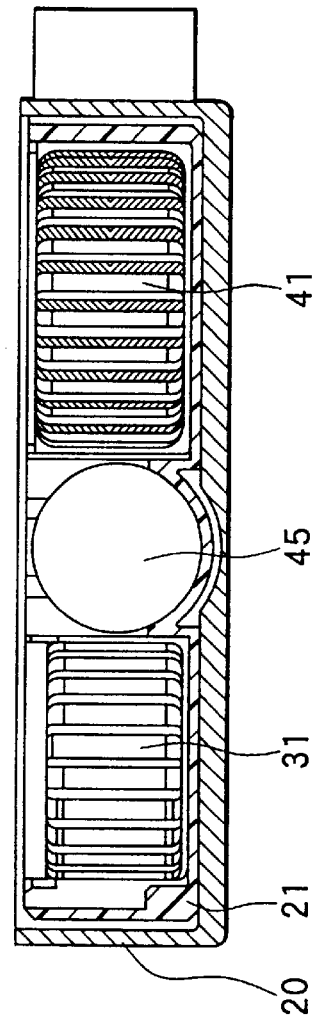
FIG. 3A
FIG. 3B

HIGH VOLTAGE DISCHARGE LAMP APPARATUS FOR VEHICLES

CROSS REFERENCE TO RELATED APPLICATION

This application relates to and incorporates herein by reference Japanese Patent Applications No. 11-174129 filed on Jun. 21, 1999, No. 11-217887 filed on Jul. 30, 1999, No. 11-217889 filed on Jul. 30, 1999, No. 11-217891 filed on Jul. 30, 1999, No. 11-217892 filed on Jul. 30, 1999, No. 11-217893 filed on Jul. 30, 1999, No. 11-217894 filed on Jul. 30, 1999, and No. 11-217895 filed on Jul. 30, 1999.

BACKGROUND OF THE INVENTION

This invention relates to a high voltage discharge lamp apparatus for activating a high voltage discharge lamp, and more particularly relates to a discharge lamp apparatus for use as a headlight of a vehicle.

Various lighting apparatuses for vehicles using a high voltage discharge lamp (ballast) are proposed in, for instance, JP-U-6-86203, JP-A-8-321389, JP-A-9-180888 and EP 0955793 A2 (U.S. patent application Ser. No. 09/304840 and now U.S. Pat. No. 6,232,728 issued May 15, 2001).

The discharge lamp apparatus is mounted in a limited space such as the outside (side face) of a housing of a headlight of a vehicle. In the discharge lamp apparatus, a DC power of a vehicle-mounted battery is boosted to a higher voltage, and inverted to an alternating current (AC) voltage to normally AC-light a discharge lamp. However, at the time of starting up the discharge lamp, a high voltage pulse is produced by a starter transformer. The high voltage pulse generates electrical discharge between electrodes of the lamp due to dielectric breakdown thereby to form arc discharge so that stable lighting is ensured by the AC voltage thereafter.

The proposed apparatuses have various aspects to be improved further with respect to assemblability, mountability in a limited space, operability of electronic circuits and the like.

SUMMARY OF THE INVENTION

It is therefore an object of the present invention to provide a discharge lamp apparatus for vehicles which can be assembled and mounted in a limited space in a simplified process.

It is another object of the present invention to provide a discharge lamp apparatus for vehicles which operates properly under various conditions.

In one aspect of the present invention, an electronic circuit for a discharge lamp is integrated into a hybrid IC and disposed on the bottom of a metal case. Transformers, an inductor and a capacitor which are not integrated are disposed in a resin case. The resin case is contained in the metal case. In this instance, the transformers, the inductors and the capacitor are located outside the outer periphery of the IC so that the IC does not overlap on the transformer and other components.

In another aspect of the present invention, the transformer for a starter circuit has a secondary winding the inductance L2 of which is 2.5 mH or larger, and the capacitor of a DC—DC converter has a capacitance C2 which is 0.5 $\mu$F or smaller. The switching frequency f of a MOS transistor of the DC—DC converter is selected so that L2×C1 is equal to or larger than $1\times10^{-1}\times f^{-1.68}$.

BRIEF DESCRIPTION OF THE DRAWINGS

Other objects, features and advantages of the present invention will become more apparent from the following detailed description made with reference to the accompanying drawings. In the figures:

FIGS. 3A and 3B are sectional views of the discharge lamp apparatus taken along line IIIA—IIIA and line IIIB—IIIB in FIG. 2, respectively;

DETAILED DESCRIPTION OF THE PREFERRED EMBODIMENT

Figure 1:
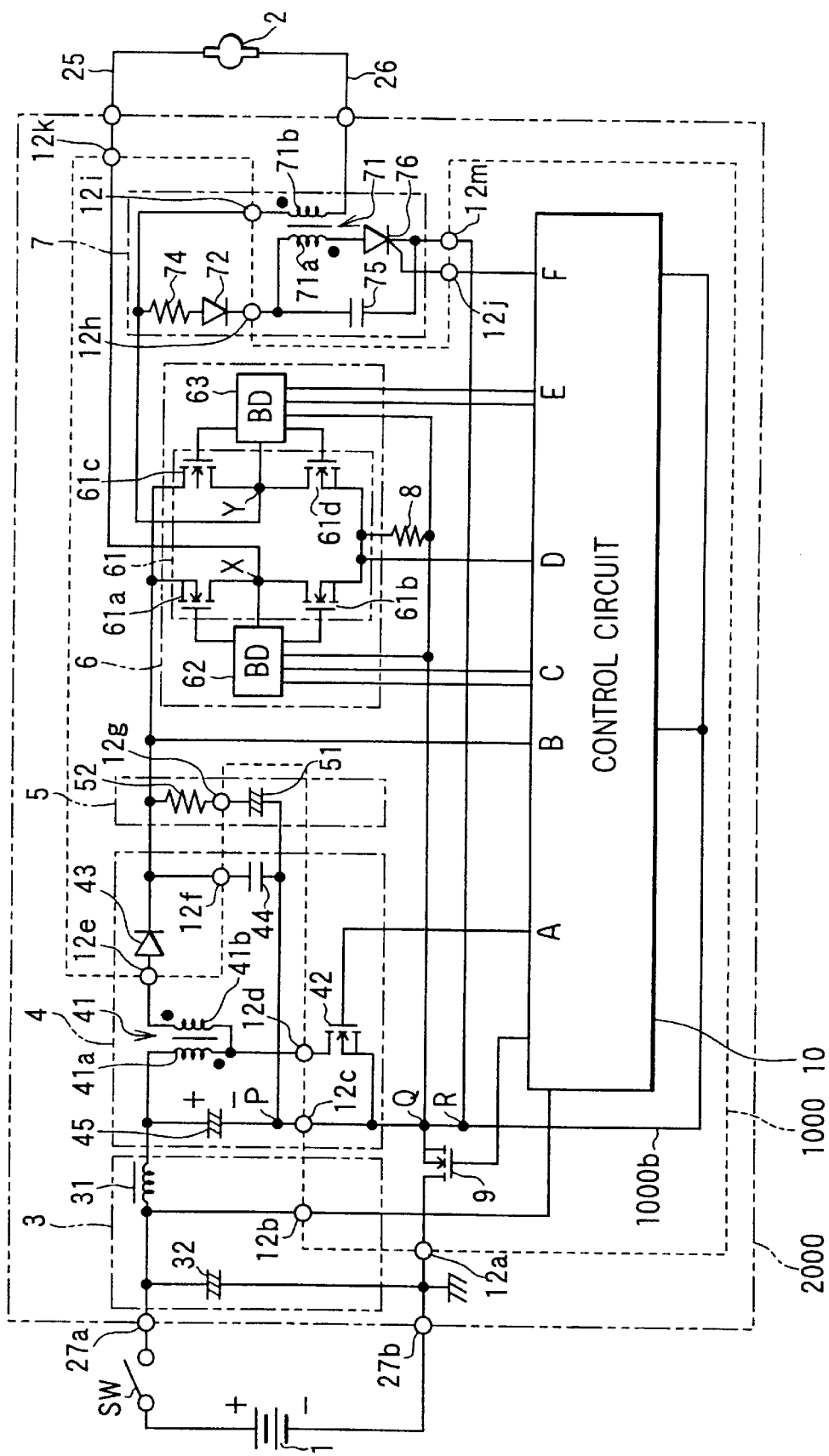
FIG. 1 is an electrical wiring diagram illustrating a circuit structure of a discharge lamp apparatus according to a first embodiment of the present invention.

The present invention will be described in detail with reference to various embodiments in which the same or like parts are designated with the same or like reference numerals.

First Embodiment

Referring first to FIG. 1, a discharge lamp apparatus for vehicles (a discharge lamp apparatus) 2000 is connected to an on-vehicle battery 1. The battery 1 is a direct current (DC) power source which supplies an electric power to a lamp 2 used as a vehicle headlight when a lighting switch SW is turned on. The discharge lamp apparatus 2000 is provided with the circuit function units such as a filter circuit 3, a DC—DC converter 4 used as a DC power circuit, a lighting assist circuit 5, an inverter circuit 6, and a starter circuit (high voltage pulse generation circuit) 7.

The filter circuit 3 comprises an inductor 31 and a capacitor 32, and removes electromagnetic noise generated by the DC—DC converter 4.

The DC—DC converter 4 comprises a flyback transformer 41 having a primary winding 41a provided on the battery side and a secondary winding 41b provided on the lamp side, MOS transistor 42 used as a switching element connected to the primary winding 41a, a rectifier diode 43 connected to the secondary winding 41b, and a capacitor 44 and a capacitor 45 for smoothing the output. The DC—DC converter 4 supplies a boosted voltage generated by boosting the battery voltage VB. When the MOS transistor 42 is turned on, a primary current flows through the primary winding 41a and energy is stored in the primary winding 41a. On the other hand, when the MOS transistor 42 is turned off, the energy of the primary winding 41a is released by way of the secondary winding 41b. By repeating such operation, a high voltage is generated from the connection point between the diode 43 and the smoothing capacitor 44.

The lighting assist circuit 5 comprises a capacitor 51 and a resistor 52. The capacitor 51 is charged to the same voltage level as that of the voltage applied to the lamp 2 after the lighting switch SW is turned on, and when the voltage between electrodes of the lamp 2 decreases due to dielectric breakdown between electrodes of the lamp 2, the electric charge charged in the capacitor 51 is discharged by way of the lamp 2 to thereby shift to arc discharge quickly.

The inverter circuit 6 comprises an H-type bridge circuit 61 and abridge driving circuits 62 and 63. The inverter circuit 6 is used for lighting the lamp 2 with a rectangular wave signal or an alternating current signal (AC). The H-type bridge circuit 61 comprises MOS transistors 61a to 61d that constitute semiconductor switching elements provided to form the H-type bridge. The bridge driving circuits 62 and 63 on/off-drive the MOS transistors 61a and 61d connected in series as a set and the MOS transistors 61b and 61c connected in series as a set alternately in response to the control signal supplied from terminals C and E of a control circuit 10. As a result, the direction of the discharge current of the lamp 2 is switched alternately, the polarity of the applied voltage (discharge voltage) of the lamp 2 is inverted so that the lamp 2 is AC-lighted.

The starter circuit 7 is disposed between the middle potential point Y of the H-type bridge circuit 61 and the negative electrode terminal of the battery 1. The starter circuit 7 comprises a high voltage generation transformer (starter transformer) 71 having the primary winding 71a and a secondary winding 71b, diodes 72 and 73, a resistor 74, a capacitor 75, and a thyristor 76 that is a unidirectional semiconductor element. The primary winding 71a of the high voltage generation transformer 71 is connected to the capacitor 75, and the secondary winding 71b is disposed between the H-type bridge circuit 61 and the lamp 2. The lamp 2 is also connected to the middle potential point X of the H-bridge circuit 6.

The starter circuit 7 applies a high voltage pulse to the lamp 2 when lighting of the lamp 2 is started. In detail, the control circuit 10 controls the gate signal of the thyristor 76 so that when the lighting switch SW is turned on, the MOS transistor set 61a and 61d and the MOS transistor set 61b and 61c are on/off-driven. At this time, the capacitor 75 is charged when the MOS transistor set 61b and 61c is turned on, and the thyristor 76 is on when the MOS transistor set 61b and 61c is turned off.

When the gate signal is applied to the thyristor 76 through a terminal F, the capacitor 75 discharges by way of the primary winding 71a of the high voltage generation transformer 71 to thereby generate the high voltage pulse on the secondary winding 71b of the high voltage generation transformer 71. The high voltage pulse is applied to the lamp 2 so that dielectric breakdown occurs between the electrodes of the lamp 2. Thus, the lighting of the lamp 2 is started.

The control circuit 10 may be constructed similarly as that disclosed in EP 0955793 A2 (U.S. patent application Ser. No. 09/304,840 filed on May 5, 1999 and now U.S. Pat. No. 6,232,728 issued May 15, 2001), the disclosure of which is incorporated herein by reference. It controls the MOS transistor 42, the bridge circuits 62 and 63, and the thyristor 76. The control circuit 10 is supplied with a lamp voltage of the DC—DC converter 4 (that is, a voltage applied to the inverter circuit 6) VL through a terminal B and a current IL that flows from the inverter circuit 6 to the negative electrode side of the battery 1. The current IL is detected as a voltage of the current detection resistor 8 applied through a terminal D.

Furthermore, the MOS transistor 9 is an element used for protecting inverse connection, and the inverse voltage is protected from being applied to the circuit function structure when the battery 1 is connected inversely in replacement work of the battery 1.

As described later, the control circuit 10 is provided with a PWM control circuit for on/off-switching the MOS transistor 42 by means of the PWM signal, a sample hold circuit for sample-holding the lamp voltage VL, a lamp power control circuit for controlling the lamp power to a desired value based on the sample-held lamp voltage VL and lamp current IL, and an H-type bridge control circuit for controlling the H-type bridge.

In the above circuit structure, electrical component parts that can be formed as semiconductor devices such as the H-type bridge circuit 61, control circuit 10, MOS transistors 9 and 42, diodes 43 and 72, and resistors 8, 52, and 74 are integrated into a piece as a hybrid integrated circuit (HIC) 1000. Other electrical component parts such as transformers 41 and 71, capacitors 32, 44, 45, 51, and 75, and thyristor 76 are formed separately from the HIC 1000.

Therefore, by connecting terminals 12a to 12m of the HIC 1000 and the other parts electrically at terminals 24a and 24b (FIG. 2 and FIG. 7), the above circuit structure is formed. Thereby, the circuit functional section shown in FIG. 1 is formed.

When the lighting switch SW is turned on, the power source is supplied to components shown in FIG. 1. Then, the control circuit 10 PWM-controls the MOS transistor 42. As a result, the boosted voltage produced from the battery voltage VB by means of the flyback transformer 41 is supplied from the DC—DC converter 4. The H-type bridge control circuit on/off-switches the MOS transistors 61a to 61d in the H-type bridge circuit 61 alternately in the diagonal relation. Thereby, the voltage supplied from the DC—DC converter 4 is supplied to the capacitor 75 of the starter circuit 7 by way of the H-type bridge circuit 61. Thus, the capacitor 75 is charged.

Then, the control circuit 10 supplies a gate signal to the thyristor 76 indicating timing of the MOS transistors 61a to 61d supplied from the H-type bridge control circuit to turn on the thyristor 76. When the thyristor 76 is turned on, the capacitor 75 discharges and the high voltage pulse is applied to the lamp 2. As a result, dielectric breakdown occurs between the electrodes of the lamp 2 to light the lamp 2.

Then, the H-type bridge circuit 61 switches the polarity (direction of the discharge current) of the discharge voltage applied to the lamp 2 to thereby AC-light the lamp 2. The control circuit 10 controls the lamp power to be kept at a predetermined value based to the lamp current IL and the lamp voltage VL. Thereby, the lamp 2 is lighted stably.

Figure 2:
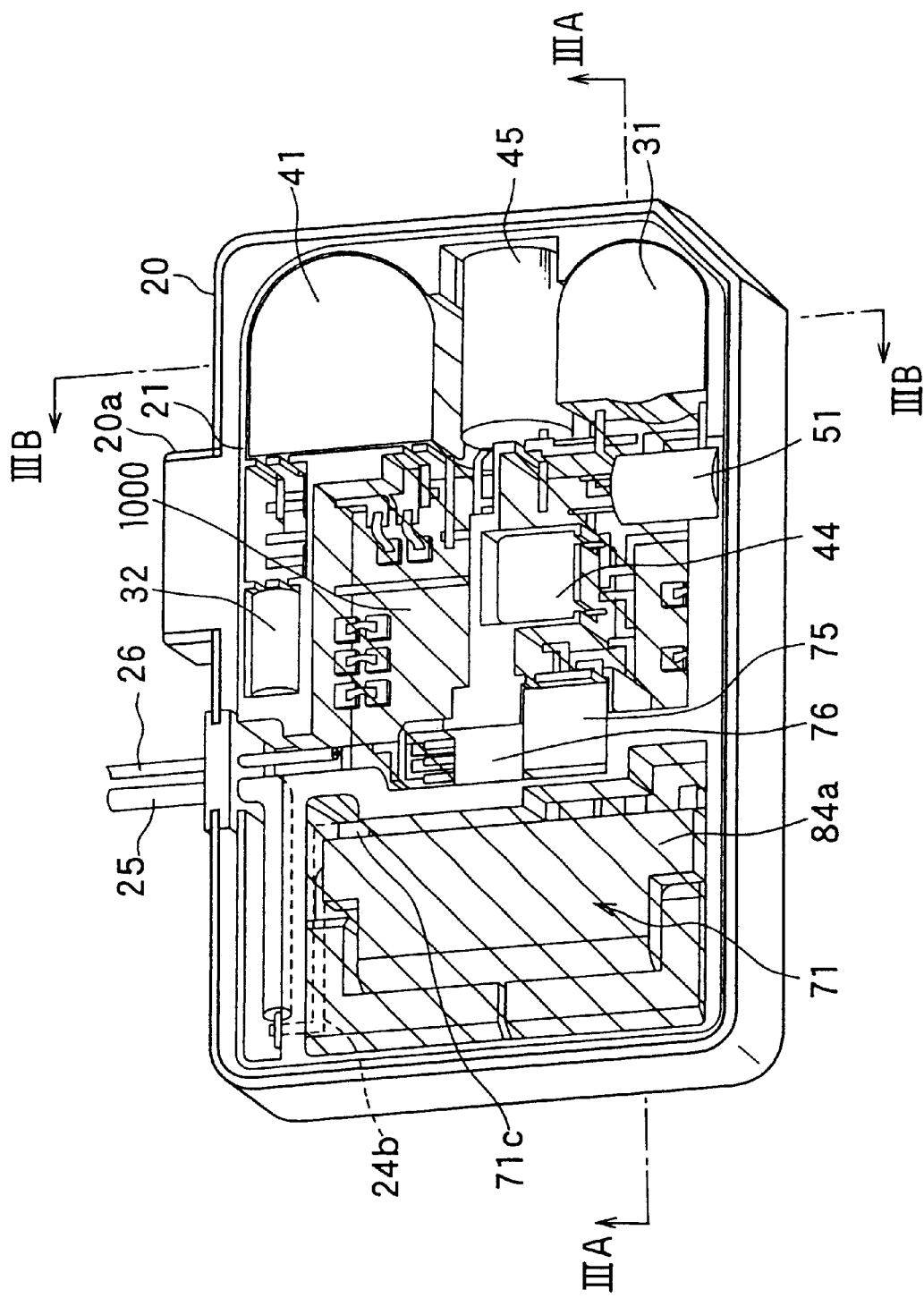
FIG. 2 is a perspective top view illustrating an assembly of the discharge lamp apparatus shown in FIG. 1.

The assembly structure of the discharge lamp apparatus 2000 shown in FIG. 1 is shown in FIGS. 2, 3A and 3B.

As shown in FIG. 2, various component parts that constitute the circuit functional section shown in FIG. 1 are contained in an approximately box-like metal case 20 having one open end. The HIC 1000 is disposed at the central position on the bottom of the metal case 20, and fixed with adhesive or the like. Because the HIC 1000 is adhered to the bottom of the metal case 20, the heat generated in the HIC 1000 is released to the metal case 20. The heat release allows the semiconductor power elements to be mounted on the HIC 1000. Therefore, the circuit functional section can be made in the form of IC, and the circuit functional section can be miniaturized, and further the area of the board on which the circuit functional section is mounted is reduced.

A resin case 21 is provided on the HIC 1000. In this resin case 21, parts that are not in the form of IC as the HIC 1000 are contained. An opening is formed at a predetermined position on the HIC 1000 of the resin case 21 so that the parts that are not in the form of IC are to be connected to various circuits incorporated in the HIC 1000. The parts that are not in the form of IC are connected electrically to various circuits incorporated in the HIC 1000 by way of the terminals 24a and 24b (FIG. 7) that are formed as conductive wiring pattern.

The capacitor 45, inductor 31, and transformer 41 are disposed on the right side in FIG. 2 with respect to the HIC 1000. The capacitor 45 is interposed between the inductor 31 and the transformer 41. Because of the interposition of the capacitor 45, the inductor 31 can be placed apart from the transformer 41 so that leakage magnetic fluxes generated from these components do not interfere each other, and thus the magnetic noise due to magnetic interfere is prevented.

The capacitor 45, the inductor 31, and the transformer 41 are disposed at the outside of the outer periphery of the HIC 1000 so as not to overlap or exist on the HIC 1000. As a result, the thickness T of the discharge lamp apparatus 2000 can be reduced.

Figure 4C:
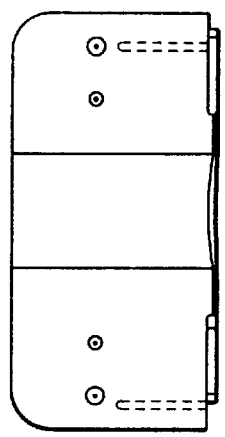
FIGS. 4A–4C are side views illustrating a structure of a transformer used in the discharge lamp apparatus shown in FIGS. 1 and 2.
Figure 4A:
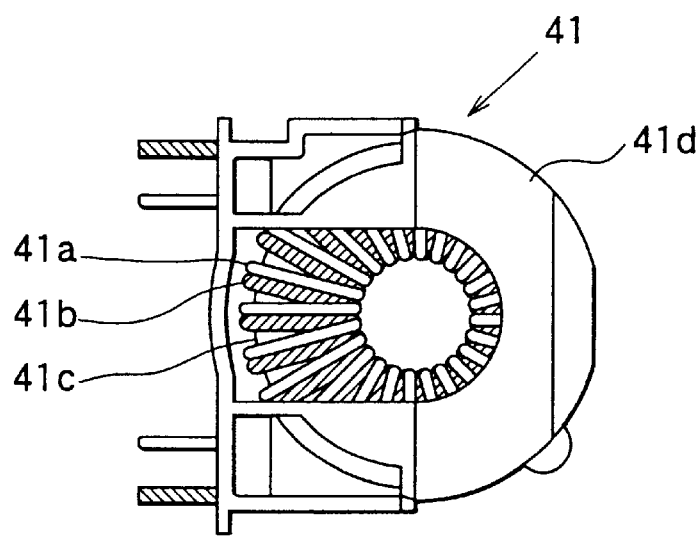
Figure 4B:
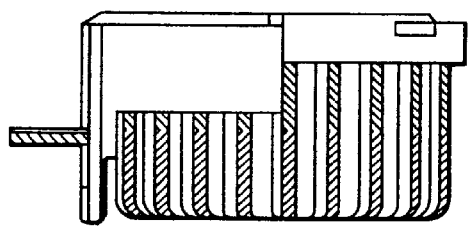

The detailed structure of the transformer 41 is shown in FIGS. 4A, 4B and 4C which are a front view, top view and a left side view of the transformer 41, respectively. The transformer 41 has the structure in which the primary winding 41a and the secondary winding 41b are wound on a ring-shaped toroidal core 41c, and the windings 41a and 41b and core 41c are fixed to a resin base 41d in the form of one piece. The thickness of the resin base 41d is very thin, and the thickness of the transformer 41 is approximately equal to the total thickness of the core 41 and the windings 41a and 41b.

If there is no resin base 41, the shape of the transformer 41 has ups and downs due to the exposed surface of the windings 41a and 41b and brings about difficulty in fixing to the resin case 21. However, because the windings 41a and 41b and the core 41c are fixed on the resin base 41d, these components can be fixed to the resin case 21 easily, and further the resin base 41d prevents the windings 41a and 41b from being in direct contact with the metal case 20 and a cover 22 to ensure electrical insulation. The resin base 41d is effective to thin the discharge lamp apparatus 2000.

The right half of the resin base 41d is approximately circular the left half is approximately quadrangular as shown in FIG. 4A. Terminals of the windings 41a and 41b are led from the end face of the quadrangular side. The portion of the resin case 21 where the transformer 41 is to be placed is formed in arc-shape partially, and the circular portion of the resin base 41d is fitted in the arc-shaped portion. Transformer 41 is placed in the resin case 21 together with the resin base 41d to thereby locate the transformer 41 at the correct position easily, and the terminals of the windings 41a and 41b are positioned above the HIC 1000.

The inductor 31 is provided with a resin base having the same structure as that of the transformer 41. The space of the resin case 21 for containing the inductor 31 has the same structure as that of the space for containing the transformer 41. Therefore, the inductor 31 can also be placed at the correct position easily.

The saturation magnetic flux density of the core 41c of the transformer 41 is 8000 gauss at 1000° C. Because of 8000 gauss, an excessive current detection mechanism (excessive current detection resistor), that has been provided conventionally, is not provided in the discharge lamp apparatus 2000.

Figure 5:
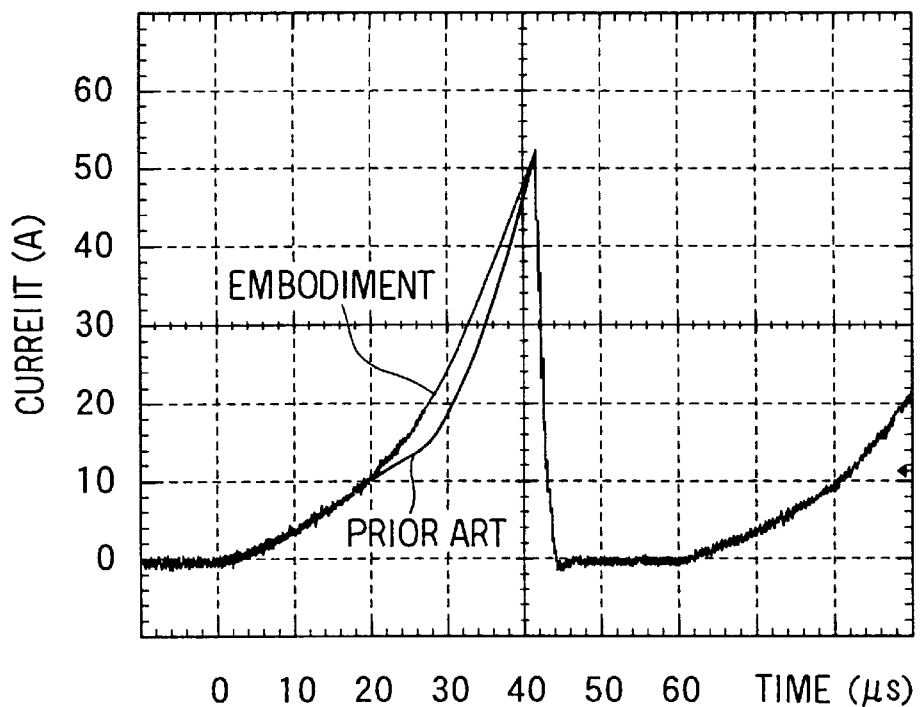
FIG. 5 is a waveform diagram illustrating a current flowing in the discharge lamp apparatus shown in FIG. 1.

FIG. 5 shows a current rising waveform obtained when the transformer 41 having such structure is used. AS shown in FIG. 5, the rising curve of current changes with increasing the current because the inductance decreases with increasing the current (current superimposing characteristic is poor), and the core 41c is not saturated. Thus, as evident from the comparison in FIG. 5, there is no sharp current increase due to saturation of the core 41c. In an experiment, it was confirmed that excessive current due to saturation of the core 41c does not occur as long as the saturation magnetic flux of the core 41c is larger than 6000 gauss at 1000° C.

Because the saturation magnetic flux density of the core 41c is larger than 6000 gauss at 1000° C. in the present embodiment, the excessive current of the core 41c due to saturation is prevented. Therefore, an excessive current protection mechanism can be eliminated, and the discharge lamp apparatus 2000 can be miniaturized more.

On the other hand, as shown in FIG. 2, the high voltage generation transformer 71 is disposed on the left side with respect to the HIC 1000. The transformer 71 is also located on the outside of the outer periphery of the HIC 1000 so as not to overlap on the HIC 1000. Thereby, the thickness T of the discharge lamp apparatus 2000 is reduced in the same manner as described above. Because of the above arrangement, the HIC 1000 is interposed between the transformer 41 and the inductor 31, and the transformer 41 is placed apart farthest from the inductor 31 each other in the metal case 20. The leakage magnetic fluxes generated from these inductor 31 and the transformers 41 and 71 do not interfere each other, and the effect that the magnetic noise due to magnetic interfere is prevented is obtained. It was confirmed that the above effect is provided as long as the distance between the core 41c of the inductor 31 and the core of the transformer 71 is larger than 10 mm and the distance between the core 41c of the transformer 41 and the core of the transformer 71 is larger than 10 mm based on an experiment. According to the arrangement of the present embodiment, the distance is 60 mm for both, and the above effect is therefore obtained sufficiently.

The lead wires 25 and 26 led from the metal case 20 are to be connected to the lamp 2 (FIG. 1). The lead wire 25 is the high voltage side wire and the lead wire 26 is the ground side wire. A connector 20a provided on the metal case 20 is provided with terminals 27a and 27b (FIG. 7) constituted with the terminal 24b, and connected to the battery 1 (FIG. 1).

Figure 6:
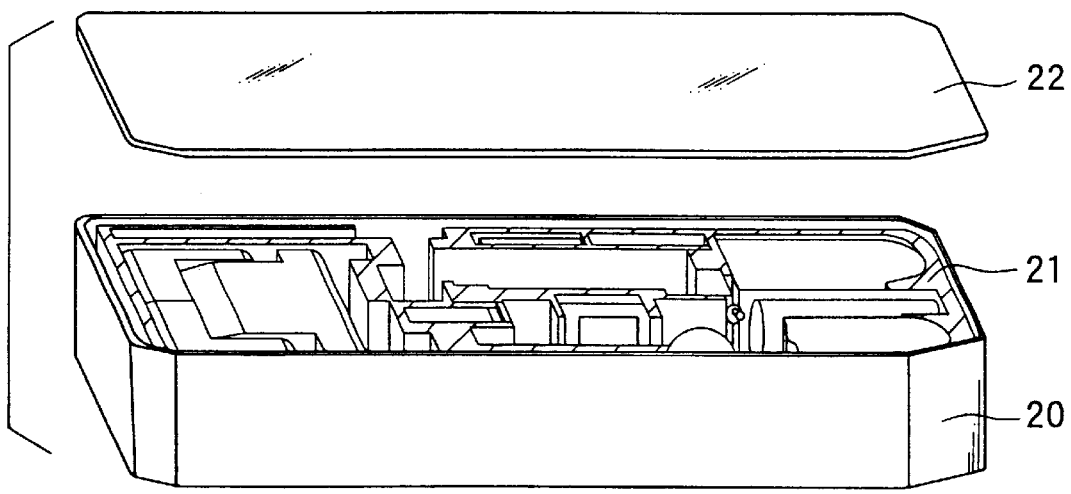
FIG. 6 is a perspective view illustrating a cover which covers the discharge lamp apparatus shown in FIG. 2.

As shown in FIG. 6, in the discharge lamp apparatus 2000 having the above structure, the opening of the metal case 20 is covered by a metal cover 22, and the cover 22 is fixed to the metal case 20 with fixing means such as screws closing the cover 22.

In the discharge lamp apparatus 2000 having the above arrangement, because the inductor 31, the transformers 41 and 71, that are magnetic circuit elements in nature, are located outside of the outer periphery of the HIC 1000, the magnetic circuit elements are located apart from the HIC 1000 on which the control circuit 10 used as an arithmetic circuit is formed. Therefore, the adverse effect of the leakage magnetic flux generated from the magnetic circuit elements on the arithmetic circuit can be eliminated.

Furthermore, as described above, the HIC 1000 is located so as not to overlap on the magnetic circuit elements and thereby make the discharge lamp apparatus 2000 thin. In detail, the thickness of the discharge lamp apparatus 2000 is determined by the thickness of the transformer 41 and the transformer 71. However, in the case of the arrangement in which the HIC 1000 overlaps on the magnetic circuit elements, the thickness increases by the thickness of the HIC 1000, the discharge lamp apparatus can be made thin down to the size defined by the thickness of the transformers 41 and 71. In detail, because the core 41c of the transformer 41 is in the toroidal type, the thickness of the transformer 41 is equal to the total value of the thickness of the core 41 and the thickness of the windings 41a and 41b. In the case of the lamp 2 of a 35W bulb, the thickness T of the discharge lamp apparatus 2000 can be reduced to approximately 25 mm or thinner.

Because volume efficiency of various parts in the metal case 20, it is possible to reduce the inside volume of the outer container comprising the metal case 22 and cover 22 to 300 cc or smaller. Because the thickness T of the discharge lamp apparatus 2000 is made thin and the internal volume is made small, the weight of the discharge lamp apparatus 2000 can be made 500 g or lighter.

Figure 7:
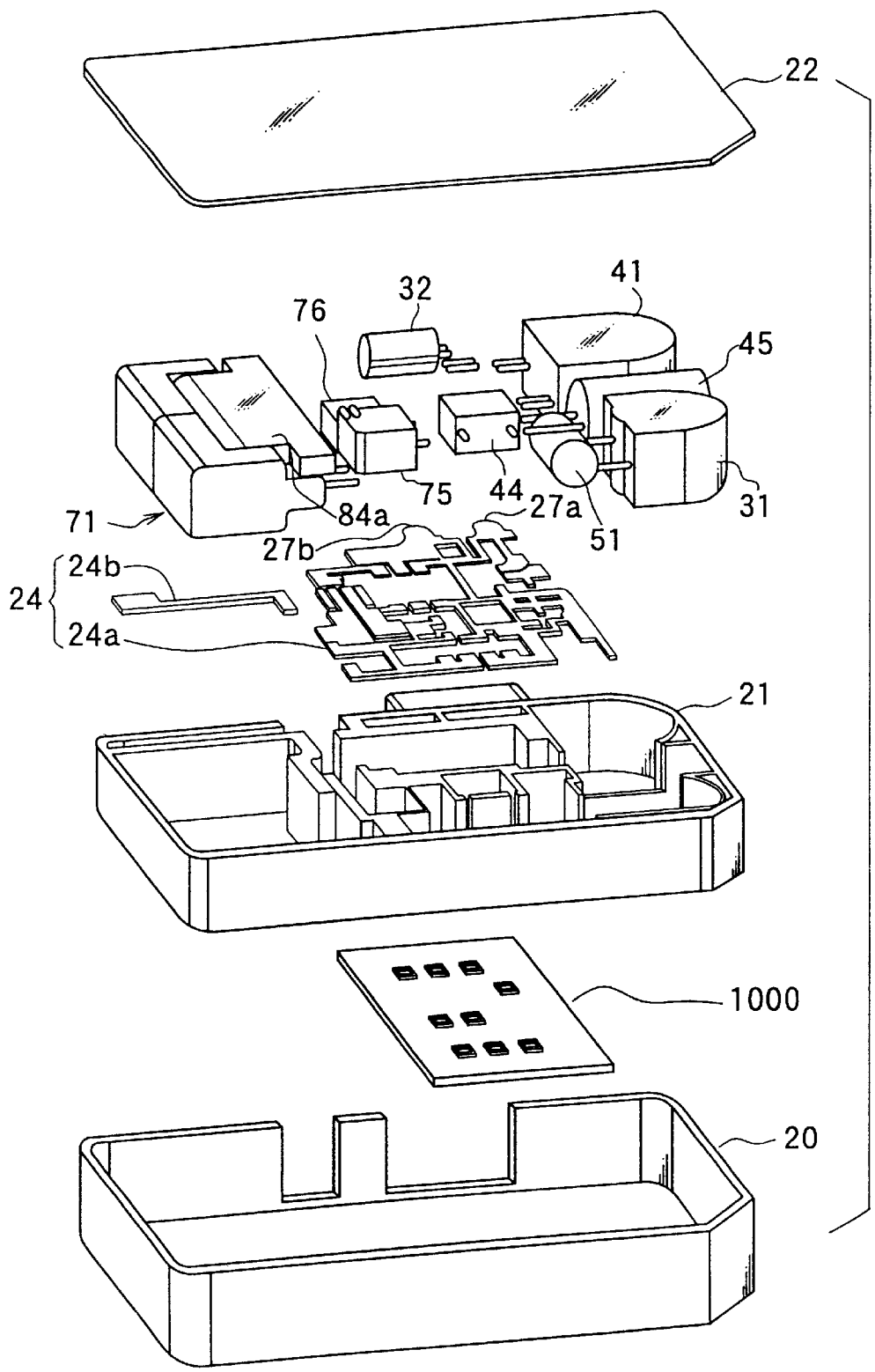
FIG. 7 is an exploded perspective view illustrating electrical circuit parts before being assembled in the discharge lamp apparatus shown in FIG. 2.

FIG. 7 shows an exploded perspective view of the parts before assembling the discharge lamp apparatus 2000 for showing the arrangement of the parts. Assembling work of the discharge lamp apparatus 2000 will be described with reference to FIG. 7.

First, the terminals 24a and 24b are insert-molded in the resin case 21, and parts that are not in the form of IC are contained in the resin case 21 (transformer 41, inductor 31, capacitors 32, 44, 45, 51, and 75, thyristor 76, and transformer 71). The parts that are not in the form of IC are connected to the terminals 24a and 24b by welding or soldering. For example, the high voltage terminal 71c (FIG. 2) of the transformer 71 is connected to the one end of the terminal 24b.

The HIC 1000 is adhered at the central position on the bottom of the metal case 20, and the resin case 20 is fixed with adhesive in the metal case 20. Subsequently, portions of the terminal 24a are connected electrically to the terminals 12a to 12m of the HIC 1000 by wire bonding by use of aluminum wire.

Thereafter, the portion of the transformer 71 and HIC 1000 is sealed with silicone gel. The portion that is sealed with silicone gel is shown in FIG. 2 with hatching. After the silicon gel has hardened, the other end of the terminal 24b is connected to the terminal of the high voltage side lead wire 25 by welding or soldering. Finally, the opening of the metal case 20 is covered by the cover 22 to close the metal case 20, and thus the discharge lamp apparatus is completed.

Figure 8:
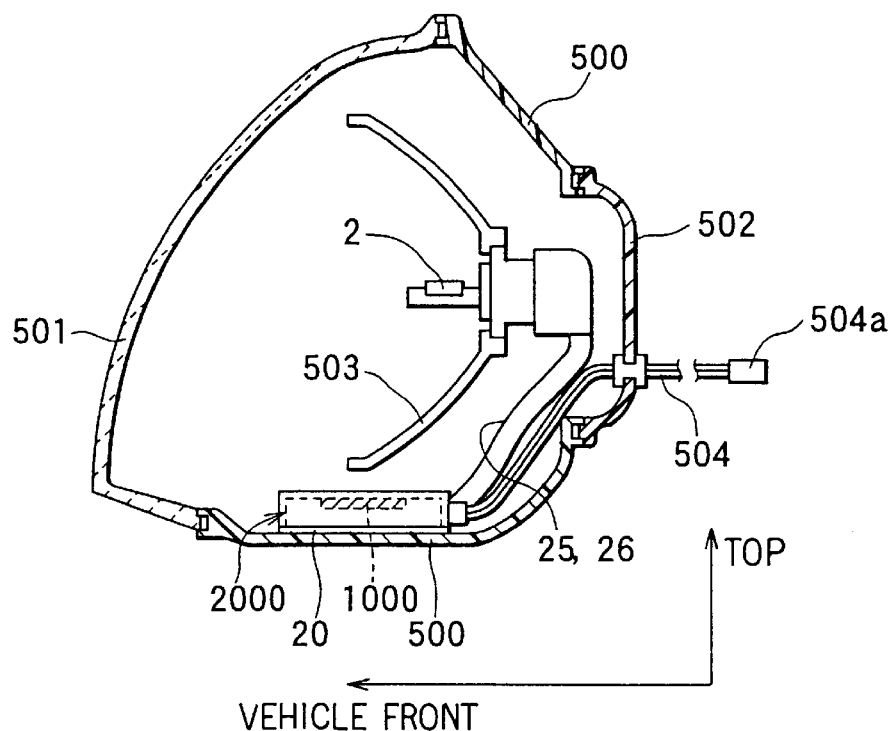
FIG. 8 is a sectional view illustrating an arrangement of the discharge lamp apparatus mounted on a vehicle lamp fitting.

Next, the discharge lamp apparatus 2000 having the above structure is mounted in a vehicle headlight as shown in FIG. 8. A lamp housing 500 fixed to the vehicle, a full face lens 501 for transmitting the light of the lamp 2 to the front side of the vehicle, a lamp changing cover 502 that is structured so as to be detachable from the full face lens 501 constitute a water-proof lamp fitting chamber. In the chamber, the lamp 2 is fixed together with a reflector 503 for reflecting the light.

The discharge lamp apparatus 2000 is disposed in the lamp fitting chamber together with the lamp 2, and connected electrically to the lamp 2 by way of the lead wires 25 and 26 in the lamp fitting chamber. The discharge lamp apparatus 2000 is fixed on the bottom of the lamp housing 500 with the cover 22 directed downward. In detail, the discharge lamp apparatus 2000 is disposed so that the bottom of the meal case 20 on which the HIC 2000 is disposed is disposed upward, and the opening of the metal case 20 (connecting portion between the metal case 20 and the cover 22) is disposed downward.

By disposing the discharge lamp apparatus 2000 in the water-proof lamp fitting chamber as described above, it is possible to prevent water from entering into the discharge lamp apparatus 2000 even though the discharge lamp apparatus 2000 has no water-proof structure. Even if water enters into the lamp fitting chamber, water is prevented from entering into the metal case 20 because the opening of the metal case 20 is disposed downward.

Meanwhile, the lead wire 504 connected to the connector 20*a* of the discharge lamp apparatus 2000 is led to the outside of the lamp fitting chamber through a hole formed on the cover 502, and connected to the ignition switch SW (FIG. 1) by way of the connector 504*a* provided on the end of the lead wire 504.

Second Embodiment

Figure 9:
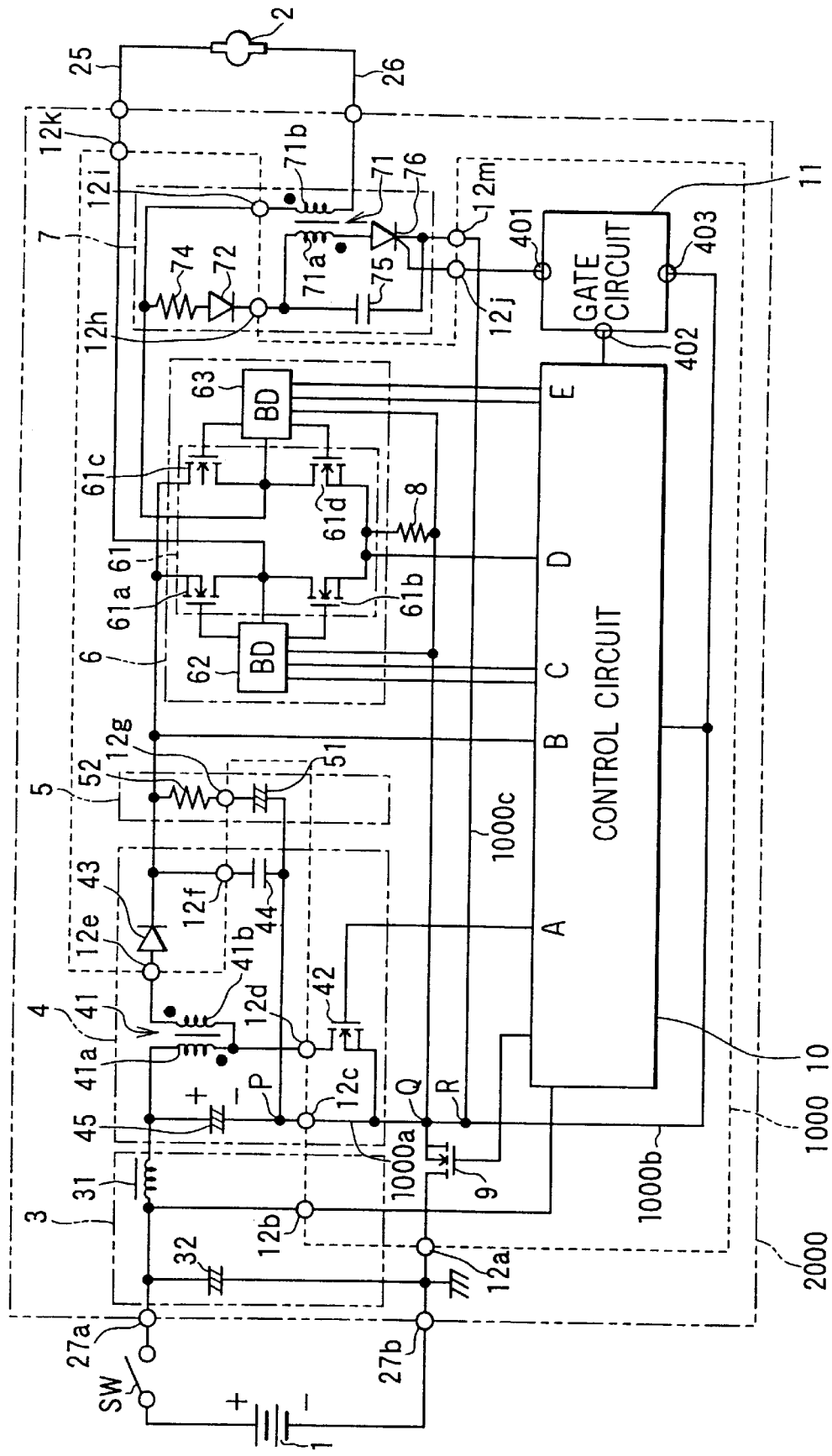
FIG. 9 is an electrical wiring diagram illustrating a circuit structure of the discharge lamp apparatus according to a second embodiment of the present invention.

In a second embodiment, a gate circuit 11 is provided separately from the control circuit 10 as shown in FIG. 9. More specifically, the gate of the thyristor 76 is connected to a terminal 401 of the gate circuit 11. The gate circuit 11 is connected to the control circuit 10 at a terminal 402. The gate signal of the thyristor 76 is generated based on the signal supplied from the control circuit 10 transmitted from by way of the terminal 402. The gate circuit 11 is grounded at a terminal 403.

Figure 10:
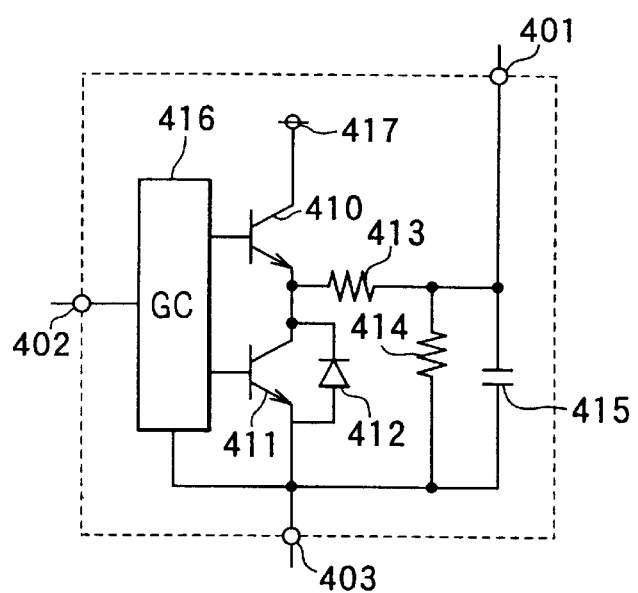
FIG. 10 is an electrical wiring diagram of a gate circuit used in the discharge lamp apparatus shown in FIG. 9.

FIG. 10 shows the detail of the structured of the gate circuit 11. The gate control IC 416 supplies gate signals having different level each other to transistors 410 and 411. At that time, for example, if the transistor 410 is turned on, the transistor 411 is turned off. When the thyristor 76 is to be turned on, the gate control IC 416 operates so that the transistor 410 is on and the transistor 411 is off. Therefore, the potential level of the terminal 401 is that divided by a resistor 413 and a resistor 404 as the current supply source of the terminal 417 connected to a constant power source (not shown). Thereby, the high level signal (gate current) is supplied to the gate of the thyristor 76, and the thyristor 76 is turned on. A capacitor 415 eliminates high frequency noise generated from the parasitic capacitance of the transistor 411 to thereby prevent the thyristor 76 from being turned on because of the high frequency noise.

In this modification, the terminal 12*m* is electrically connected to a conductive wiring pattern 1000*b* to ground-connect the gate circuit 11 at a point R by way of the wiring pattern disposed in the HIC 1000.

In detail, the wiring pattern 1000*b* led from the ground terminal 403 of the gate circuit 11 is connected to the ground by way of the MOS transistor 9, the wiring pattern that extends to the terminal 12*m* is connected at the point C located between the ground terminal 403 and the MOS transistor 9.

Because the cathode terminal of the thyristor 76 is connected to the wiring pattern 1000*b* led from the ground terminal 403 of the gate circuit 11 where a current little flows, the potential of the cathode terminal of the thyristor 76 is equalized to the potential of the ground terminal 403 of the gate circuit 11.

Figure 11:
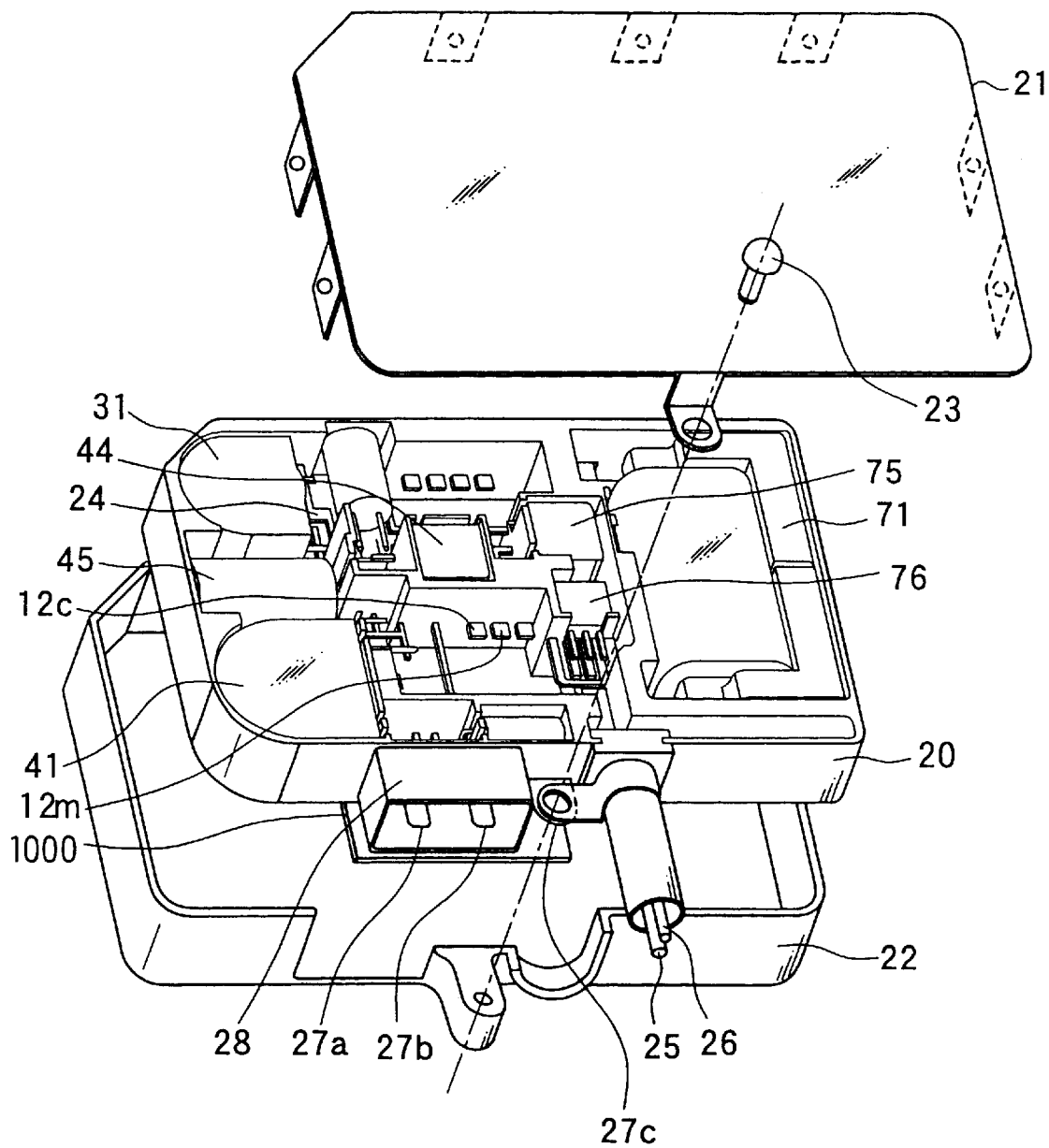
FIG. 11 is a perspective top view illustrating an assembly of the discharge lamp apparatus shown in FIG. 9.
Figure 12:
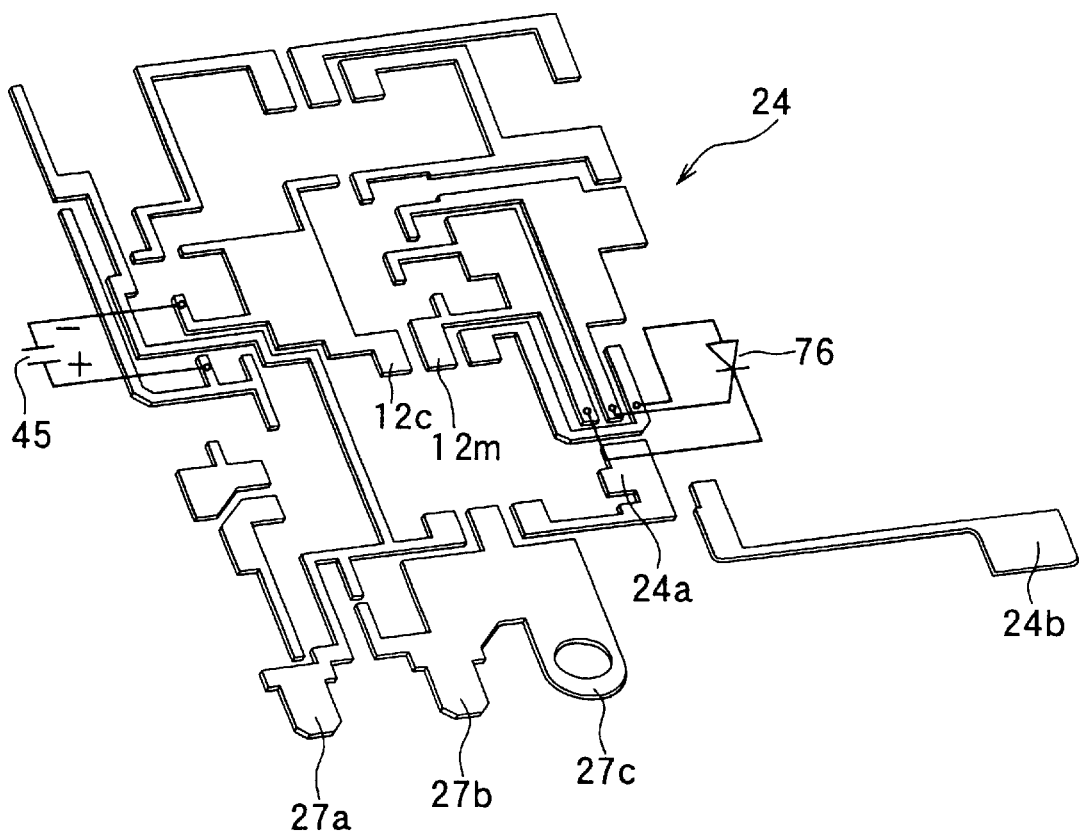
FIG. 12 is a perspective top view of a conductive wiring pattern used in the discharge lamp apparatus shown in FIG. 9.

In the case of the pattern of the terminal 24 shown in FIG. 11, the terminal 12*m* to which the cathode terminal of the thyristor 76 is connected is separated from the terminal 12*c* to which the negative electrode side of the capacitor 45. The terminal 12*c* is electrically connected to the terminal 12*m* by way of the wiring patterns 1000*a* to 1000*c* in the HIC 1000 (not shown in FIG. 12) disposed under the terminal 24 (FIG. 9 and FIG. 12).

In the above structure, because the potential of the terminal 403 of the gate circuit is the same as that of the cathode terminal of the thyristor 76, the malfunction, that is, the thyristor 76 is brought into conduction accidentally though the gate circuit 11 of the thyristor 76 does not generate the gate signal when the lamp 2 is lighted, is prevented. Accordingly, the lamp 2 is lighted surely.

When the switch SW is turned on, the DC—DC converter 4 starts the operation, the MOS transistor 9 is switched, the capacitor 45 is brought into charging/discharging in response to the switching, the charging/discharging current causes a potential difference between a point P and a point Q, but because the cathode terminal of the thyristor 76 is connected to the point R and the terminal 403 that is provided as the reference potential of the gate circuit 11 is also connected to the point R, the potential difference between the points P and Q does not affect at all.

There are other portions to be grounded in the HIC 1000, for example, between the terminal 12*c* and the point Q, it is possible to connect the wiring pattern 1000*c* to be connected to the cathode terminal of the thyristor 76. However, because the portion between the terminal 12*c* and the point Q is provided as the path for heavy current that flows by way of the primary winding 41*a* of the transformer 41, the MOS transistor 42, and the capacitor 45 and the portion is susceptive to the high frequency noise included in the heavy current, it is preferable to employ the structure described above.

Figure 13A:
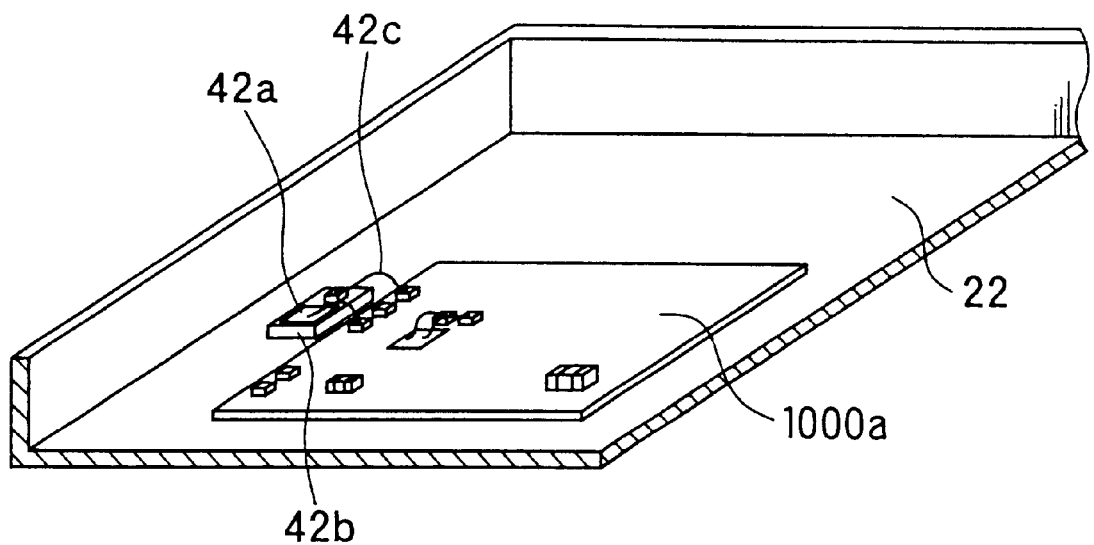
FIGS. 13A and 13B are modifications of the second embodiment shown in FIG. 9.
Figure 13B:
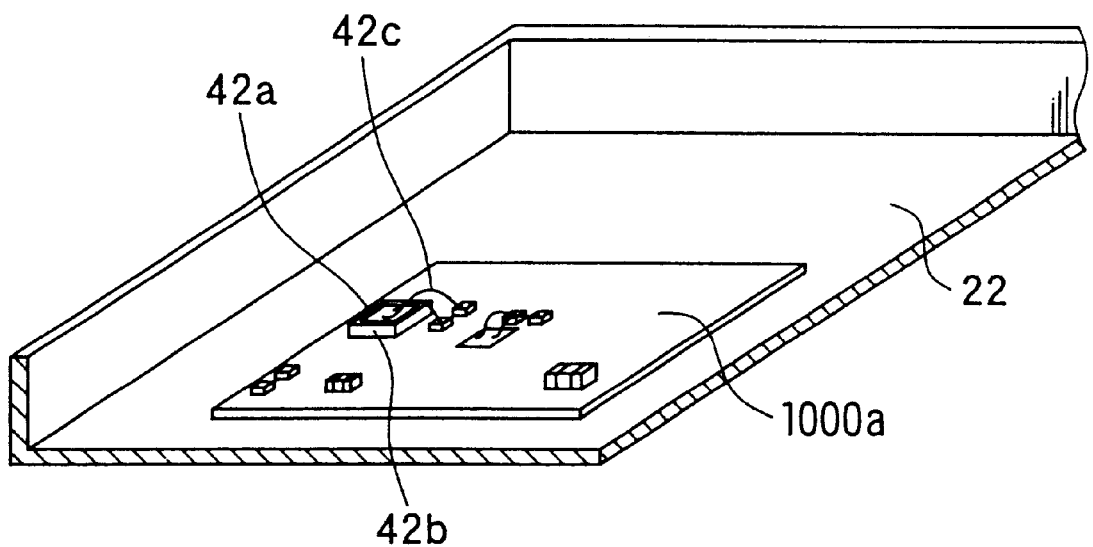

In the above HIC 1000, although all the components are mounted on a single substrate, this structure may be modified as shown in FIGS. 13A and 13B.

In FIG. 13A, the MOS transistor 43 serving as a switching element is power-blocked and located not on the circuit board. Herein, 42*a* denotes a silicon chip, 42*b* denotes an aluminum nitride (AlN) substrate, and 42*c* denotes an aluminum wire. 1000*a* denotes an alumina ($Al_2O_3$) substrate of the hybrid IC and 22 denotes a metal ground.

The silicon chip 42*a* is soldered to the aluminum nitride substrate, and the aluminum nitride substrate 42*b* is adhered to the metal case 22 with adhesive. The alumina substrate 1000*a* is adhered to the metal case 22 with adhesive. The source electrode and the gate electrode on the surface of the silicon chip 42*a* on which the MOS transistor 42 is formed are connected by means of ultrasonic bonding with aluminum wire, and the other is connected to the bonding pad of the alumina substrate 1000*a* by means of ultrasonic bonding. The drain electrode is connected between the bonding pad disposed aside the chip and the bonding pad on the alumina substrate 100*a* by means of ultrasonic bonding with aluminum wire.

In FIG. 13B, the MOS transistor 42 is power-blocked and mounted on the circuit board. 42b denotes a heat sink for absorbing transient heat, which is formed of metal material such as copper or molybdenum. Other characters are the same as those shown in FIG. 13A.

Third Embodiment

Figure 14:
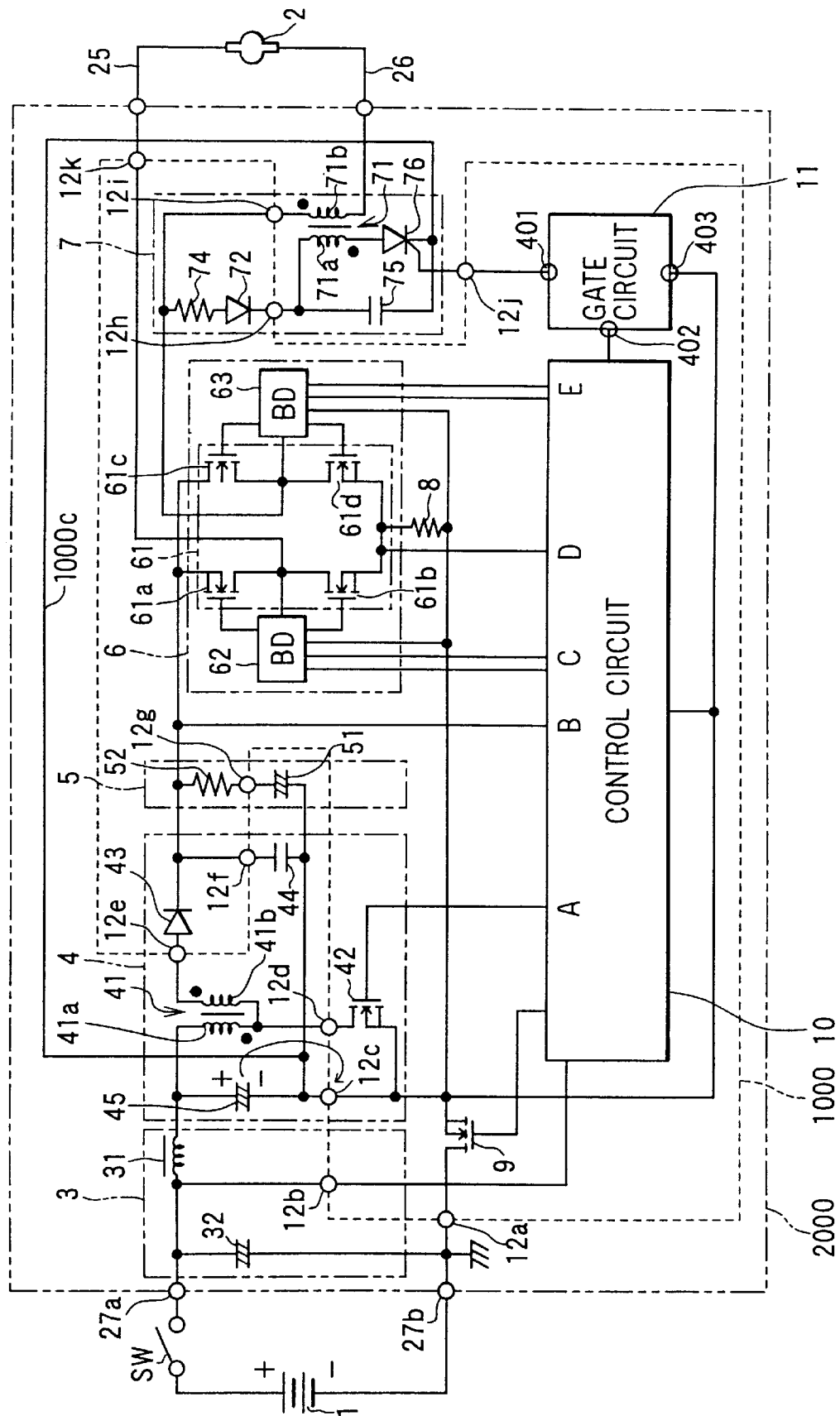
FIG. 14 is an electrical wiring diagram illustrating a circuit structure of a discharge lamp apparatus according to a third embodiment of the present invention.
Figure 15:
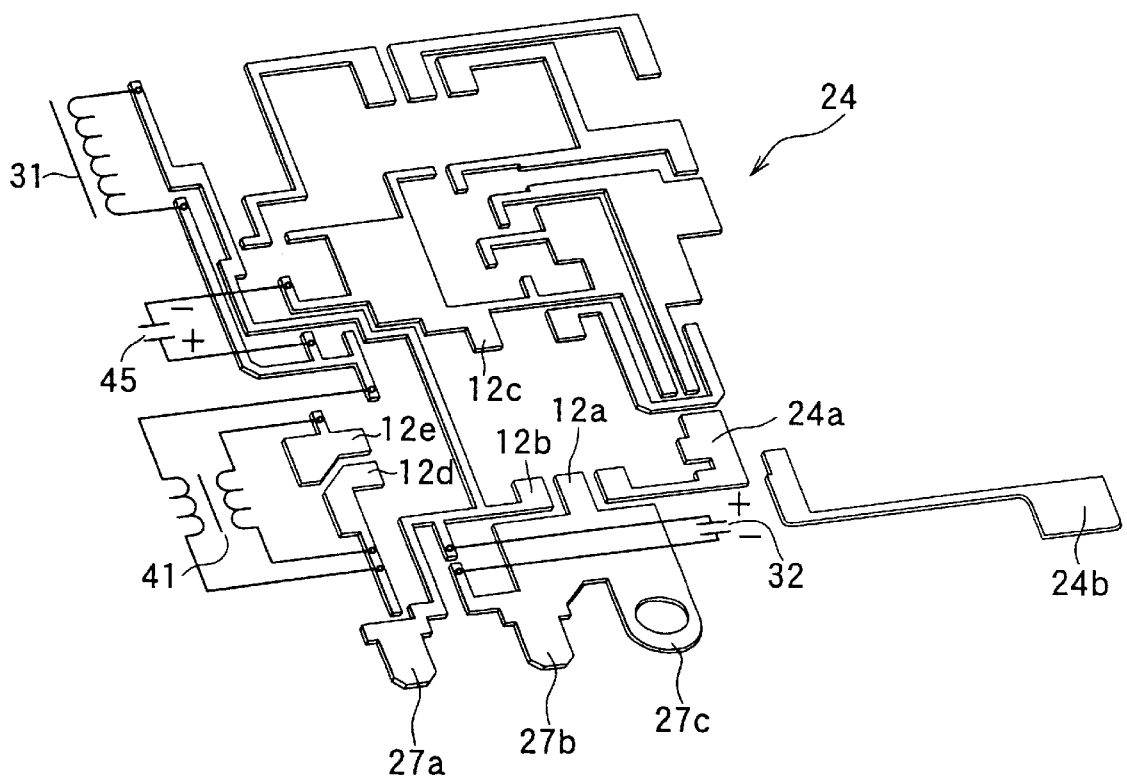
FIG. 15 is a perspective top view of a conductive wiring pattern used in the discharge lamp apparatus shown in FIG. 14.

In a third embodiment, as shown in FIGS. 14 and 15, the cathode of the thyistor 76 is connected to the capacitor 45 not through the terminal 12c but through a conductive wire 1000c which extends outside the HIC 1000. The third embodiment may also be modified as shown in FIGS. 13A and 13B.

It is to be noted in the first embodiment to the third embodiment, as shown in FIGS. 1, 9 and 14, the positive side terminal of the capacitor 32 that constitutes the filter circuit 3 is connected to the terminal 27a that is to be connected to the positive electrode (+terminal) of the battery 1, and the negative side terminal is connected to the terminal 27b that is to be connected to the negative electrode (−terminal) of the battery 1. The capacitor 32 is connected to the terminals 27a and 27b only by way of the terminal 24 not by way of the HIC 100, that is not by way of the inverse connection protecting MOS transistor 9.

That is, the capacitor 32 is located immediately near the terminals 27a, 27b, and 27c. By locating the capacitor 32 near the terminals 27a, 27b, and 27c, the length of the terminal 24 for connecting the capacitor 32 to the terminals 27a, 27b, and 27c can be minimized.

The negative side terminal of the capacitor 32 is electrically connected directly to the ground-connected terminals 27b and 27c out of the terminal 24. As a result, the distance from the negative side terminal of the capacitor 32 to the terminal 27b is very short.

Thus, when the magnetic field generated from the current path of the DC—DC converter 4 and the transformer 41 due to current change intermittent in response to switching operation of the MOS transistor 42 crosses with the terminal 24 that constitute the wiring near the DC—DC converter 4, the capacitor 32 can filter the noise due to interlinking of the magnetic field on the battery 1 side with respect to the interlinking position.

Furthermore, the length of wirings of the terminal 24 for electrically connecting between the positive electrode side terminal of the capacitor 32 and the terminal 27ab, between the negative electrode side terminal of the capacitor 32 and the terminal 27b, and between the terminal 27b and the metal base 22 is minimized. As a result, the magnetic flux that crosses with the magnetic field generated from the current path of the DC—DC converter 4 and the transformer 41 due to current change intermittent in response to switching operation of the MOS transistor 42 of the DC—DC converter 4 is reduced.

Therefore, because the capacitor 32 exhibits sufficient filter effect, the noise caused from the magnetic field generated from the current path of the DC—DC converter 4 in response to switching operation of the MOS transistor 43 when the lamp is lighted and from the transformer 41 can be removed sufficiently by the filter circuit 2. Based on the experiment, it was found that the conduction noise level of the power source wire for connecting between the battery 1 and the terminals 27a and 27b was reduced by approximately 30 dB.

In the case of the structure described above, if the battery 1 is connected inversely, the inverse (positive and negative polarity) voltage is applied to the capacitor 2. However, because the time while the battery 1 is being connected inversely is short, the capacitor 32 having durability enough for enduring the short time inverse connection may be used.

Fourth Embodiment

Figure 16:
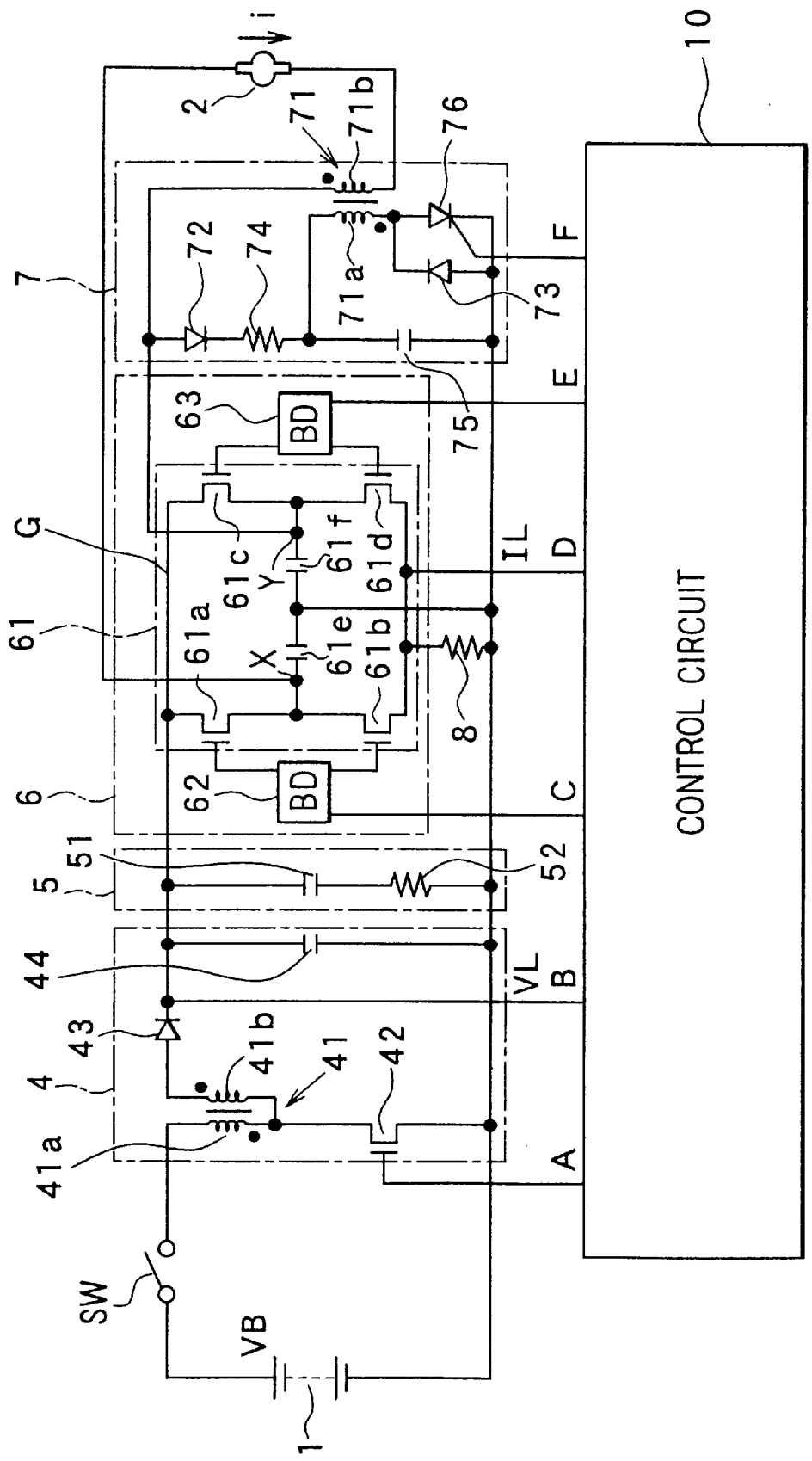
FIG. 16 is an electrical wiring diagram illustrating a circuit structure of a discharge lamp apparatus according to a fourth embodiment of the present invention.

In a fourth embodiment, the discharge lamp apparatus has a simplified construction as shown in FIG. 16 in comparison with the first to the third embodiments.

In this embodiment, the inverter circuit 6 has capacitors 61e and 61f for protecting the H-bridge circuit 61 from the surge voltage caused when dielectric breakdown occurs in the lamp 2 by means of the high voltage pulse applied when lighting is started.

The starter circuit 7 is disposed between the middle potential point Y of the H-bridge circuit 61 and the negative electrode terminal of the battery 1. The starter circuit 7 has a diode 73 connected in parallel with the thyristor 71.

To function as the vehicle high voltage discharge lamp apparatus, it is required that the generation of the high voltage pulse generated when lighting of the lamp 2 is started, the lighting failure performance of the lamp 2, and the ripple current of the lamp current are maintained in good condition these points will be described herein under.
[Generation of high voltage pulse when lighting the lamp 2 is started]

The capacitor 75 discharges by way of the primary winding 71a of the high voltage generation transformer 71 when the thyristor 76 is turned on, in the state that the capacitor 75 is charged, at that time the secondary winding 71b generates a high voltage pulse. The high voltage generated at that time is determined by:

(a) charging voltage of the capacitor 75
(b) capacitance of the capacitor 75
(c) turn ratio of the number of winding 71a to 71b of the high voltage generation transformer 71, and
(d) the magnetic circuit (inductance of the winding 71a and 71b) of the high voltage generation transformer 71.

The charging voltage of the capacitor 75 means a voltage that is applied to the lamp 2 before the lamp 2 is lighted. This voltage magnitude is necessary to shift to arc discharge up on dielectric breakdown between electrodes of the lamp 2, and a voltage of 350 V or higher is required for an vehicle 35W bulb. The higher withstand voltage of the involved elements such as the smoothing capacitor 44 and the elements that constitute the H-bridge circuit 61, and the high charging voltage is disadvantageous in cost. Therefore, the charging voltage of the capacitor 75 is preferably 350 V to 400, more preferably 400 V.

When the dielectric breakdown occurs between the electrodes of the lamp 2, the discharge current flows from the smoothing capacitor 44 to the lamp 2 by way of the H-bridge circuit 61, and the dielectric breakdown shifts to arc discharge and the lamp 2 is lighted. In this operation, to flow the discharge current from the smoothing capacitor 44 to the lamp 2, it is required that discharge energy higher than a predetermined value is given from the high voltage generation transformer 71 to the lamp 2 when the dielectric breakdown occurs between the electrodes. The required energy is determined by the capacitance $C_{75}$ of the capacitor 75, the charging voltage V of the capacitor 75, and the conversion efficiency η of the high voltage generation transformer 71 as defined in the following equation 1, and in the case of the charging voltage of 400 V, the capacitance of the capacitor 75 of approximately 0.47 μF is required.

$$E1 = (\tfrac{1}{2}) C_{75} V^2 \times \eta \qquad \text{[Equation 1]}$$

Next, the turn ratio of winding 71a to 71b of the high voltage generation transformer 71 and the magnetic circuit (inductance of the windings 71a and 71b) of the high voltage generation transformer 71 will be described.

The voltage required for dielectric breakdown of the lamp 2 is 17 kV or higher as the peak value in the case of dV/dt (voltage change per unit time) of the high voltage pulse of 50V/nS based on the result of an experiment on the lamp 2 (35W bulb). The turn ratio of winding 71a to 71b and the magnetic circuit (inductance of the windings 71a and 71b) required to generate a voltage of 17 kV or higher between both ends of the secondary windings 71b of the high voltage generation transformer 71 were determined experimentally for the charging voltage of 400 V of the capacitor 75. The experiment was carried out on two magnetic circuits, that is, open magnetic circuit and closed magnetic circuit. The optimal turn ratio was approximately 80 for both circuits.

In this case, the peak value of the high voltage pulse is affected by mounting position of the high voltage generation transformer 71 in the discharge lamp apparatus. In detail, the leakage magnetic flux of the high voltage generation transformer 71 that is contained in the metal case crosses with the metal case, and the peak value of the high voltage pulse is thereby decreased. Therefore, the closed magnetic circuit structure is preferably used to reduce the leakage magnetic flux and prevent the performance reduction.

Figure 17:
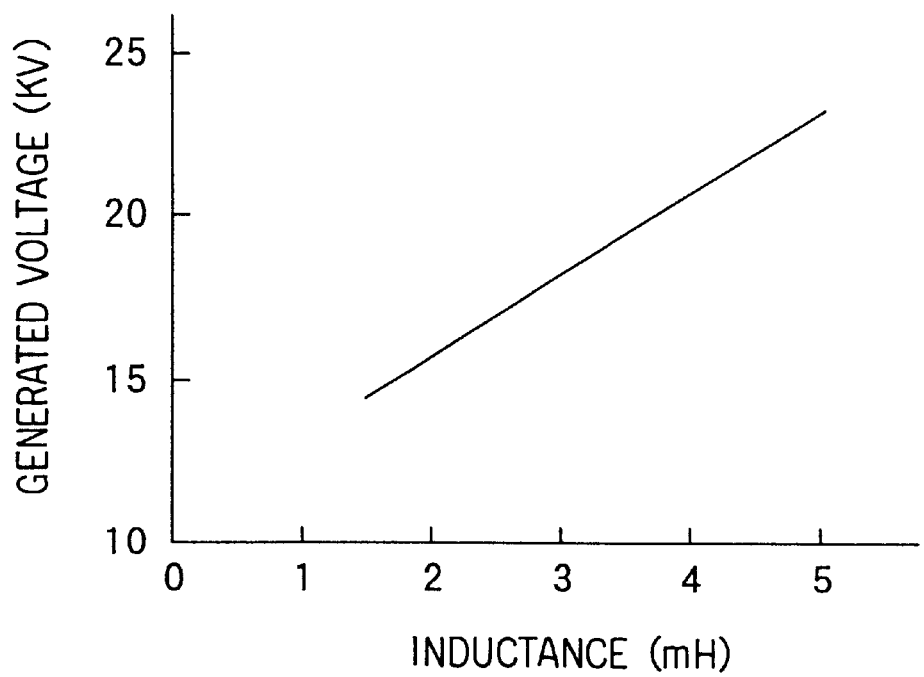
FIG. 17 is a graph illustrating a relation between the inductance and the generated voltage of a secondary winding of a transformer used in the discharge lamp apparatus.

An experimental result is shown in FIG. 17. The experiment was carried to check the relation between the inductance and the generated voltage of the high voltage pulse of the secondary windings 71b, and carried out with respect to the case in which the high voltage generation transformer 71 has the closed magnetic circuit structure, the turn ratio of windings 71a to 71b is fixed to 80, and the inductance L2 of the secondary winding 71b is varied.

From this result, it is found that the inductance L2 of the secondary winding 71b should be 2.5 mH or higher to generate a voltage higher than 17 kV between both ends of the secondary winding 71b of the high voltage generation transformer 71. The inductance L2 of the secondary winding 71b of 2.5 mH or higher allows the windings 71a and 71b to couple effectively. The coupling coefficient of approximately 1 can be obtained, and a high voltage of 17 kV or higher can be generated with the charging voltage of 350 V to 400 V of the capacitor 75.

In this experiment, the inductance L2 of the secondary winding 71b is a value obtained at DC superimposition of 1.5 A. The reason is that the inductance L2 at the DC superimposition of 1.5 A is required to prevent lighting failure of the lamp 2 as described hereinafter.

[Lighting failure preventing performance of the lamp 2 at the DC superimposition of 1.5 A]

The capacitance of the smoothing capacitor 44 and the inductance of the secondary winding 71b of the high voltage generation transformer 71 cooperatively generate a transient voltage when the polarity of the voltage applied to the lamp 2 is switched, and the transient voltage is applied to the lamp 2 to thereby prevent the lighting failure of the lamp 2.

The operation of the transient voltage generation will be described first.

Figure 18:
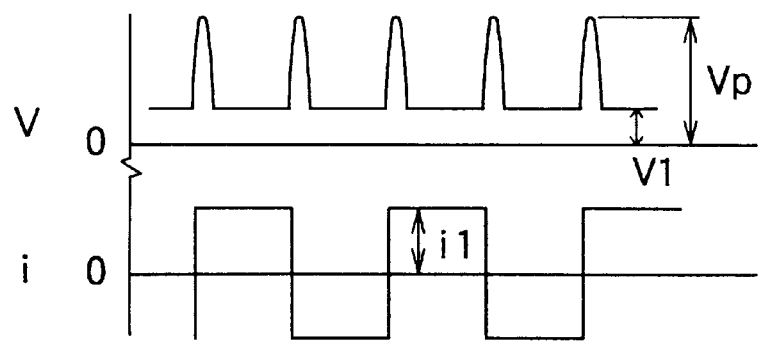
FIG. 18 is a waveform diagram illustrating a lamp current and a voltage in the discharge lamp apparatus.

The lamp current i (FIG. 16) that flows through the lamp 2 when the lamp 2 is lighted and the voltage waveform of the terminal G (FIG. 16) that is the voltage V applied to the H-bridge circuit 61 are shown in FIG. 18. The transient voltage Vp is generated every time when the direction of the lamp current i is switched (polarity switching).

Figure 19:
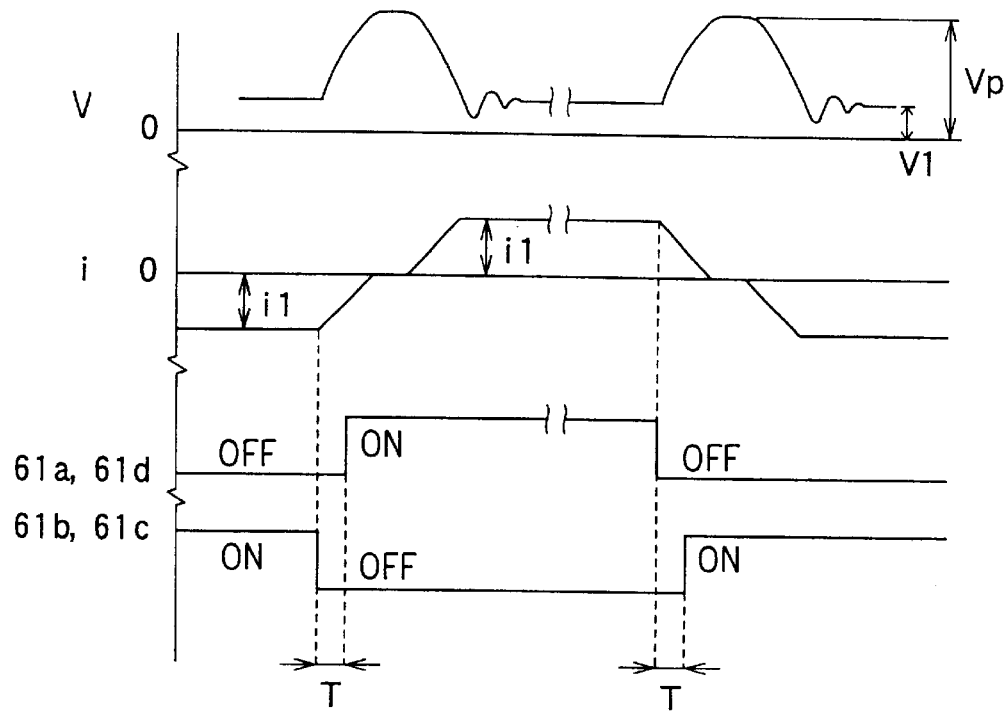
FIG. 19 is a waveform diagram illustrating the lamp current and the voltage in relation to on/off state of MOS transistors used in the discharge lamp apparatus.

The enlarged waveform of the voltage of the terminal G and the lamp current i that occur when the polarity is switched and on/off state of the MOS transistors 61a to 61d are shown in FIG. 19. The lamp current i flows, when the MOS transistors 61a and 61d are off and the MOS transistors 61b and 61c are on, and the lamp 2 is lighted. When this state is switched to polarity switching operation, first the MOS transistors 61b and 61c are turned off. After an elapse of time T, the MOS transistors 61a and 61d are turned on. Time T is a dead time of several milliseconds in which all the MOS transistors are off. The dead time T is set to surely avoid simultaneous conduction of the MOS transistors 61a and 61b or the MOS transistors 61c and 61d.

Herein, the lamp current i1 is the current that flows through the secondary winding 71b at the time immediately before the MOS transistors 61b and 61c are turned off, and the secondary winging 71b stores the energy $E_2$ represented by the equation 2 based on the lamp current i1.

$$E_2 = (½) \, L2 \times i1^2 \qquad \text{[Equation 2]}$$

Figure 20:
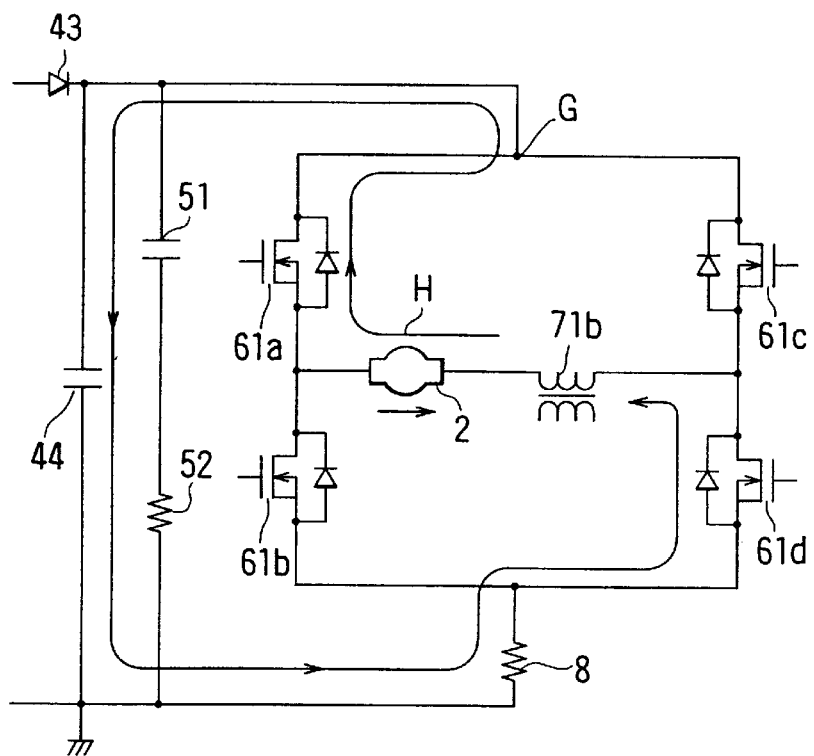
FIG. 20 is an electric wiring diagram illustrating a path of the lamp current when the MOS transistors are turned off in the discharge lamp apparatus.
Figure 21:
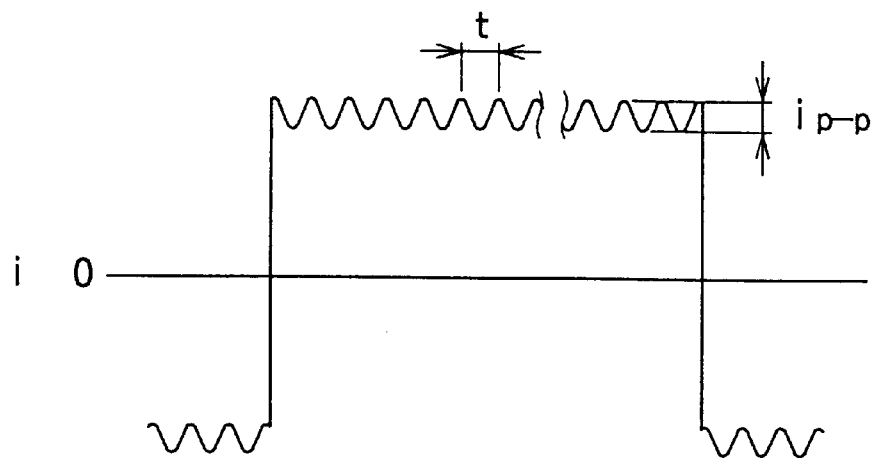
FIG. 21 is a waveform diagram illustrating the lamp current when the lamp is lighted stably in the discharge lamp apparatus.

When the MOS transistors 61b and 61c are turned off, the energy stored in the secondary winding 71b is released and a current flows along the path H shown in FIG. 20. In detail, the energy is released through the lamp 2, the parasitic diode of the MOS transistor 61a, the capacitor 51, the resistor 8, and the parasitic diode of the MOS transistor 61d. At that time, the smoothing capacitor 44 is charged. Next, the MOS transistors 61a and 61d are turned on. In this state, the energy is released through the same path, and the release of energy continues until the energy stored in the secondary winding 71b is released entirely.

When the energy is released entirely, that is, when the lamp current i becomes 0, the charging voltage of the smoothing capacitor 44 reaches the maximum value Vp. At that moment, the voltage Vp is applied between the electrodes of the lamp 2. If the voltage Vp is higher than the reactivation voltage of the lamp 2, then the lamp 2 is reactivated, a current flows inversely and reaches a stable current value. On the other hand, if the voltage Vp is lower than the reactivation voltage of the lamp 2, then the lamp 2 cannot be reactivated and the lamp 2 is lighted off, that is, the lamp 2 is involved in lighting failure. The lighting failure is apt to occur when the electrodes of the lamp 2 are cold. In the case that the electrode temperature is low when lighting is to be started, the reactivation voltage of the lamp 2 is high.

In the case of the lamp 2 of 35W, the power of the lamp 2 is controlled so that the lamp current i1 is a value in a range from 1.5 A to 2.5 A and the lamp voltage V1 is a value in a range from 30 to 50 V when lighting is to be started. If the voltage Vp is surely higher than the reactivation voltage in this state, then the lighting failure of the lamp 2 is prevented. The voltage Vp required to prevent the light failure of the lamp 2 was determined experimentally, and it is found that the voltage Vp of 120 V or higher is sufficient for preventing the lighting failure of the lamp 2.

The voltage Vp is represented by the equation 3 in terms of the inductance L2 of the secondary winding 71b of the high voltage generation transformer 71, the capacitance C1 of the smoothing capacitor 44, the lamp current i1, and the lamp voltage V1.

[Equation 3]

$$Vp = \sqrt{\frac{L2}{C1} i1^2 + V1^2}$$

Based on the equation, 3, C1 is calculated and C1=0.42 $\mu$F is obtained for Vp=120 V, L2=2.5 mH, i1=1.5 A, and V1=30 V. Otherwise C1 is calculated and C1=0.47 $\mu$F≈0.5 $\mu$F is obtained for Vp=120 V, L2=2.5 mH, i1=1.5 A, and V1=50 V.

Accordingly, to obtain the voltage Vp of 120 V or higher, the capacitance C1 of the smoothing capacitor of 0.5 F or smaller is necessary.

[Ripple current of the lamp current]

The inductance L2 of the secondary winding 71*b* of the high voltage generation transformer 71 and the capacitance C1 of the smoothing capacitor 44 relate to the ripple current value of the lamp current.

Figure 22:
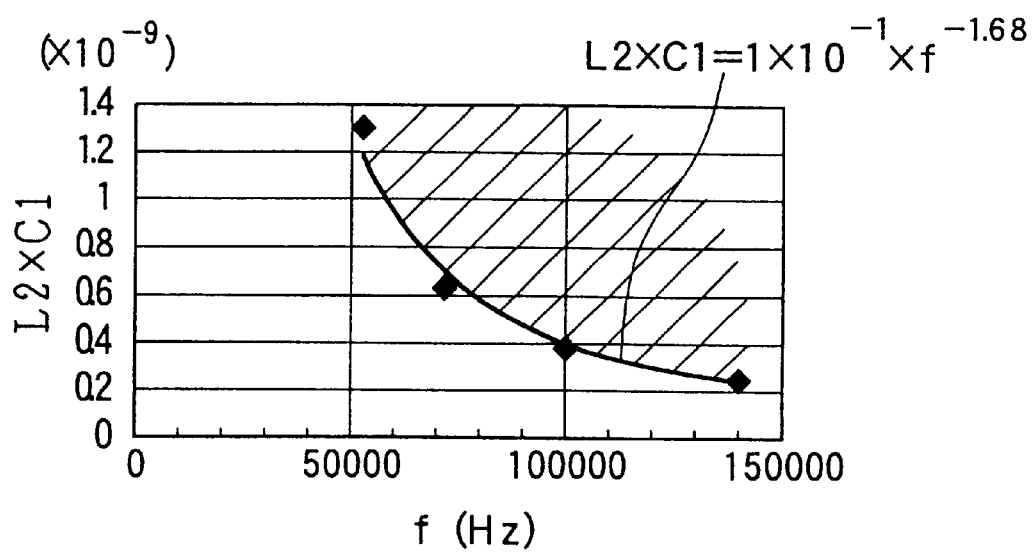
FIG. 22 is a graph illustrating the relation between L2×C1 and f that is necessary to suppress the ripple current $i_{p\text{-}p}$ to a value of 10 mA or smaller when the lamp is lighted stably in the discharge lamp apparatus.

The ripple current of the lamp current is determined by the inductance L2, the impedance of the lighting lamp 2, and the switching frequency f Hz of the MOS transistor 42 of the DC—DC converter 4. The current waveform i of the lamp 2 is shown in FIG. 22. $i_{p-p}$ indicates the ripple current value and t indicates the switching frequency (1/f) of the MOS transistor 42.

In the case of the lamp 2 of 35W, the allowable ripple current under stable lighting of 10 mA or lower is recommended. Therefore, it is necessary to reduce the ripple current $i_{p-p}$ of the lamp 2 to a value of 10 mA or smaller. The relation between C1×L2 and f for satisfying the relation $i_{p-p}$ was determined experimentally. The obtained result is shown in FIG. 22. Based on the experimental result, it is found that, for satisfying the relation $i_{p-p}$=10 mA or smaller, the relation $L2 \times C1 \geq 1 \times 10^{-1} \times f^{-1.68}$ should be satisfied. That is, the relation indicated as the hatched area in FIG. 22 should be satisfied. Herein, because the lamp current during stable lighting of the lamp 2 is about 0.4 A, the inductance L2 of the secondary winding 71*b* of the high voltage generation transformer 71 is a value obtained when DC superimposition is 0.4 A.

Functions of the embodiment described above is summarized as follows.

The high voltage generation transformer 71 has the following functions (1) to (3);
(1) generating the high voltage pulse for causing dielectric breakdown between the electrodes of the lamp 2,
(2) preventing the lighting failure by applying the transient voltage Vp to the lamp 2 when the polarity is switched after the lamp 2 is lighted, and
(3) reducing the ripple current of the lamp current generated correspondingly to the switching frequency f of the MOS transistor 42 in the DC—DC converter 4 during lighting of the lamp 2.

The smoothing capacitor 44 of the DC—DC converter 4 has the following functions;
(4) preventing the lighting failure of the lamp 2 by applying the transient voltage to the lamp 2 when the polarity is switched after the lamp 2 is lighted, and
(5) reducing the ripple current of the lamp current generated correspondingly to the switching frequency f of the MOS transistor 42 during lighting of the lamp 2.

The inductance L2 (the value when DC superimposition is 1.5 A) of the secondary winding 71*b* of the high voltage generation transformer 71 should be 2.5 mH or larger to obtain a desired value of the generation voltage of the high voltage pulse. In this case, the coupling of the windings 71*a* and 71*b* of the high voltage generation transformer 71 is easy, and a high voltage of 17 kV or higher can be generated with the charging voltage of 350 V to 400 V of the capacitor 75.

The high voltage generation transformer 71 and the smoothing capacitor 44 both relate to the lighting failure, and to prevent the lighting failure of the lamp 2 when the polarity is switched after the lamp 2 is lighted, the inductance L2 (the value when DC superimposition is 1.5 A) of the secondary winding 71*b* of the high voltage generation transformer 71 should be 2.5 mH or larger and the capacitance C1 of the smoothing capacitor 44 should be 0.5 mF or smaller.

The high voltage generation transformer 71, the smoothing capacitor 44, and the switching frequency f of the MOS transistor 42 all relate to the reduction of the ripple current of the lamp current. The relation $L2 \times C1 \geq 1 \times 10^{-1} \times f^{-1.68}$ should be satisfied to suppress the ripple current $i_{p-p}$ to a value of 10 mA or smaller.

The inductance L2 of the secondary winding 71*b* is assumed to be a value for DC superimposition of 1.5 A and a value for DC imposition of 0.4 A. Those inductance values are defined in correspondence with the respective current values, because the inductance changes correspondingly to the current that flows though the secondary winding 71*b*.

Fifth Embodiment

In a fifth embodiment, the discharge lamp apparatus is constructed in the same manner as in the fourth embodiment shown in FIG. 16. In this fifth embodiment, however, a lamp power control circuit 300 of the control circuit 10 is constructed to have a power reduction circuit 600. The disclosure of the control circuit in U.S. patent application Ser. No. 09/304,840 and now U.S. Pat. No. 6,232,728 is incorporated herein by reference.

The lamp power control circuit 300 is provided with an error amplifier circuit 301 for generating an output corresponding to the lamp voltage VL and lamp current IL that are signals for indicating the lighting condition of the lamp 2, and the output of the error amplifier circuit 301 is supplied to a pulse width modulation (PWM) control circuit 100. The PWM control circuit 100 increases the duty ratio for on/off controlling the MOS transistor 42 with the increase in the output voltage of the error amplifier circuit 301 thereby to increases the lamp power.

A reference voltage Vr1 is supplied to the non-inversion input terminal of the error amplifier circuit 301 and a voltage v300 that serves as the parameter for controlling the lamp power is supplied to the inversion input terminal, and the error amplifier circuit 301 generates the voltage corresponding to the difference between the reference voltage Vr1 and the voltage V300.

The voltage V300 is determined based on the lamp current IL, a constant current i10, a current i20 set by means of a first current setting circuit 302, a current i30 set by means of a second current setting circuit 303, and a current i40 set by means of the power reduction circuit 600 that operates as a fourth current setting circuit. The sum of the current i10, the current i20, the current i30, and the current i40 is set sufficiently lower than the lamp current IL.

Figure 23:
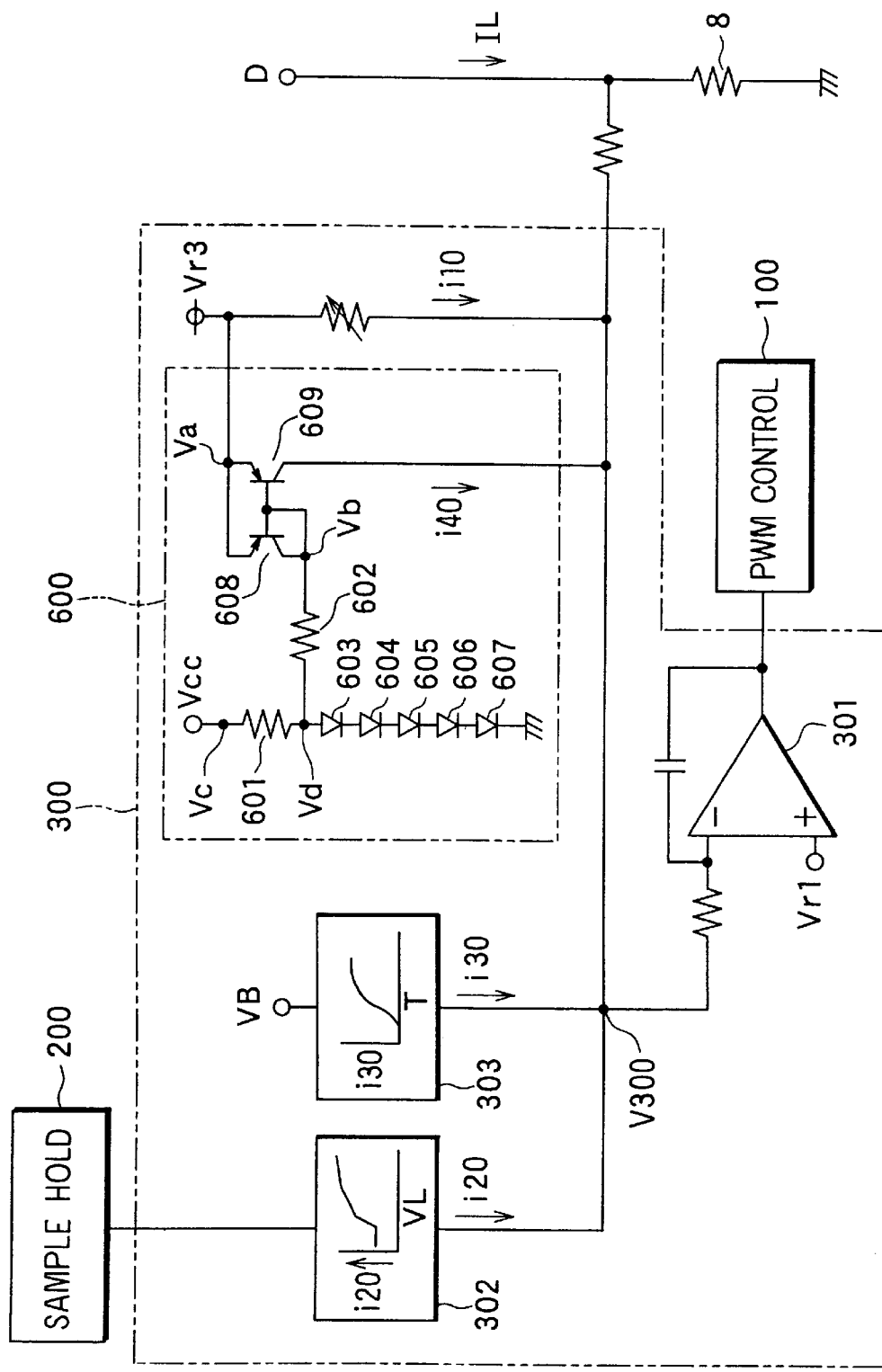
FIG. 23 is an electrical wiring diagram illustrating a circuit structure of a lamp power control circuit used in a discharge lamp apparatus according to a fifth embodiment of the present invention.

Herein, the first current setting circuit 302 sets the current i20 larger as the lamp voltage VL is higher as shown in FIG. 23, and the second current setting circuit 303 sets the current i30 larger as the time T is longer after the lighting switch SW is turned on as shown in FIG. 23.

The power reduction circuit 600 that is the fourth current setting circuit sets the current i40 to zero when the temperature of the apparatus is lower than a predetermined temperature and sets the current i40 larger as the temperature is higher when the temperature of the apparatus is higher than the predetermined temperature correspondingly to the temperature of the apparatus.

The lamp power control circuit 300 generates a voltage corresponding to the time T elapsing after the lighting switch SW is turned on, the lamp voltage VL, and the lamp current IL to control the lamp power, sets the lamp power to a large value (for example 75W) when the lamp 2 is lighted to increase the electrode temperature quickly. The lamp power control circuit 300 then decreases the lamp power gradually as the electrode temperature increases gradually to control the lamp power to a predetermined value (for example, 35W) when the lighting of the lamp 2 is stabilized. Because the power reduction circuit 600 changes the current i40 depending on the temperature of the apparatus, the lamp power control circuit 300 changes the magnitude of the lamp power as the current i40 changes.

As shown in FIG. 23, the power reduction circuit 600 is provided with resistors 601 and 602, a plurality of (e.g., five) diodes 603 to 607 connected in series, and current mirror-connected PNP transistors 608 and 609 having a terminal Vr3 as a current supply source connected to the reference voltage source (3V constant voltage).

The resistor 601 and a plurality of diodes 603 to 607 are connected in series, and connected to a Vcc terminal connected to a constant voltage source (not shown). The voltage of the constant voltage source connected to the Vcc terminal is higher than the voltage of the constant voltage source connected to the terminal Vr3, and is set to, for example, 6V.

Base terminals of the PNP transistors 608 and 609 are connected each other. The base terminal of the PNP transistor 608 is connected to the collector terminal. This connection point is connected to the connection point of the resistor 601 and the plurality of diodes 603 to 607 by way of a resistor 602.

Furthermore, the plurality of diodes 603 to 607 connected in series are temperature dependent elements, and the temperature dependency of potential barrier (voltage drop) in the forward direction voltage decreases at the rate of –2 mV per one degree temperature increase. Therefore, the potential barrier in the forward direction voltage of the five transistors 603 to 607 decreases –10 mV/° C. (–2 mV×5=–10 mV) with the increase in temperature. When the apparatus temperature is in an ordinary temperature (for example around 25° C.), because the potential barrier of each of the five diodes 603 to 607 is approximately 0.7 V, the potential barrier of the five diodes 603 to 607 is approximately 3.5 V (0.7 V×5=3.5 V). The potential of the constant voltage connected to the terminal Vr3 is set to be a value lower than the potential barrier of the plurality of diodes 603 to 607.

Operation of the fifth embodiment is described. In the following description, Va denotes the potential of the emitter terminal of the PNP transistors 608 and 609, Vb denotes the voltage of the base and collector terminals of the PNP transistor 608, Vc denotes the potential applied to the resistor 601, and vd denotes the potential of the junction point between the resistor 601 and the plurality of diodes 603 to 607.

First, it is assumed that the apparatus temperature is a normal temperature will be described. In this case, because the potential barrier of the five diodes 603 to 607 is approximately 3.5 V, the potential Vd is approximately 3.5 V. On the other hand, because the potential Va is set to 3 V, the PNP transistor 608 is biased in reverse. No current flows through the resistor 602. Therefore, no current flows either through the PNP transistor 609. That is, the current i40 is zero.

As the apparatus temperature increases gradually, the potential barrier of the five diodes 603 to 607 decreases at the rate of –10 mV/° C. as described above, and satisfies the relation of the equation 4 when the apparatus temperature reaches a predetermined temperature.

$$Va-Vbe=Vd \qquad \text{[Equation 4]}$$

Herein, Vbe denotes the potential barrier in the forward direction between the base and the emitter of the transistor 608.

Afterward, as the apparatus temperature increases further, the potential Vd decreases more, a voltage difference is caused between both ends of the resistor 602. Thereby, a current that is determined by the voltage difference between both ends of the resistor 602 and the resistance value of the resistor 602 flows through the transistor 608. The current is mirrored by the transistor 609, and the current i40 is supplied as the output.

Figure 24:
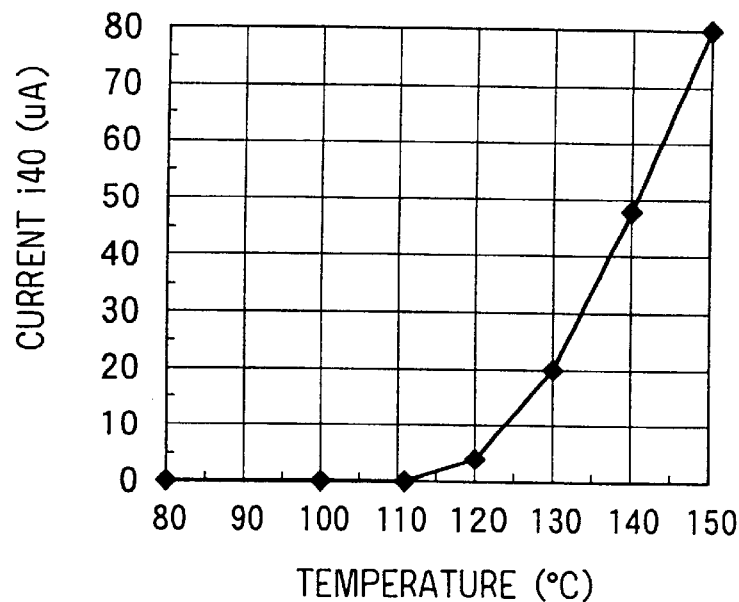
FIG. 24 is a graph illustrating the relation between a temperature and a current i4.

FIG. 24 shows the characteristic relation between the current i40 and the apparatus temperature. As shown in FIG. 24, the current i40 is zero in the region below the apparatus temperature of 110° C., but the current i40 begins to increase when the apparatus temperature exceeds 110° C.

Figure 25:
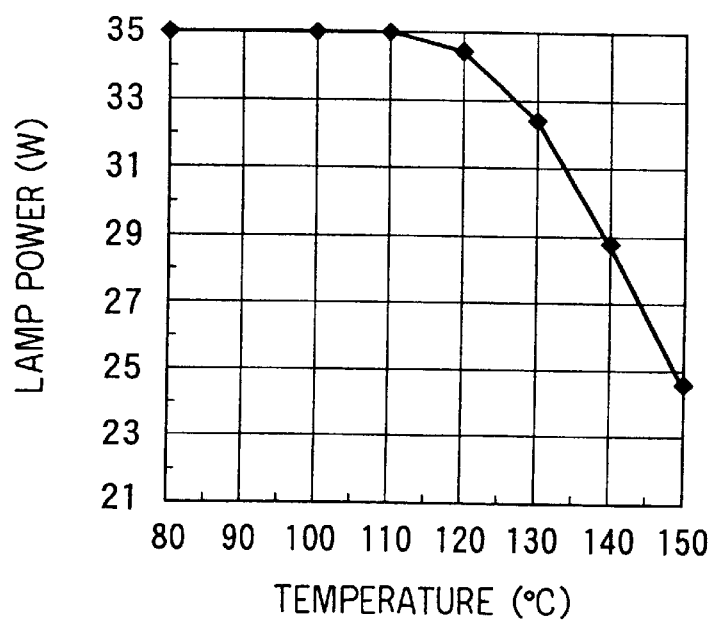
FIG. 25 is a graph illustrating the relation between a temperature and a lamp power.

Furthermore, FIG. 25 shows the lamp power characteristics that relates to the i40 characteristics shown in FIG. 24. As shown in FIG. 25, when the apparatus temperature exceeds 110° C., the lamp power begins to decrease from 35W, and the lamp power reaches approximately 25W when the apparatus temperature reaches 150° C.

By reducing the lamp power when the apparatus temperature exceeds a predetermined temperature, the excessive temperature rise of the discharge lamp apparatus and resultant breakdown of the apparatus itself are prevented even though the temperature of the discharge lamp apparatus increases due to the environment where the discharge lamp apparatus is mounted and the self-heating of the apparatus itself. Because the heat loss of the apparatus itself increases as the apparatus temperature is high, the self-heating of the discharge lamp apparatus due to the power loss increases in addition to increase in the environmental temperature of the discharge lamp.

However, because the lamp power is controlled so as to be reduced when the apparatus temperature exceeds the predetermined value, the power loss that causes the self-heating is reduced, and the apparatus temperature increase is suppressed. As a result, the apparatus temperature is stabilized at the predetermined temperature beyond which the discharge lamp apparatus will be broken.

Figure 26:
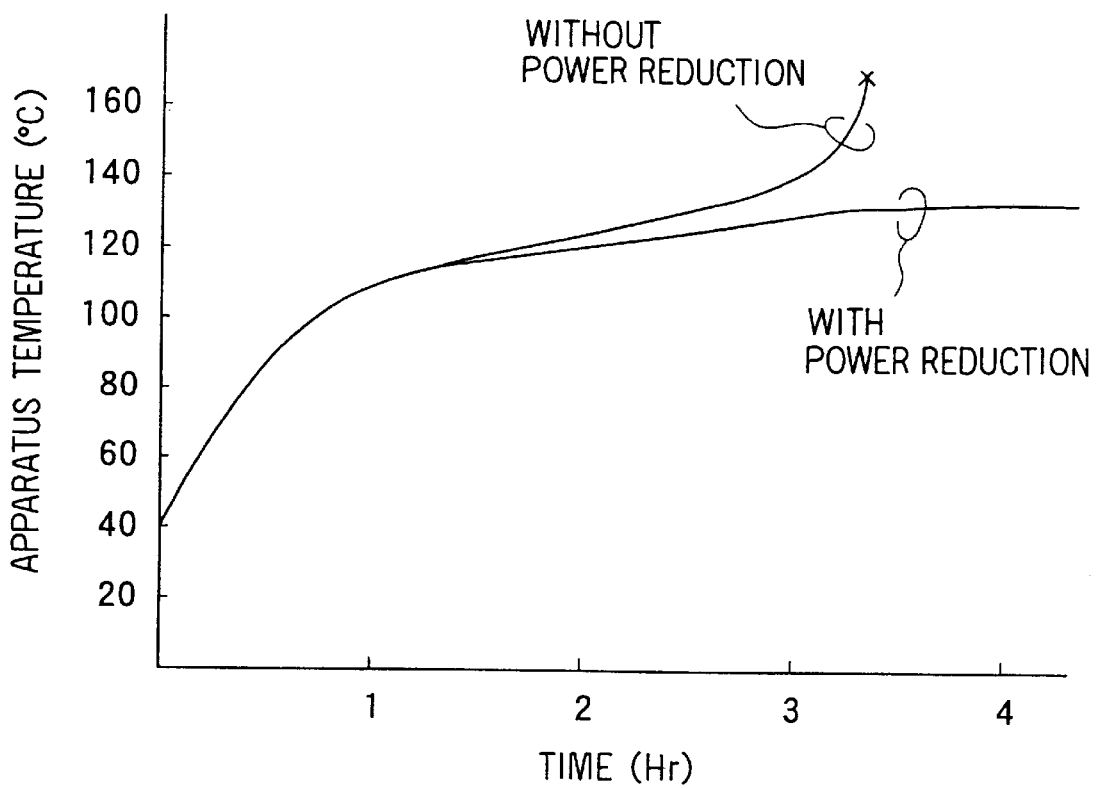
FIG. 26 is a graph illustrating an apparatus temperature change with time when a power reduction circuit is and is not provided.

For the reference, the experimental result obtained by measuring the apparatus temperature increase in the case that a discharge lamp apparatus having the power reduction circuit 600 is mounted on a vehicle and in the case that the discharge lamp apparatus having no power reduction circuit 600 is mounted is shown in FIG. 26. The experimental result was obtained by measuring the apparatus temperature of a vehicle in the state that a vehicle engine was operated under a burning sun in summer and the headlight is lighted for a long time.

As obvious from the experimental result, in the case of the discharge lamp apparatus having no power reduction circuit 600, the apparatus temperature increases sharply from 140° C. In this case, the discharge lamp apparatus was broken down when the apparatus temperature reached 170° C. On the other hand, in the case of the discharge lamp apparatus according to this embodiment having the power reduction circuit 600, the apparatus temperature saturated at approximately 130° C. The discharge lamp apparatus was not broken.

Based on this experimental result, it is obvious that the discharge lamp apparatus temperature is prevented from increasing by incorporating the power reduction circuit 600 and the breakdown of the discharge lamp apparatus is prevented.

Figure 27:
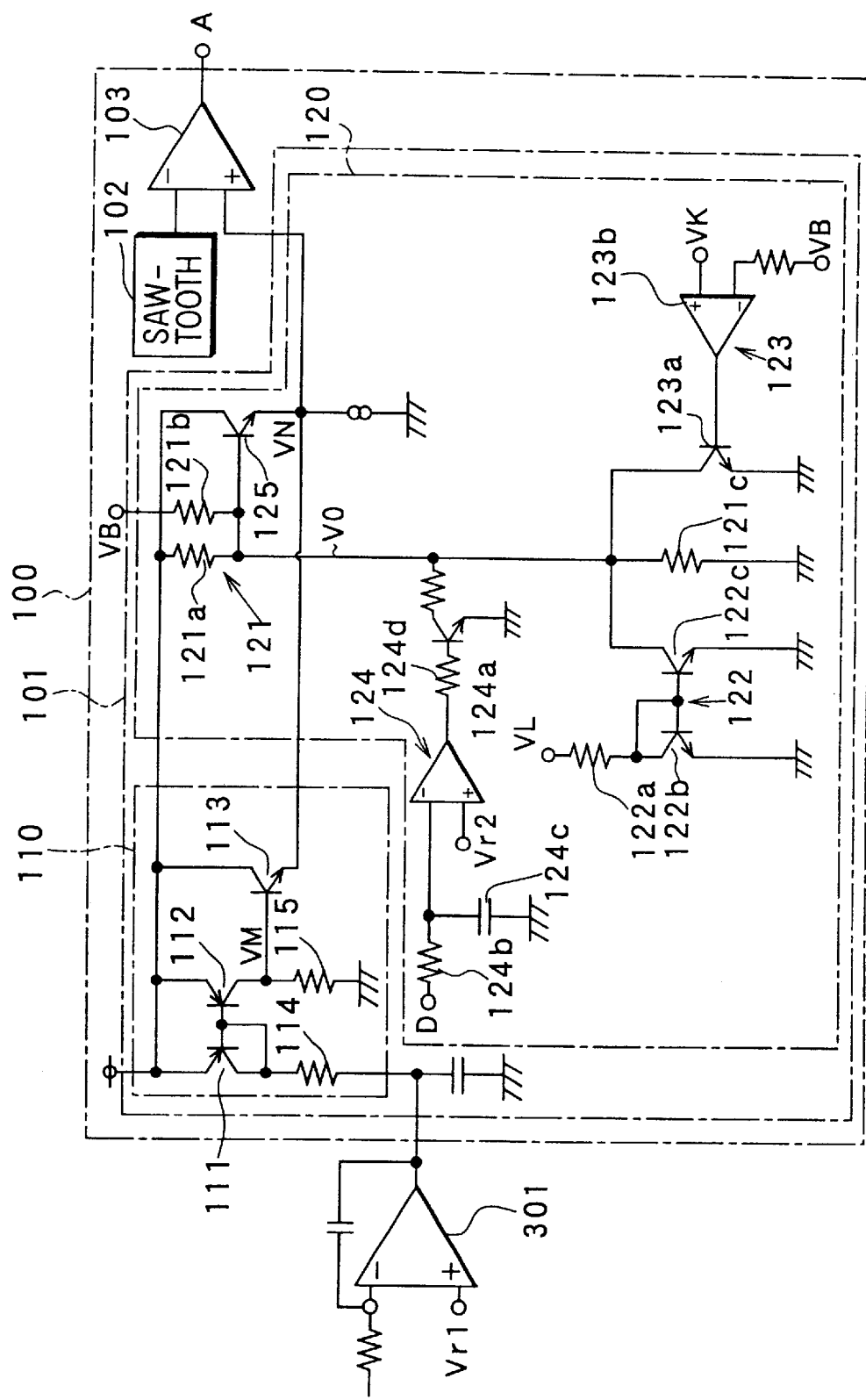
FIG. 27 is an electrical wiring diagram illustrating a PWM control circuit used in the discharge lamp apparatus shown in FIG. 23.

Next, the PWM control circuit 100 will be described. As shown in FIG. 27, the PWM control circuit 100 comprises a threshold level setting circuit 101 for setting a threshold value, a saw-tooth signal generation circuit 102 for generating the saw-tooth signal, and a comparator 103 for comparing the saw-tooth signal with a threshold value and for generating and supplying the gate signal having duty ratio corresponding to the threshold value to the MOS transistor 42.

The threshold level setting circuit 101 is provided for setting the threshold level corresponding to the output voltage (command signal) supplied from the error amplifier circuit 301. The threshold level setting circuit 101 is provided with a level inverting circuit 110 for setting the lower threshold level as the output voltage supplied from the error amplifier circuit 301 is higher, and a limit value setting circuit 120 for setting the upper limit value (limit value) of the duty ratio.

The level inverting circuit 110 comprises PNP transistors 111 and 112 that constitute a current mirror circuit, a NPN transistor 113 having a base terminal connected to the collector of the PNP transistor 112, and resistors 114 and 115. The output terminal of the error amplifier circuit 301 is connected to the collector terminal of the PNP transistor 111 by way of the resistor 114, and the emitter terminal of the PNP transistors 111 and 112 is connected to the constant voltage power source.

When the output voltage of the error amplifier circuit 301 is lowered to reduce the lamp power, the current that flows through the resistor 114 increases. As a result, the collector current of the PNP transistor 112 is increased by the PNP transistors 111 and 112 that constitute the current mirror circuit, and the voltage VM of the junction point between the collector terminal of the PNP transistor 112 and the resistor 115 increases. Because the voltage VM is used as the input voltage VN of the inverting input terminal of the comparator 103 by way of the transistor 113 that is provided as an emitter follower circuit, the input voltage VN increases and the threshold level increases, and the duty ratio becomes small.

On the other hand, when the output voltage of the error amplifier circuit 301 is increased to increase the lamp power, the collector current of the PNP transistor 112 decreases and the voltage VM decreases. As a result the input voltage VN decreases and the threshold level is lowered, and the duty ratio becomes large.

Next, the limit value setting circuit 120 for setting upper limit value of the duty ratio will be described. The limit value setting circuit 120 comprises the first limit value setting circuit 121 for setting a limit value corresponding to the battery voltage VB, the second limit value setting circuit 122 for setting a limit value corresponding to the lamp voltage VL, the third limit value setting circuit 123 for setting the limit value to the maximum value allowable for the circuit when the battery voltage VB drops beyond a predetermined value, the fourth limit value setting circuit 124 for setting a limit value corresponding to the lamp current IL, and a NPN transistor 125 for limiting the duty ratio to a limit value set by means of the setting circuits 121 to 124.

The first limit value setting circuit 121 comprises resistors 121a to 121c, divides the battery voltage VB obtained from the connection point between the battery 1 and the primary winding 41a of the flyback transformer 41 by means of the resistors 121a to 121c to form the voltage VO.

The voltage VO is used to limit the duty ratio. For example, the output voltage of the error amplifier circuit 301 is increased to increase the lamp power and the voltage is decreased. At that time, if the voltage VM is higher than the voltage VO, then the NPN transistor 125 is turned off. The input voltage VN supplied to the comparator 103 is set by the voltage VM, and a threshold value corresponding to the output voltage of the error amplifier circuit 301 is set. However, if the voltage VM is lowered to a value lower than that of the voltage VO to increase the lamp power significantly, then the NPN transistor 125 is turned on, and the input voltage is limited by the voltage VO. That is, the threshold value is limited so as not to increase more by the voltage VO. The voltage VO corresponds to the above limit value. The limit value is larger as the voltage VO is smaller. That is, the maximum duty ratio becomes large.

Figure 28:
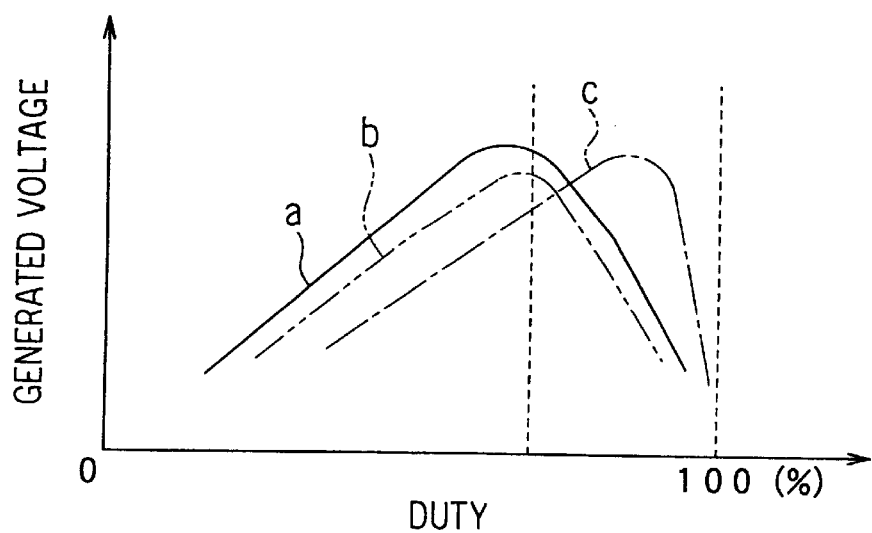
FIG. 28 is a graph illustrating the relation between a generated voltage of a transformer and a duty ratio.

In the first limit value setting circuit 121, the voltage VO is decreased as the battery voltage VB decreases, and the limit value is increased. The reason is that if the battery voltage VB decreases, the characteristic a slightly shifts to the right side and the peak height is lowered as shown by characteristic curve b in FIG. 28, and the voltage VO is decreased to match with the characteristic b.

The second limit value setting circuit 122 has a resistor 122a and NPN transistors 122b and 122c that constitute a current mirror circuit, and functions to change the voltage VO corresponding to the lamp voltage VL that indicates the supply power of the lamp 2. When the lamp voltage VL increases, the collector current of the NPN transistor 122c increases to thereby decrease the voltage VO and to thereby increase the limit value. The reason is that if the supply power of the lamp 2 increases, the characteristic a shifts to the right side as shown by characteristic curve c in FIG. 28, and the voltage VO is decreased to match with the characteristic curve c.

The above limit value is provided so that a sufficient energy is supplied to the secondary side of the flyback transformer 41. Specifically, when the lamp power control circuit 300 functions to increase the duty ratio to increase the lamp power significantly, the limit value is set so that the secondary side output of the flyback transformer 41 is prevented from decreasing.

However, if the battery voltage VB decreases significantly beyond, for example, 7 V, the above limit value is not suitable. It is required to increase the limit value more. In detail, in the case that the battery voltage VB decreases more significantly, because the secondary side output of the flyback transformer 41 decreases significantly. The sufficient secondary side output cannot be obtained, unless the limit value is increased correspondingly.

To avoid such problem, the third limit value setting circuit 123 sets the limit value to the maximum value that is allowable for the circuit. The third limit value setting circuit 123 comprises a NPN transistor 123a and a comparator 123b for on/off-controlling the NPN transistor 123a.

The comparator 123b is supplied with a predetermined voltage (for example, 7 V) to the non-inverting input terminal and supplied with the battery voltage VB to the inverting input terminal. When the battery voltage VB becomes lower than the voltage VK, the NPN transistor is turned on to thereby render the voltage VO approximately 0 V. As a result, the limit value is increased so that the duty ratio is approximately 10%, and the sufficient output of the secondary side is obtained.

Furthermore, to improve the lighting performance when the lamp is to be lighted, the fourth limit value setting circuit 124 is provided. The fourth limit value setting circuit 124 increases the limit value when the lamp current IL is lower than a predetermined value. The fourth limit value setting circuit 124 comprises a comparator 124a, a filter circuit having a resistor 124b and capacitor 124c, and a NPN transistor 124d.

The comparator 124a compares the voltage supplied from the terminal D by way of the filter circuit, that is, the voltage corresponding to the lamp current IL, with the reference voltage Vr2. If the voltage corresponding to the lamp current IL is lower than the reference voltage Vr2, a high level signal is generated to thereby turn on the NPN transistor 124*d*. As a result, the voltage VO decreases and the limit value is increased, and the output of the secondary side of the flyback transformer 41 can be sufficiently high resultantly.

In the fifth embodiment, the lamp power may be decreased as the apparatus temperature increases, not when the apparatus temperature exceeds the predetermined value. The predetermined temperature 110° C. is an exemplary value, and a different temperature may be used as the predetermined value for reducing the lamp power. In this case, the predetermined value is preferably 100° C. or higher in consideration of the thermal runaway of the apparatus temperature. In the case that the diode is used as in the fifth embodiment, it is possible to set the predetermined value by changing the number of diodes or changing the magnitude of the voltage applied to the terminal Vr3.

Sixth Embodiment

Figure 29:
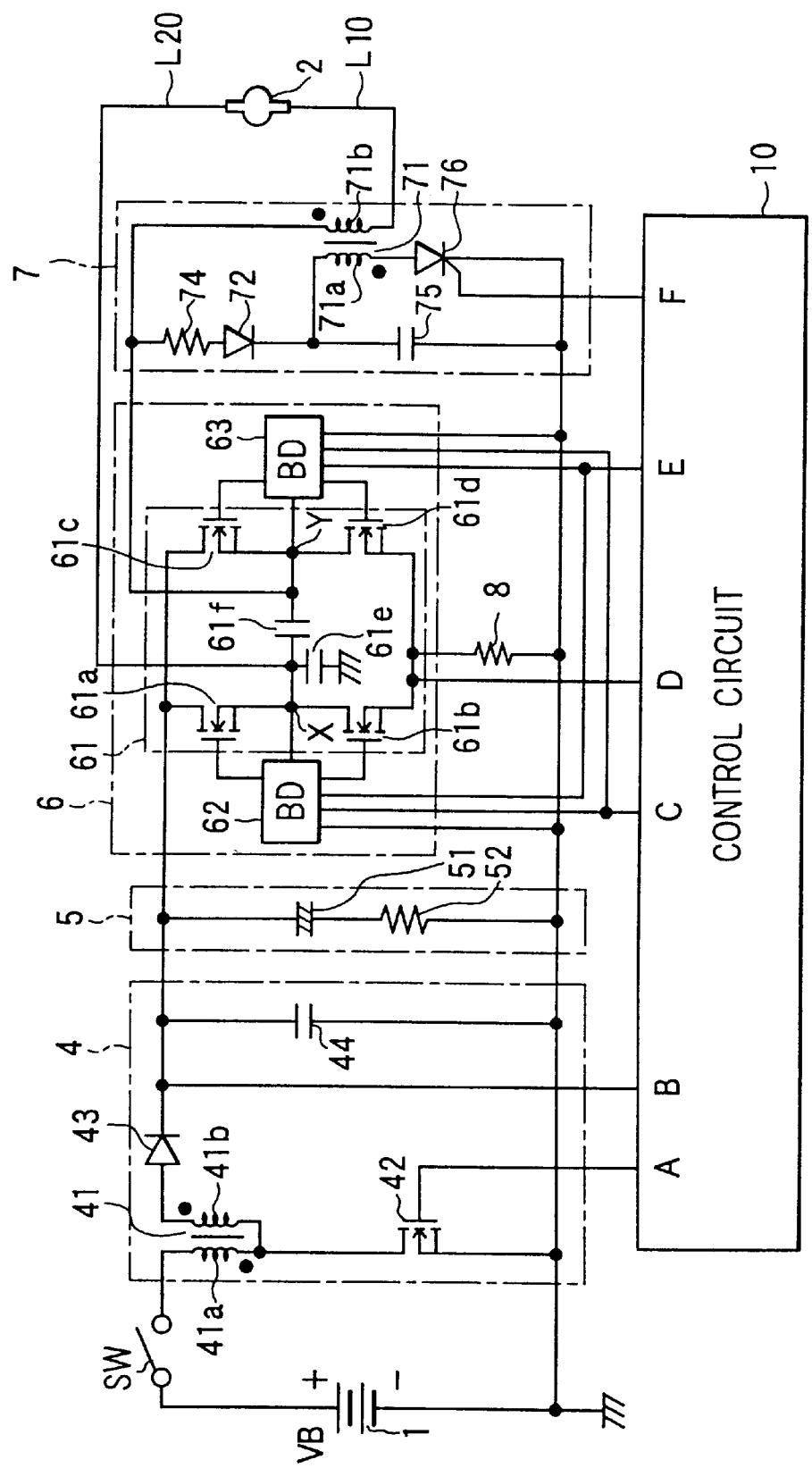
FIG. 29 is an electrical wiring diagram illustrating a circuit structure of a discharge lamp apparatus according to a sixth embodiment of the present invention.

A sixth embodiment is constructed in the similar manner as the fourth embodiment (FIG. 16) and the sixth embodiment as shown in FIG. 29. However, in the sixth embodiment, the capacitors 61*e* and 61*f* are connected differently from the fourth and fifth embodiments. That is, the capacitor 61*e* is connected between the middle potential point X and the ground, and the capacitor 61*f* is connected between the middle potential points X and Y. The discharge lamp apparatus shown in FIG. 29 is encased within the metal case (not shown) in the same manner as in the first to the third embodiments, for instance, as shown in FIG. 11.

Figure 30:
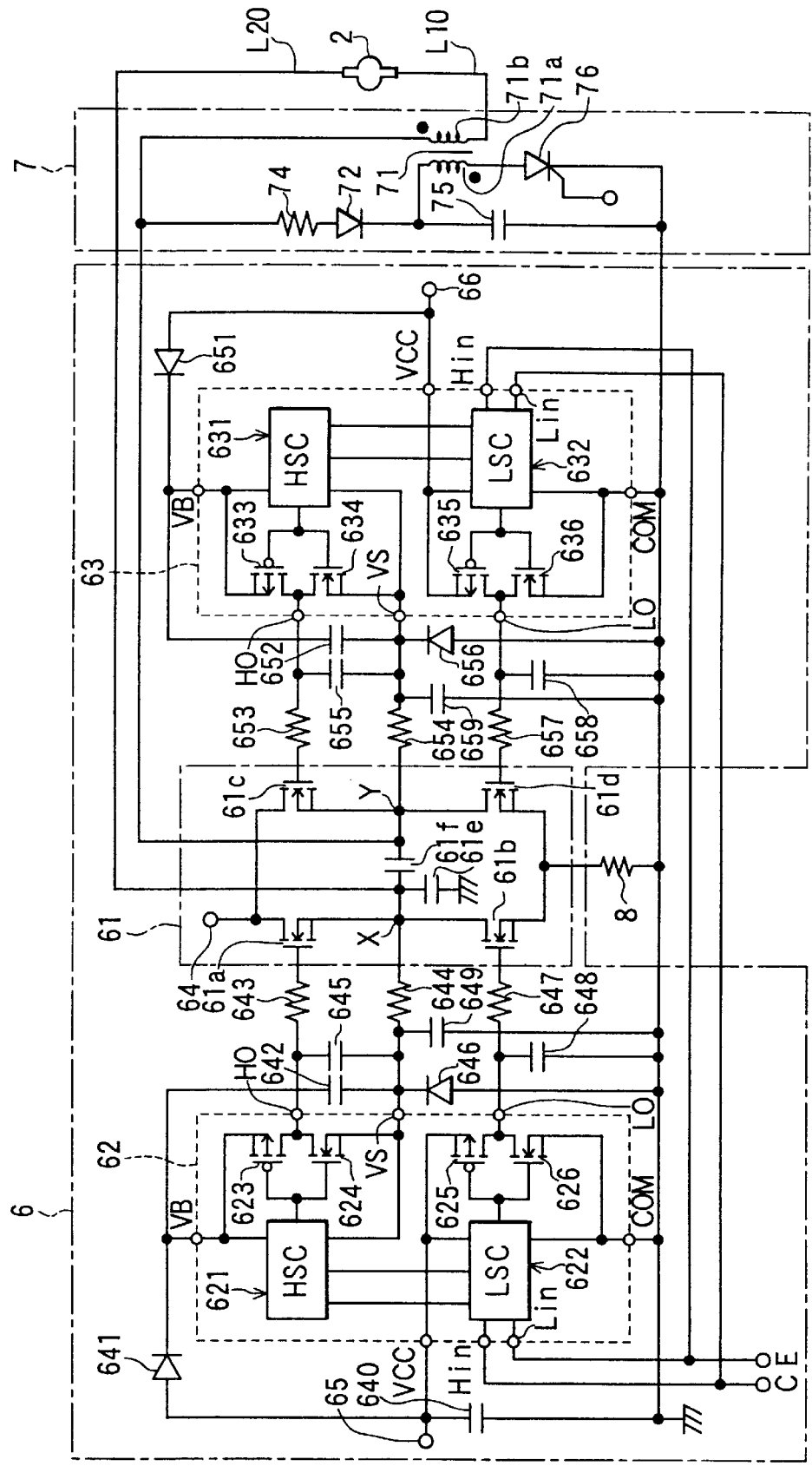
FIG. 30 is an electrical wiring diagram illustrating a detailed circuit structure of an inverter circuit used in the discharge lamp apparatus shown in FIG. 29.

In practice, the inverter circuit 6 is constructed as shown in FIG. 30.

The inverter circuit 6 is provided with the H-bridge circuit 61 comprising four MOS transistors 61*a* to 61*d* as described above. Furthermore, the inverter circuit 6 is provided with the bridge driving circuit 62 for generating the control signal to control the MOS transistors 61*a* and 61*b*, the bridge driving circuit 63 for generating the control signal to control the MOS transistors 61*c* and 61*d*, capacitors 640, 642, 645, 648, 649, 652, 655, 658, and 659, diodes 641, 646, 651, and 656, and resistors 643, 644, 647, 653, 654, and 657. Numerals 65 and 66 denote power source terminals connected to a common power source (not shown).

A high-and-low driver circuit (IR2101 of International Rectifier Corp.) is used as the bridge driving circuit 62. The bridge driving circuit 62 is provided with a Hin terminal and a Lin terminal that constitute input terminals, respectively. A Ho terminal and a Lo terminal constitute output terminals, respectively. A COM terminal serves as the negative electrode side reference potential.

The bridge driving circuit 62 has a high side circuit 621 and a low side circuit 622 that constitute two driving circuit sections. MOS transistors 623 to 626 are on/off-controlled by means of the signal supplied from these high side circuit 621 and the low side circuit 622. The Hin terminal and Lin terminal are connected to the low side circuit 622, and the Hin terminal and the Lin terminal are connected to the respective terminal C and terminal E that are linked to the control circuit 10 (FIG. 29). Upon receiving the control signal supplied from the control circuit 10 by way of these terminals C and E, the low side circuit 622 shapes the waveform of the control signal, and sends the waveform-shaped signal to the MOS transistors 625 and 626 connected in series as the driving signal, and transmits it to the high side circuit 621. The terminal potential is generated as on/off control signal for the MOS transistor 61*b* by way of the junction point between the MOS transistors 625 and 626, that is, Lo terminal (output terminal).

On the other hand, the high side circuit 621 generates the driving signal for the MOS transistors 623 and 624 connected in series upon receiving the transmission signal from the low side circuit 622. The terminal potential is generated as the on/off control signal for the MOS transistor 61*a* by way of the junction point between the MOS transistors 623 and 624 that is Ho terminal (output terminal).

The bridge driving circuit 63 has the same structure as that of the bridge circuit 62 excepting that the Hin terminal of the low side circuit 632 is connected to the terminal E and the Lin terminal is connected to the terminal C, that is, the connection is inverse to that of the bridge circuit 62. Therefore, the low side circuit 622 and the high side circuit 631 generate the same signal, and the high side circuit 621 and the low side circuit 632 generate the same signal.

Four driving circuit sections shown herein (high side circuits 621 and 631, low side circuits 622 and 632, and MOS transistors 623 to 626 and 633 to 636) drive MOS transistors 61*a* to 61*d* of the H-bridge circuit 61 based on the potential difference between the output terminals and negative electrode side reference potentials referring to the wiring connected to the source of the low side MOS transistors 624, 626, 634, and 636 as the negative electrode side reference potential. For this bridge driving circuits 62 and 63, VS terminal is served as the negative electrode side reference potential of the high side circuits 621 and 631, and the COM terminal is served as the negative electrode side reference potential of the low side circuits 622 and 632.

A charging current of the bootstrap capacitor 642 flows by way of the diode 641, capacitor 642, resistor 644, MOS transistor 61*b*, and resistor 8 when the MOS transistor is turned on, and the bootstrap capacitor 642 is charged. The charge charged in the capacitor 642 is used as the power source of the high side circuit 621.

The inverter circuit 6 is further provided with resistors 643, 647, 653, and 657 and capacitors 645, 648, 655, and 658. The resistors 643, 647, 653, and 657 are disposed between Ho and Lo terminals of the bridge driving circuits 62 and 63 and the MOS transistors 61*a* to 61*d*, respectively. The control signals of the high side circuits 621 and 631 and the low side circuits 622 and 632 are supplied to the MOS transistors 61*a* to 61*d* by way of these resistors.

The capacitors 645, 648, 655, and 658 are connected between the sources and drains of the low side MOS transistors 624, 626, 634, and 636 out of the MOS transistors 623 to 626 and 633 to 636 connected in series. These capacitors and resistors 643, 647, 653, and 657 constitute an integration circuit. The capacitors 645, 648, 655, and 658 in the above circuit structure function as a protective capacitor for surge absorption.

Furthermore, the middle points X and Y of the H-bridge circuit 61 (that is, junction point between the MOS transistor 61*a* and the MOS transistor 61*b*, and junction points between the MOS transistor 61*c* and the MOS transistor 61*d*) are connected to VS terminals of the bridge driving circuits 62 and 63 by way of the resistors 644 and 654. VS terminals of the bridge driving circuits 62 and 63 are connected to COM terminals by way of the capacitors 649 and 659. Thereby, the resistors 644 and 654 and capacitors 649 and 659 constitute an integration circuit. The capacitors 649 and 659 in the above circuit structure function as a protective capacitor for surge absorption.

The inverter circuit 6 having the structure described above controls the high side circuits 621 and 631 and the low side circuits 622 and 632 to generate the control signal based on the control signal supplied from the H-bridge control circuit 400 transmitted by way of the terminals C and E, and the MOS transistors 61a to 61d are turned on and off alternately in the diagonal relation.

Next, the effect of the surge current generated when the high voltage pulse is generated for starting the lighting of the lamp 2 in the inverter circuit 6 will be described.

When the lighting switch SW is turned on, circuits are operated and the capacitor 75 in the starter circuit 7 begins to be charged. Afterward, when the thyristor 76 is turned on, the capacitor 75 discharges by way of the primary winding 71a of the transformer 71. At that time, the high voltage pulse is generated on both ends of the secondary winging 71b, and the high voltage pulse is applied to the lamp 2. Thereby, the dielectric breakdown occurs between electrodes of the lamp 2 (spark discharge), thus lighting the lamp 2.

Because the starter circuit is disposed near the inverter circuit 6 at the time point before lighting, the distributed capacitance is formed between the high voltage portion and other portion of the different potential. Further the distributed capacitance is formed between the electrical wiring L10 extending to the lamp 2 and the ground shield that covers the electrical wiring L10. The charge charged in these distributed capacitance is discharged by way of the lamp 2 due to dielectric breakdown of the lamp 2 by means of the high voltage pulse.

The discharge current of the distributed capacitance flows into the H-bridge circuit 61 by way of the lamp 2 and the electrical wiring L20 as a surge current. The surge current has a damped oscillation waveform of several ten MHz, and a peak current value of several ten to 200 A, depending on the dielectric breakdown voltage of the lamp 2 and the distributed capacitance. The surge current flows to the ground through any portion of the circuit functional section. Because any impedance exists on the path where the surge current passes and flows to the ground, a surge voltage is generated on the surge current path due to the voltage drop at the impedance. Because the surge current generated as above is a high frequency current, it is difficult to specify the surge current path. Actually, the surge current flows dividedly everywhere. For example, the current flows in the direction from the electric wiring L20→ MOS transistors 61a to 61d of the H-bridge circuit 61→ the bridge driving circuit 62.

In this case, capacitors 61e and 61f are provided in the H-bridge circuit 61 so that the surge current mostly returns to the starter circuit 7 and the distributed capacitance to thereby suppress the generation of the surge voltage. However, the surge voltage cannot be suppressed perfectly. In detail, when the surge current returns by way of the capacitors 61e and 61f, the surge current generates a surge voltage on both ends of the capacitors 61e and 61f due to charging/discharging. For example, a voltage of approximately 400 V is applied to the lamp when the high voltage pulse is generated for lighting the lamp 2, at that time because the H-bridge circuit 61 controls the MOS transistors 61a and 61d to be turned on and the MOS transistors 61b and 61c to be turned off, the surge current occurs in the state that the voltage of 400 V is applied to the both ends of the capacitor 61e. Therefore, the surge voltage generated on both ends of the capacitor 61e is a voltage that oscillates between positive side and negative side with respect to 400 V. The surge voltage is applied to the middle potential point X of the H-bridge, and the surge current flows into Ho terminals and Lo terminals of the bridge driving circuits 62 and 63 by way of the MOS transistors 61a to 61d, and flows into VS terminals.

The leakage magnetic flux is generated from the transformer 71 when the high voltage pulse is generated, and the leakage magnetic flux crosses with other circuits to induce the surge voltage on the interlinked circuit. For example, in the gate driving circuit of the MOS transistor 61b, a loop circuit through the gate-source of the MOS transistor 61b, the resistor 8, source-drain of the MOS transistor 626, and the resistor 647 is formed, and the surge voltage is induced in the loop at the portion where the above-mentioned leakage magnetic flux crosses with the loop. The induced voltage is applied, for example, between gate and source of the MOS transistor 61b.

On the other hand, in the sixth embodiment, the gate terminals of MOS transistors 61a to 61b of the H-bridge circuit 61 are connected to output terminals of the bridge driving circuits 62 and 63 for driving the MOS transistors 61a to 61d by way of resistors 643, 647, 653, and 657. As a result, the surge current that flows into Ho terminals and Lo terminals of the bridge driving circuits 62 and 63 by way of the MOS transistors 61a to 61d is thereby suppressed. Furthermore, the middle potential points X and Y of the H-bridge circuit 61 is connected to VS terminals of the bridge driving circuits 62 and 63 by way of the resistors 644 and 654. As a result, the surge current that flows into VS terminals of the bridge driving circuits 62 and 63 is thereby suppressed.

Furthermore, the capacitors 645, 648, 655, and 658 are connected between drains sources of the MOS transistors 624, 626, 634, and 636 that constitute the output sections of the bridge driving circuits 62 and 63. Thereby, when the surge current flows through the wiring that connects the gate terminals of the MOS transistors 61a to 61d to the driving circuit for driving the MOS transistors, the integration circuit comprising the resistors 643, 647, 653, and 657 and the capacitors 645, 648, 655, and 658 functions as a low pass filter to thereby absorb the high frequency wave current and suppress the surge voltage generated on both ends of the capacitors.

That is, the resistance value of the resistors 643, 647, 653, and 657 and the capacitance value of the capacitors 645, 648, 655, and 658 are set so that the surge voltage generated between the gates and the sources of the MOS transistors 61a to 61d is lower than the withstand voltage (30 V) of the element. The set value is determined depending on the magnitude of the distributed capacitance. The voltage generated when the dielectric breakdown of the lamp 2 occurs (breakdown voltage), and the wiring pattern and mounting structure of the circuit functional section.

According to the experimental result, the surge voltage can be suppressed to a value lower than the withstand voltage of the element by suppressing the time constant (CXR) to a value equal to or larger than 0.2 microsecond or larger for the resistance value of the resistors 643, 647, 653, and 657 and the capacitance value C of the capacitors 645, 648, 655, and 658.

Similarly, capacitors 649 and 659 are connected between VS terminals and COM terminals of the bridge driving circuits 62 and 63. Thereby, when the surge current flows through the wiring that connects between the middle potential points X and Y of the H-bridge circuit 61 and VS terminals of the bridge driving circuits 62 and 63, the integration circuit comprising the resistors 644 and 654 and the capacitors 649 and 659 functions as a low pass filter to absorb the high frequency wave current and attenuate the surge voltage generated on both ends of the capacitors.

That is, the resistance value of the resistors 644 and 654 and the capacitance value of the capacitors 649 and 659 are set so that the surge voltage generated between VS terminals and COM terminals is lower than the withstand voltage between these components. The set value is also determined depending on the magnitude of the distributed capacitance, the voltage generated when dielectric breakdown of the lamp 2 occurs (breakdown voltage), and the wiring pattern and mounting structure of the circuit functional section.

According to the experimental result, the surge voltage can be suppressed to a value lower than the withstand voltage between VS terminals and COM terminals by suppressing the time constant (CXR) to a value equal to or larger than 0.01 microsecond or larger for the resistance value of the resistors 644 and 654 and the capacitance value C of the capacitors 649 and 659.

Furthermore, a low pass filter comprising an integration circuit having the resistors 643, 647, 653, and 657 and the capacitance between gates and sources of the MOS transistors 61a to 61d of the H-bridge 61 (MOS capacitance) is formed. Therefore, in the case of this integration circuit, the surge voltage may be set to a value equal to or lower than the withstand voltage of the MOS transistors 61a to 61d similarly to the above-mentioned case. According to the experimental result, the surge voltage can be suppressed to a value lower than the withstand voltage of the elements by suppressing the time constant (CXR) to a value equal to or larger than 0.2 microsecond or larger for the resistance value of the resistors 643, 647, 653, and 657 and the capacitance value C between the gates and sources of the MOS transistors 61a to 61d of the H-bridge circuit 61.

In the case that the resistors 643, 647, 653, and 657 and capacitors 645, 648, 655, and 658 are not provided as in this sixth embodiment, semiconductor devices (623 to 626, 633 to 636, and 61a to 61d) having the MOS structure are likely to break down. The surge current flows through the wiring that connects the gate terminals of the MOS transistors of the H-bridge circuit 61 to the driving circuit for driving the MOS transistors, and the surge voltage due to the surge current exceeds the withstand voltage of the elements. As a result, the breakdown occurs.

That is, if there are no resistor 643 or the like and no capacitor 645 or the like, a large potential difference that exceeds the withstand voltage of the elements is generated between the gates and sources of the MOS transistors 61a to 61d (between drains and sources of the MOS transistors 624, 626, 634, and 636) when the surge current flows.

In the case of the semiconductor device having the MOS structure, the withstand voltage of the gate depends on the film thickness of the gate oxide film. Usually, the gate oxide film thickness is several hundreds to 1000 Å. The withstand voltage of the gate oxide film is proportional to the film thickness, and the theoretical value is approximately 80 V at the thickness of 1000 Å. However, actually because the withstand voltage involves scattering due to defect of the oxide film to cause weak point, the noise-susceptible part is broken down.

Because elements having the withstand voltage lower than a predetermined value are rejected by means of inspection by a semiconductor manufacturer, elements have mostly withstand voltage higher than approximately 80 V when the gate oxide film thickness is 1000 Å. However, some of them among a large number of elements have low withstand voltage, and such elements are broken down.

The sixth embodiment may be modified as follows.
(1) In the case that a high voltage pulse is generated without fail while the MOS transistors 61a and 61d are being on and the MOS transistors are being off, for example, only the capacitors 648 and 655 are necessary because the path of the surge current is defined.

The path through which the surge current flows is defined depending on the parts disposition and the wiring pattern. Therefore it is possible that only one capacitor is used.

Furthermore, from the viewpoint of prevention of breakdown of the MOS transistors 61a to 61d of the H-bridge circuit 61, only the capacitors 643, 647, 653, and 657 may be provided.

(2) Though the resistors 644 and 654 and the capacitors 649 and 659 are provided for withstand voltage protection of the bridge circuits 62 and 63, providing the control state of the H-bridge circuit 61 at the time when the lamp 2 is started up is determined previously, any one of the bridge driving circuits 62 and 63 may be protected, only one resistor and one capacitor are necessary.

In detail, in the case that the MOS transistors 61 and 61d and the MOS transistors 61b and 61c are controlled so as to be on and off, respectively, at the time when the lamp 2 is started up, because the middle potential point Y of the H-bridge driving circuit 61 is almost ground voltage, the surge voltage is not significant even though the surge voltage is generated. Therefore, in this case, only the resistor 644 and the capacitor 649 are provided, and the resistor 654 and the capacitor 659 may be eliminated.

On the other hand, in the case that the MOS transistors 61a and 61d and the MOS transistors 61b and 61c are controlled so as to be OFF and ON respectively, only the resistor 654 and the capacitor 659 may be provided.

In the case that the control state of the H-bridge circuit 61 at the time when the high voltage pulse is generated for starting up of the lamp 2 is not determined, all the resistors 644 and 654 and the capacitors 649 and 659 are provided so that botH-bridge driving circuits 62 and 63 are protected.

(3) Though high and Low driver circuits are used for the bridge driving circuits 62 and 63, other circuit may be used as long as the circuit is the driving circuit of the H-bridge. For example, not the circuit having two MOS transistors 623 to 626 and 633 to 636 connected in series but the circuit in which any one of these is replaced with a resistor or coil may be used.

(4) The MOS switch elements (61a to 61d) of the H-bridge circuit 61 may be replaced with IGBT devices.

(5) The starter circuit 7 is by no means limited to the circuit shown in FIG. 29 and FIG. 30, but any circuit that generates the starting high voltage pulse may be used.

Seventh Embodiment

Figure 31:
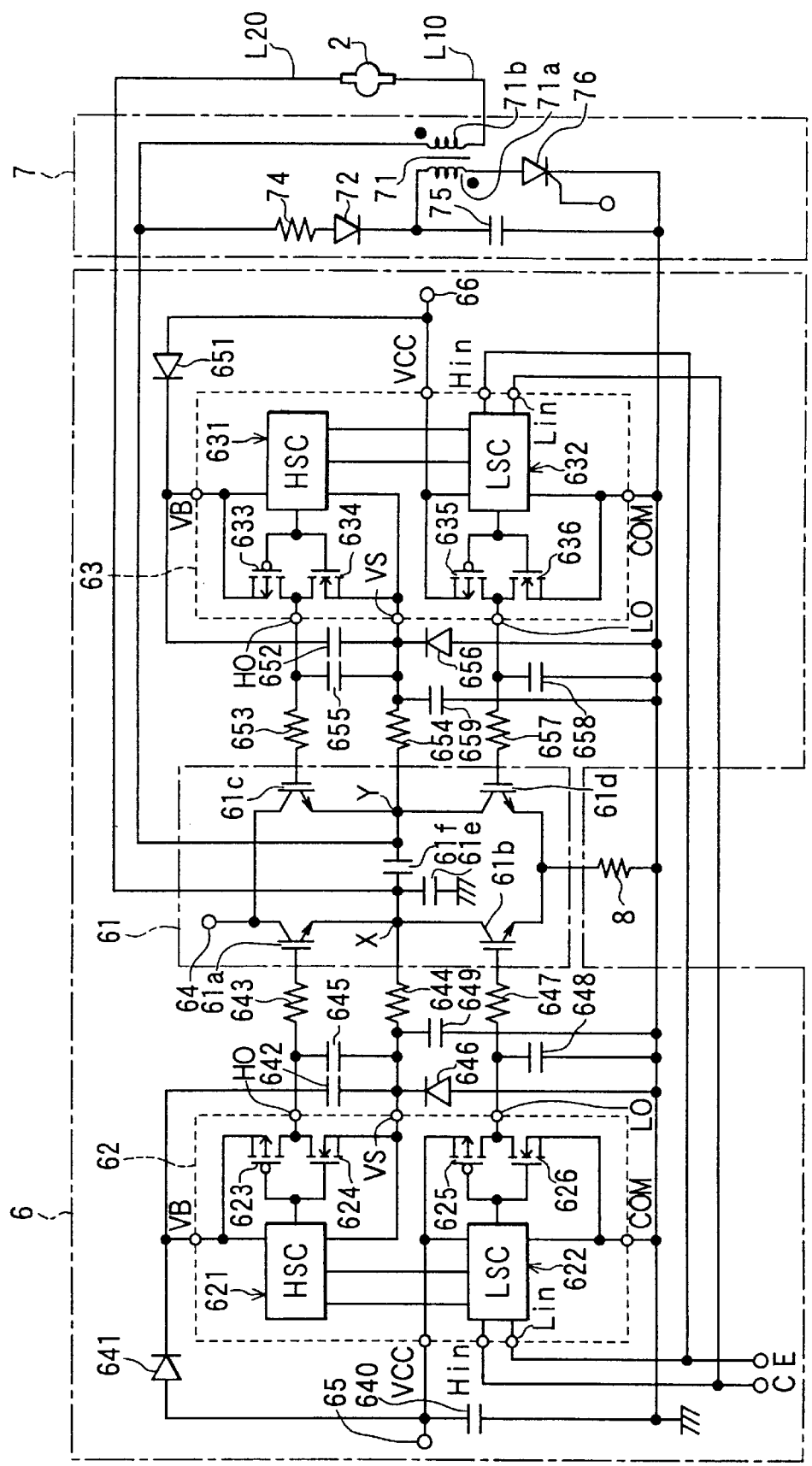
FIG. 31 is an electrical wiring diagram illustrating a circuit structure of an inverter circuit used in a discharge lamp apparatus according to a seventh embodiment of the present invention.

A seventh embodiment is constructed as the sixth embodiment. In the seventh embodiment, however, the H-bridge circuit 61 is constructed with IGBTs 61a to 61d as shown in FIG. 31 in place of the MOS transistors 61a to 61d in the sixth embodiment. The IGBTs 61a to 61d are used, because IGBTs consume less electric power and are small in size. However, the current which flows through the IGBTs upon accidental grounding of the lamp wiring will increase to about 200 A as opposed to several tens of amperes in the case of the MOS transistors. This excessive current will break the driving circuits 62 and 63. It is therefore required to protect the driving circuits 62 and 63.

In the seventh embodiment, therefore, similarly as in the sixth embodiment, the inverter circuit 6 is provided with diodes 646 and 656 as clamp means for connecting between the VS terminals and the COM terminals of the bridge driving circuits 62 and 63. The diodes 646 and 656 are connected between the VS terminals and the COM terminals in the state that the cathode terminals are facing to the VS terminal sides and the anode terminals are facing to the COM terminal sides. Thereby, the negative potential applied on the VS terminals is adjusted to a predetermined potential.

The seventh embodiment operates in the similar manner as the sixth embodiment. The following description is therefore directed to the protection of the driving circuits 62 and 63 by the diodes 646 and 656.

For example, when the connection wiring of the lamp 2 is brought into a connector accidentally during connection of the lamp 2 to the connector of the discharge lamp apparatus in the lamp replacing work, the discharge lamp apparatus is grounded. In such a case, the wiring L10 connected to the lamp 2 is grounded (short circuit state), and at the moment of the ground the charge of the smoothing capacitor 44 charged to approximately 90 V is short-circuit discharged by way of the IGBT 61a.

At that time, the discharge current of the capacitor 44 produces a damped oscillation current waveform having a peak of approximately 200 A. The reason is that the capacitance of the capacitor 44 is resonant with the inductance of the wiring of the discharge path. The damped oscillation current due to resonance causes the oscillating voltage having positive/negative several ten volts with respect to the ground potential at the middle potential points X and Y of the H-bridge. The positive potential at the middle potential points X and Y does not cause any problem, (because the voltage does not exceed such a voltage in the normal use state. However, the negative potential causes a problem.

A trial discharge lamp apparatus in which the IGBT was used for the H-bridge was fabricated, and has been studied. In the trial discharge lamp apparatus, the resistance of the resistors 644 and 654 was made to 0Ω, and the diodes 646 and 656 were eliminated in the inverter circuit 6 shown in FIG. 31.

In the case of the trial discharge lamp apparatus, when the potential of the middle potential point X became negative because of the grounding, the driving circuit 62 was broken down. The reason is that when the potential at the middle potential point x becomes negative, the negative voltage is applied between the COM terminal and the VS terminal of the driving circuit 62. As a result, the driving circuit 62 is broken down due to the breakdown of the internal part of the integrated circuit.

Diodes 646 and 656 were added in the state that the resistance of the resistors 644 and 654 was 0 to modify the trial discharge lamp apparatus, and the negative voltage was clamped. In this case, the voltage of several ten volts was generated at the middle potential point X, and the driving circuit 62 was broken down. The reason is that the forward voltage drop due to a large current flow through the diode 646 was large, and As a result, the negative voltage of several ten volts was generated at the middle potential point X, and the driving circuit 62 was broken down.

On the other hand, in the case of the seventh embodiment, the resistor 644 is provided between the middle potential point X of the H-bridge and the VS terminal of the driving circuit 62, the diode 646 is connected between the VS terminal and the COM terminal. The resistor 654 is provided between the middle potential point Y of the H-bridge and the VS terminal of the driving circuit 63, and the diode 656 is connected between the VS terminal and the COM terminal.

By employing the above structure, for example, when a negative voltage is applied on the middle potential point X, the magnitude of the current that flows into the middle potential point X is restricted by the resistor 644. Only the current restricted by the resistor 644 flows through the diode 646, the forward voltage drop of the diode 646 is sufficiently low. The applied voltage between the VS terminal and the COM terminal is clamped to a low value, and the driving circuits 62 and 63 are not broken down. In the case that the wiring that connects the middle potential point Y of the H-bridge to the lamp 2 is grounded, the driving circuit 63 is not broken down as in the case that a negative voltage is applied on the middle potential point X as described above. Thus, even when a negative voltage is applied to the X and Y points of the H-bridge, the driving circuit 62 is protected from breakdown.

Whenear thed, the lamp 2 is turned off at that moment. Subsequent to the discharge of the capacitor 44, a current flows from the DC power source 1 by way of the transformer 41 and diode 43. This state is detected by means of the lamp voltage VL and the lamp current IL, after elapsing of the state for a predetermined time, a fail-safe circuit (not shown) may be operated to turn off all the elements in the H-bridge circuit (61a to 61d). Thereby, the ground current is prevented from flowing continuously.

The seventh embodiment may also be modified in the same manner as the sixth embodiment.

Eighth Embodiment

Figure 32:
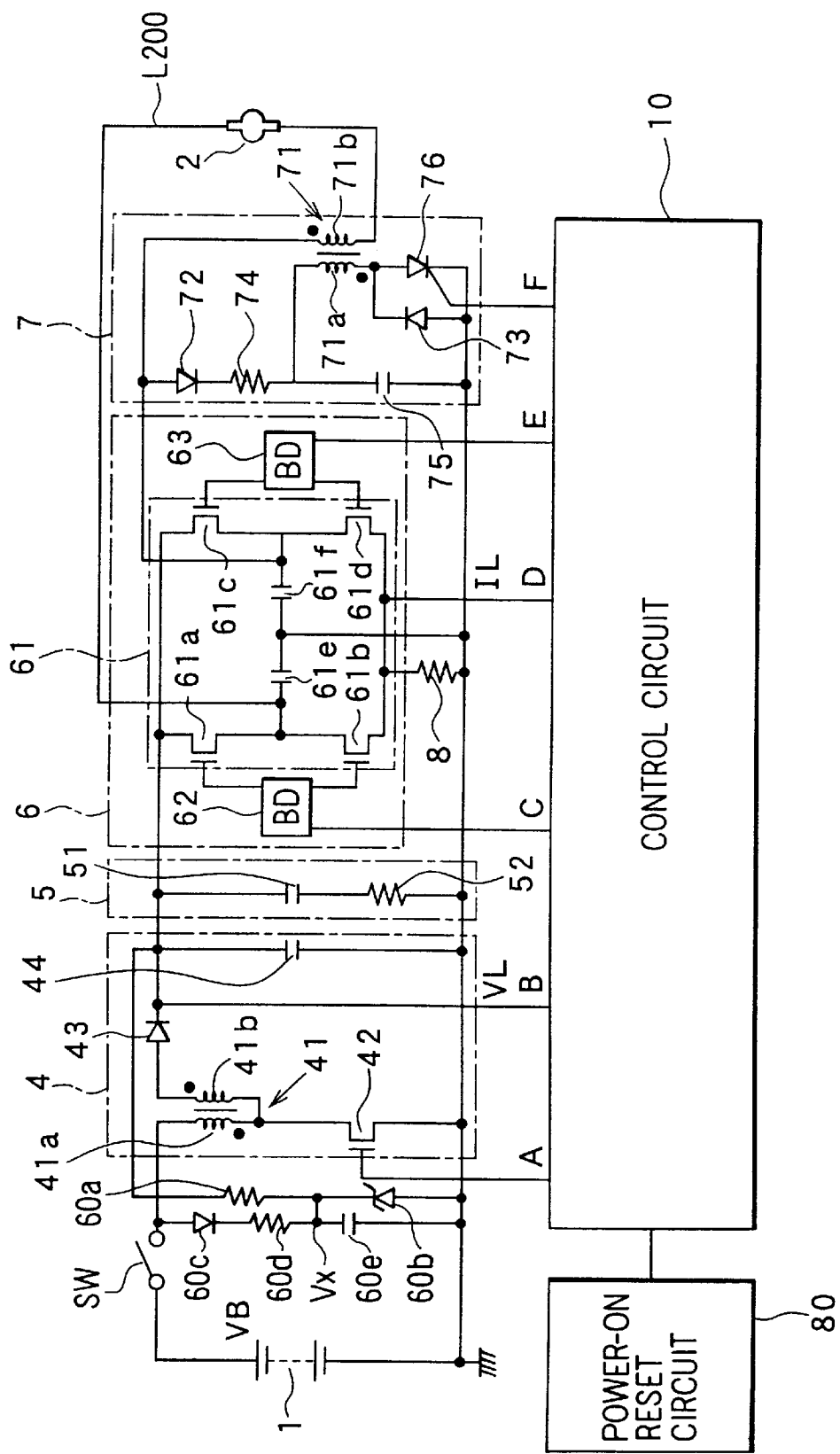
FIG. 32 is an electrical wiring diagram illustrating a circuit structure of a discharge lamp apparatus according to an eighth embodiment of the present invention.
Figure 33:
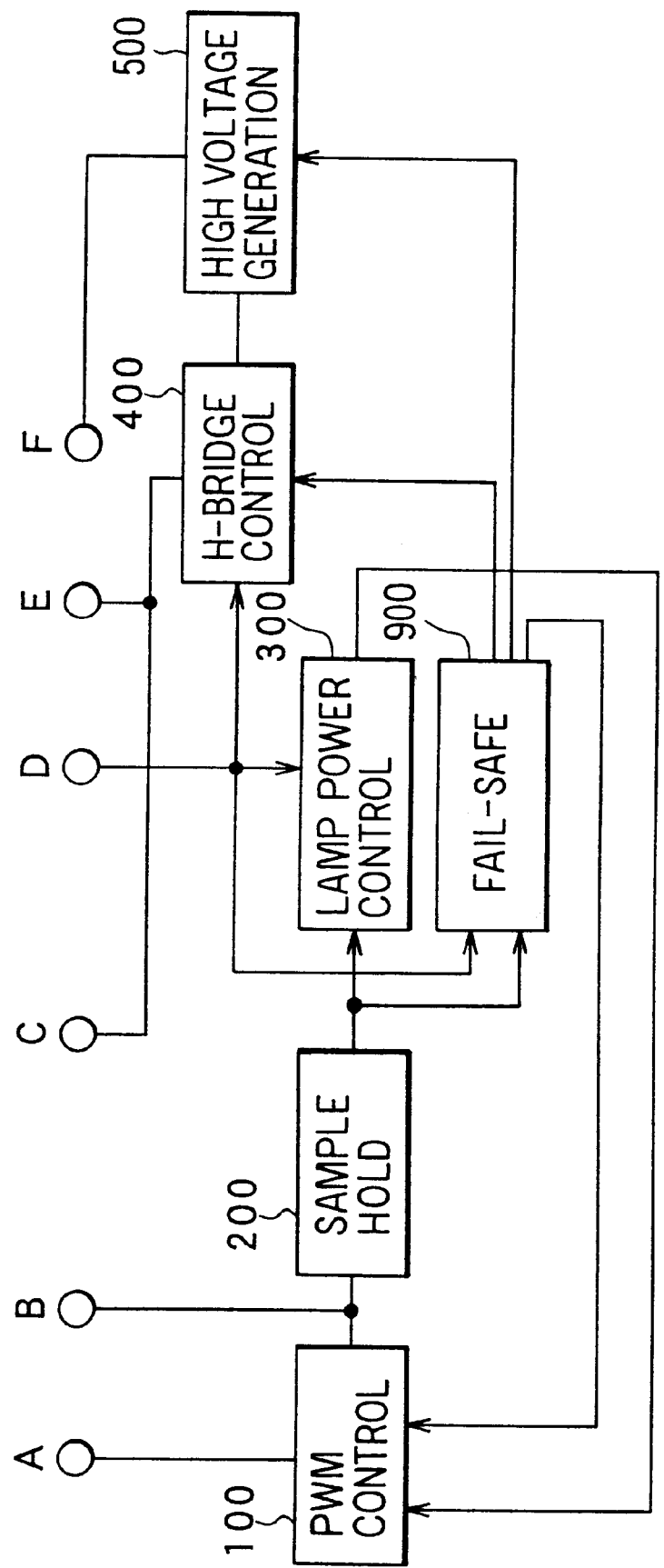
FIG. 33 is a block diagram illustrating a control circuit used in the discharge lamp apparatus shown in FIG. 32.

In an eighth embodiment, as shown in FIG. 32, a power-on reset circuit 80 is connected to the control circuit 10. Further, the inverter circuit 6 includes a resistor 60a, a Zener diode 60b, a diode 60c, a resistor 60d and a capacitor 60e. The control circuit 10 is constructed, as shown in FIG. 33, to have a fail-safe circuit 900 in addition to the control circuit 10 shown in the fifth embodiment (FIG. 23). The details of the inverter circuit 6 and the control circuit 10 are described in U.S. patent application Ser. No. 09/304,840 and now U.S. Pat. No. 6,232,728 (EP 0955793 A2) which is incorporated herein by reference.

Figure 34:
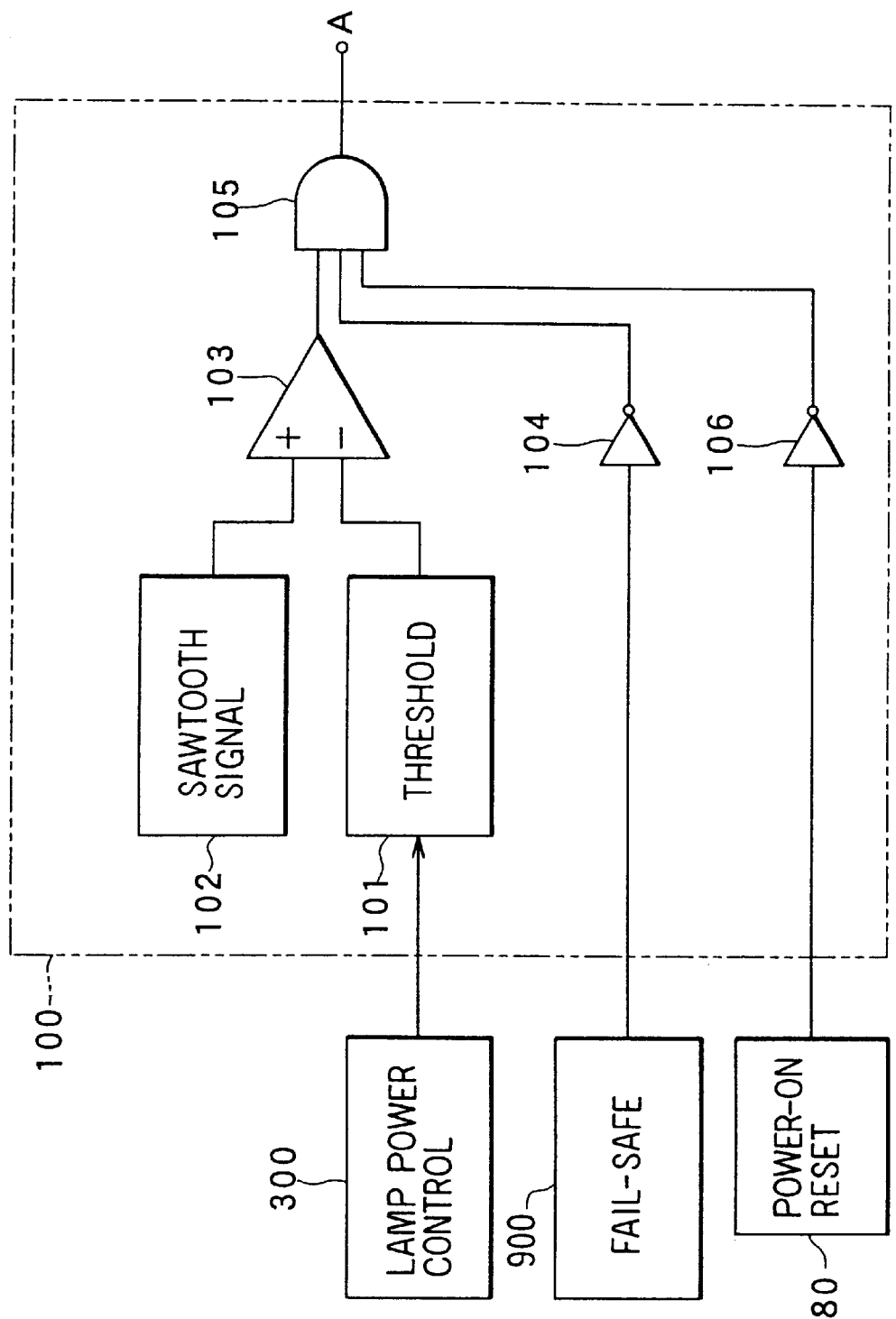
FIG. 34 is an electric wiring diagram illustrating a detail of a PWM control circuit shown in FIG. 33.

As shown in FIG. 34, the power-on reset circuit 80 and the fail-safe circuit 900 are connected to the PWM control circuit 100, which includes inverters 104, 106 and an AND gate 105 in addition to the threshold level setting circuit 101, the sawtooth signal generation circuit 102 and the comparator 103. The circuits 101, 102 and the comparator 103 are described with respect to the fifth embodiment (FIG. 27). Here, it is to be noted that the control circuit 10, particularly the H-bridge control circuit 400 (FIG. 33) is so constructed that output signals applied from the terminals C and E to the driving circuits 62 and 63 are maintained at the low level for a predetermined time after the switch SW is turned on, particularly after a power-on reset pulse from the power-on reset circuit 8 disappears.

In the PWM control circuit 100, when the fail-safe circuit 900 produces a high level signal indicative of the grounded condition of the lamp 2, the inverter 104 produces a low level signal. The AND gate 105 produces a low level output to turn off the MOS transistor 42. Thus, when the lamp 2 is grounded, the DC—DC converter 4 stops its operation. Further, when the power-on reset circuit 80 produces a high level signal indicative of application of the battery voltage to the discharge lamp apparatus, the inverter 106 produces a low level signal. The AND gate 105 produces the low level output to turn off the MOS transistor 42.

Figure 35:
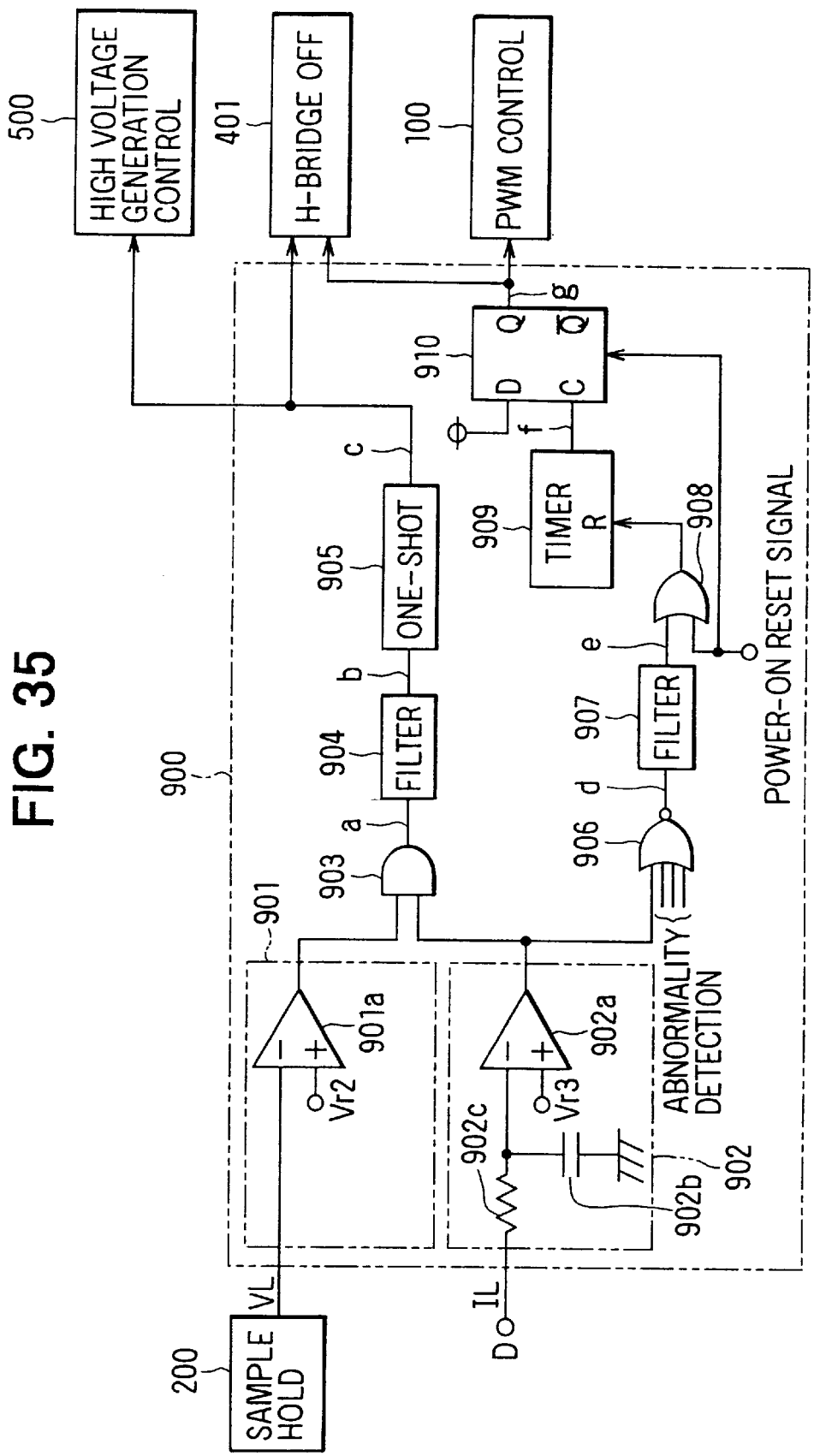
FIG. 35 is an electric wiring diagram illustrating a detail of a fail-safe circuit shown in FIG. 33.

The fail-safe circuit 900 is constructed as shown in FIG. 35. The fail-safe circuit 900 comprises a lamp voltage detection circuit 901, a lamp current detection circuit 902, an AND gate 903, a filter 904, a one-shot multivibrator circuit 905, a NOR gate 906, a filter 907, an OR gate 908, a timer circuit 909 and a D-type flip-flop 910.

The lamp voltage detection circuit 901 has a comparator 901a, which compares the lamp voltage VL of the sample-hold circuit 200 and a predetermined voltage Vr2 (for instance, 20 V) and produces a high level signal (voltage drop signal) while the lamp voltage VL is less than the predetermined voltage Vr2.

The lamp current detection circuit 902 comprises a comparator 902a, a capacitor 902b and a resistor 902c. The comparator 902a compares a voltage VIL corresponding to the lamp current IL with the predetermined voltage Vr3, and produces a high level signal (current drop signal) when the voltage VIL is less than the predetermined voltage Vr3, that is, the lamp current IL is less than a predetermined current (for instance, 0.2 A).

When the lamp 2 is under the power control, the lamp voltage VL is in the range of 20 V–400 V, for instance, and the lamp current is in the range of 0.35 A–2.6 A. Therefore, the lamp voltage detection circuit 901 and the lamp current detection circuit 902 both produce the low level signals.

However, when the electric wiring part at both sides of the lamp 2, that is, the electric wiring part between the inverter circuit 6 and the lamp 2, is grounded, an excessive current flows through the secondary side of the flyback transformer 41 and the lamp voltage VL decreases to less than 20 V. Further, the excessive current flows from the side of the secondary winding 41b to a ground, and the lamp current IL decreases to less than 0.2 A. Thus, the lamp voltage detection circuit 901 and the lamp current detection circuit 902 both produce the high level signals, and the AND gate 903 produces the high level output indicative of the grounded condition.

In case that the both sides of the lamp 2 is shorted, the lamp voltage VL decreases to less than the predetermined voltage Vr2 while the lamp current IL remains at more than the predetermined current. Further, in case that the lamp 2 is disconnected, the lamp current IL decreases to less than the predetermined current while the lamp voltage VL remains at more than the predetermined voltage Vr2. Thus, the grounded condition of the electric wiring L200 can be distinguished from the shorting and disconnection of the lamp 2.

Figure 36:
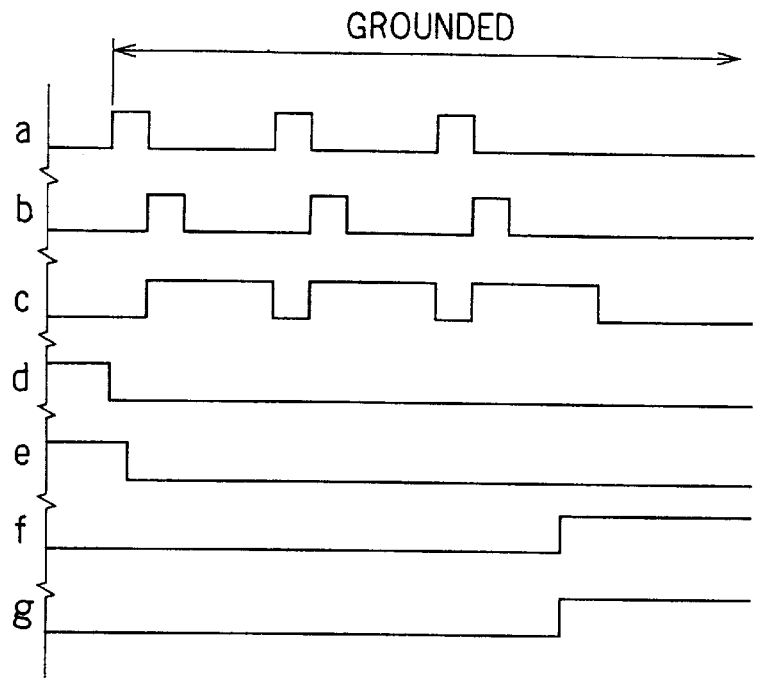
FIG. 36 is a timing diagram illustrating signal waveforms of various portions of the fail-safe circuit shown in FIG. 35 in the grounded state.

The operation after the grounding is described next. Signals at various parts in FIG. 35 is shown in FIG. 36.

When the output signal "a" of the AND gate 903 changes to the high level signal, the output signal "b" of the filter 904 also changes to the high level. The output signal "c" of the one-shot multivibrator circuit 905 remains high for a predetermined period (10 ms, for instance), and this high level output signal is applied to the H-bridge off circuit 901 and the high voltage control circuit 500.

A H-bridge off circuit 401 turns off the H-bridge circuit 61 by the high level signal from the one-shot multivibrator circuit 905. Thus, the excessive current caused by the grounding of the electric wiring part L200 is interrupted by the MOS transistors 61a and 61c.

Figure 37:
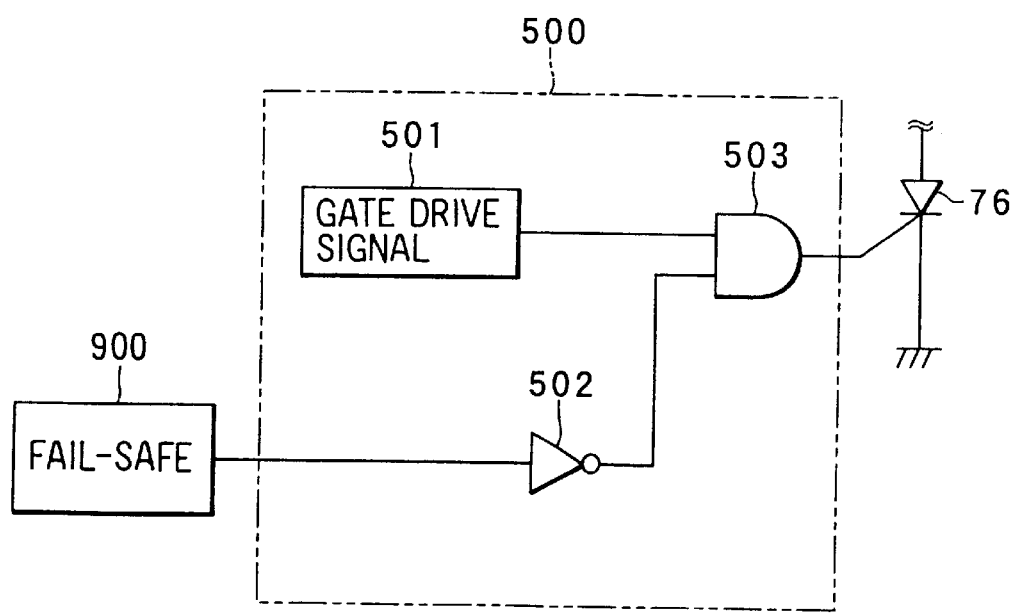
FIG. 37 is an electrical wiring diagram illustrating a structure of a high voltage generation circuit shown in FIG. 33.

The high voltage control circuit 500 operates not to apply the gate driving signal to the thyristor 76 in response to the high level signal from the one-shot multivibrator circuit 905. The construction of the high voltage control circuit 500 is shown in FIG. 37. The high voltage control circuit 500 has a signal generation circuit 501, which produces the gate driving signal to the thyristor 76 in response to the output signal from the H-bridge control circuit 400. Further, when the one-shot multivibrator circuit 905 produces the high level signal, an inverter 502 produces the low level output to close an AND gate 503 and disable the turning on of the thyristor 76. That is, generation of the high voltage for lighting the lamp 2 is disabled.

When the lamp voltage VL increases in response to the turning off of the H-bridge circuit 61, the output signal of the lamp voltage detection circuit 901 changes to the low level and the output signal "a" of the AND gate 903 changes to the low level.

When the output signal "c" of the one-shot multivibrator 905 changes to the low level thereafter, the H-bridge control circuit 400 starts to turn on and off the MOS transistors 61a–61d to start the electric power supply to the lamp 2. If the electric wiring part L200 continues to be in the grounded condition at this moment, the output signal of the lamp voltage detection circuit 901 changes to the high level again and the output signal "a" of the AND gate 903 also changes to the high level. As a result, the one-shot multivibrator circuit 905 produces the high level signal for the predetermined time to turn off the H-bridge circuit 61 and disable turning on of the thyristor 76.

The above operation is repeated as long as the grounding of the electric wiring part L200 continues.

Further, as the lamp current detection circuit 902 produces the high level signal, the output signal of the NOR gate 606 changes to the low level and the output signal "e" of the filter 907 also changes to the low level. Further, as the output signal of the OR gate 908 changes to the low level, the timer circuit 909 is released from the reset condition and starts to time counting operation. When a predetermined time (for instance, 0.2 s) elapses and the output signal "f" of the timer circuit 909 changes to the high level, the Q-terminal output signal "g" of the D-type flip-flop 910 changes to a high level in response to the output signal "g" as a clock.

The H-bridge off circuit 401 turns off the H-bridge circuit 61 in response to the high level signal from the D-type flip-flop 910, and the PWM control circuit 100 turns off the MOS transistor 42. That is, when the D-type flip-flop 910 produces the high level signal, the outputs of the inverter 104 and the AND gate 105 in FIG. 34 change to the low level. The MOS transistor 42 turns off and the DC—DC converter 4 stops its operation.

Thus, the primary current is restricted to increase excessively. That is, if the MOS transistor 42 is not turned off under the condition that the electric wiring part L200 is grounded and a certain contact resistance exists at the contact part, the electric power of the secondary side of the flyback transformer 41 is consumed greatly. However, by turning off the MOS transistor 42 to stop the operation of the DC—DC converter 4, the current flowing in the primary winding 41a of the flyback transformer 41 can be restricted from increasing excessively.

As described above, it is determined that the grounding exists when the lamp voltage VL is less than the predetermined voltage and the lamp current IL is less than the predetermined current. The H-bridge circuit 61 is turned off temporarily (for the predetermined time) and the generation of the high voltage for lighting again is disabled. After the predetermined time, the H-bridge circuit 61 is operated again to enable lighting again. If the grounding is determined again in this operation, the above operation is repeated. In case that the repetition of this operation continues for the predetermined time period, the DC—DC converter 4 is stopped from operating and this stop is maintained.

Thus, as the stop and restart of the H-bridge circuit 61 are repeated in response to the determination of the grounded condition based on the lamp voltage VL and the lamp current IL and the fail-safe operation is effected when the repetition continues for the predetermined period, erroneous operation is prevented in comparison with the case in which the fail-safe operation is effected immediately in response to a single determination of the grounding.

In the eighth embodiment, as described above, the low level signal is generated from the H-bridge control circuit 400 until the predetermined time elapses from the time when the switch SW is turned on, particularly from disapperance of the power-on reset pulse. Thereby, during this time period, all the MOS transistors 41a to 61d in the H-bridge circuit 61 are in off state.

Figure 38A:
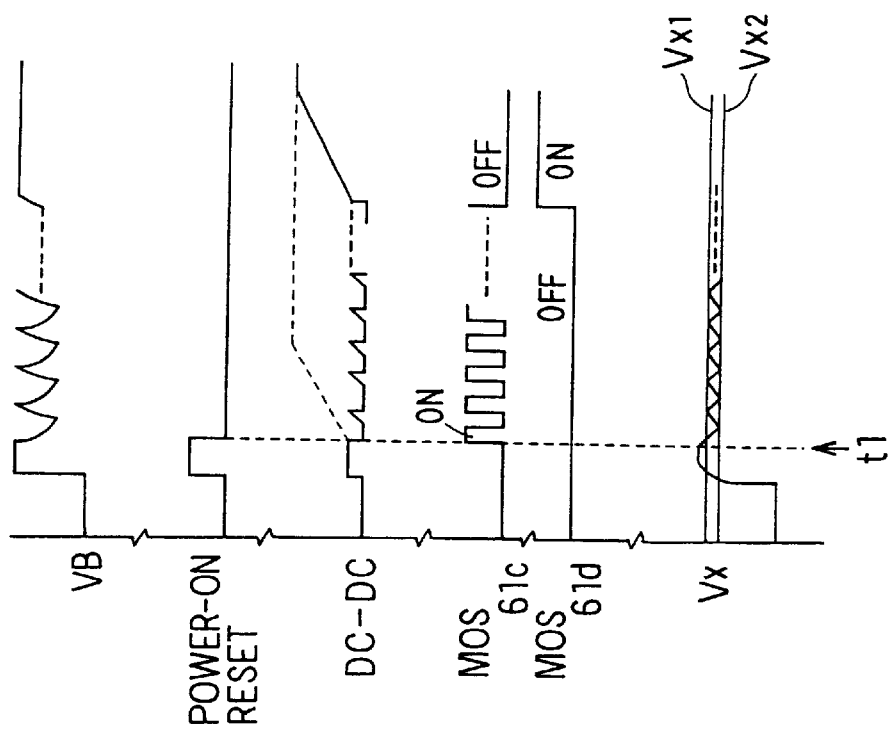
FIGS. 38A and 38B are timing diagrams illustrating output signal waveforms generated during operation of the eighth embodiment and a conventional apparatus, respectively.
Figure 38B:
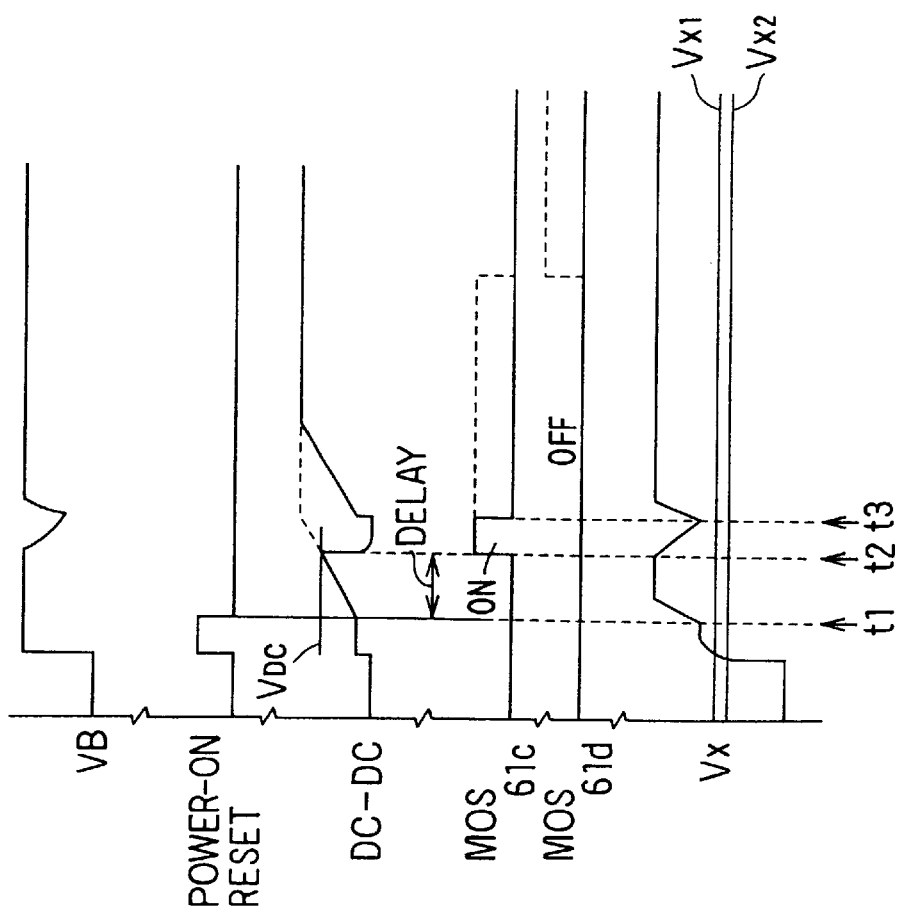

Therefore, when the switch SW is turned on in the state where the connection point between the MOS transistor 61c and the MOS transistor 61d, to which the lamp 2 is connected, is grounded, the operation as described below occurs. The output signal waveforms at various points during the operation are shown in FIG. 38A. For reference, the output signal waveforms of the various points in the conventional apparatus are shown in FIG. 38B. In the conventional apparatus, the high level signal and the low level signal are generated alternately from the H-bridge control circuit 400 (terminals C and E) at the same time as the switch SW is turned on.

First, from the time point when the switch SW is turned on and the power source voltage (VB) is applied, the power-on reset pulse circuit 8 generates a high level pulse that continues to timing t1. The power-on reset pulse initializes the circuits, and the operation of the circuits starts from the timing t1.

However, as described above, the MOS transistors 61a to 61d of the H-bridge circuit 61 continues in off state until the predetermined time elapses from the time when the switch SW is turned on, that is, until timing t2 in FIG. 38A. The operation of portions other than the MOS transistors 61a to 61d starts from the timing t1. A predetermined timing t3 is set to a value longer than the timing t1 when the power-on reset circuit 8 generates the power-on reset pulse.

First, the DC—DC converter 4 operates from the timing t1, and the output voltage of the DC—DC converter 4 increases with time gradually. Because the output voltage of the DC—DC converter 4 is applied to the Vx point by way of the resistor 60a, the voltage of the Vx point increases with increase of the output voltage of the DC—DC converter 4 down to the Zener voltage of the Zener diode 60b.

When above predetermined time elapses and the timing t3 comes, the H-bridge control circuit 400 generates the high level signal and the low level signal alternately from the terminals C and E. At that time, the output voltage of the DC—DC converter 4 reaches a predetermined voltage VDC. Therefore, the voltage of the Vx point is in the elevated state, and the capacitor 60e is also in the state where the capacitor 60e is charged with a sufficiently high voltage.

When the MOS transistor 61c is turned on, and the ground current flows by way of the primary wiring 41a and the secondary wiring 41b of the transformer 41, the diode 43, and the MOS transistor 61c. As a result, the VB voltage drops and the output voltage of the DC—DC converter 4 also drops, but the voltage of the Vx point decreases gradually along with the discharge of the capacitor 60e charged with the sufficiently high voltage. Because it takes a some long time for the capacitor 60e to discharge to the level where the voltage of the Vx point drops to the limit voltage Vx2 (the driving circuit 63 cannot operate with a voltage lower than the voltage Vx2), the fail-safe circuit 900 can detect the grounding at the timing t3 before the voltage drops to the voltage Vx2, and thus the MOS transistors 61a to 61d of the H-bridge circuit 61 can be turned off.

On the other hand, in the case of the conventional apparatus, when the switch SW is turned on and the power source voltage (VB) is applied, the power-on reset circuit 8 generates the power-on reset pulse that continues during the time period to the timing t1, the power-on reset pulse initializes the circuits, and the operation of various circuits including the H-bridge circuit 61 starts from the timing t1.

As a result, the MOS transistor 61c is turned on at the timing t1, and the ground current flows. Therefore, the voltage of the VB terminal drops due to the voltage drop of the electrical wiring, and the voltage of the Vx point also drops.

The voltage of the Vx point drops down to the voltage Vx2 that is the limit voltage for operation of the driving circuit 63, the driving circuit 63 is shut down, and the MOS transistor 61c is turned off. Thereby, the ground current is shut down. At that time, the duration of the ground current is short, the fail-safe circuit 900 cannot detect the grounding. Because of the above, when the MOS transistor 61c is turned off, the voltage of the Vx point increases to the voltage with which the driving circuit 63 can start the operation again. Then, the voltage of the Vx point increases, the driving circuit 63 starts the operation, the MOS transistor 61c is turned on, and the ground current flows again. The above operation is repeated again and again to cause oscillation, and the fuse and elements are broken down.

As described above, in the eighth embodiment, the MOS transistors 61a to 61d are turned off from the time when the switch SW is turned on to the time when the predetermined time elapses, that is, until the timing t2, thereby the fail-safe circuit 900 can detect the grounding surely even in the case of, for example, the grounding in which a short circuit occurs at the connection point between the MOS transistor 61c and the MOS transistor 61d. As a result, the circuit is protected from breakdown due to the above oscillation state.

In the fail-safe circuit 900, the fail-safe includes not only the grounding but also other malfunction (for example, disconnection of the connector (not shown) of the lamp 2. In this case, a malfunction detection signal (signal that is high level when a malfunction is detected) is supplied to the NOR gate 906. When the malfunction detection signal is supplied continuously for a time period while the timer circuit 909 counts a predetermined time, the high level signal is generated from the D-flip-flop 910, thereby the H-bridge circuit 61 is turned off and the MOS transistor 42 is turned off.

The present invention having been described with reference to the foregoing embodiments should not be limited to the disclosed embodiments and modifications, but may be implemented in many other ways without departing from the spirit of the invention.

What is claimed is:

1. A discharge lamp apparatus having a DC power source and a discharge lamp comprising:
    a transformer for boosting a voltage of the power source;
    a switching element connected to a primary side of the transformer; and
    power control means for duty-controlling the switching element based on a signal indicating a lighting state of the discharge lamp to thereby control the power supplied to the discharge lamp,
        wherein the power control means is provided with power reduction means for reducing the power supplied to the discharge lamp as a temperature increases;

the power reduction means has a plurality of diodes connected in series; and the power control means controls the power supplied to the discharge lamp based on the temperature characteristic of the diodes.

2. A discharge lamp apparatus having a DC power source and a discharge lamp comprising:

a transformer for boosting a voltage of the power source;

a switching element connected to a primary side of the transformer; and power control means for duty-controlling the switching element based on a signal indicating a lighting state of the discharge lamp to thereby control the power supplied to the discharge lamp;

wherein the power control means is provided with power reduction means for reducing the power supplied to the discharge lamp as an apparatus temperature increases in addition to a power control for stabilizing a lighting of the lamp during a start-up period.

3. A discharge lamp apparatus having a DC power source and a discharge lamp comprising:

a transformer for boosting a voltage of the power source;

a switching element connected to a primary side of the transformer; and power control means for duty-controlling the switching element based on a signal indicating a lighting state of the discharge lamp to thereby control the power supplied to the discharge lamp, wherein the power control means is provided with power reduction means for reducing the power supplied to the discharge lamp as an apparatus temperature increases.

4. The discharge lamp apparatus as in claim 3, wherein: the power control means controls the power reduction means so as to control the power supplied to the discharge lamp corresponding to a difference in temperatures between the predetermined value and the apparatus temperature when the temperature exceeds a predetermined value so as to reduce the power supply as the temperature difference is large.

5. The discharge lamp apparatus as in claim 3, wherein: the power control means controls the power reduction means so as to reduce the power supplied to the discharge lamp when the temperature exceeds a predetermined value.

6. The discharge lamp apparatus as in claim 5, wherein: the predetermined value is set to at least about 100° C.

7. A discharge lamp apparatus having a DC power source and a high voltage discharge lamp comprising:

a DC—DC converter including a transformer for boosting a voltage supplied from the power source;

a terminal connected electrically to the transformer;

a hybrid IC having a circuit connected electrically to the terminal;

a resin case to which the terminal is fixed and in which the transformer is contained; and an outer container for containing the transformer, the terminal, the hybrid IC, and the resin case, for applying a voltage based on the voltage boosted by the first transformer to the discharge lamp, wherein the hybrid IC is fixed on one face of the outer container in the outer container, wherein the transformer and the terminal are contained and fixed in the outer container together with the resin case, and wherein the transformer is disposed outside an outer periphery of the hybrid IC.

8. A discharge lamp apparatus having a DC power source and a high voltage discharge lamp comprising:

a DC—DC converter including a transformer for boosting a voltage supplied from the power source and a capacitor connected to the transformer in parallel;

a filter inductor connected between the DC—DC converter and the power source for filtering noise generated from the DC—DC converter;

a terminal connected electrically to the transformer, the capacitor, and the inductor;

a hybrid IC having a circuit connected electrically to the terminal;

a resin case to which the terminal is fixed and in which the transformer is contained; and an outer container for containing the first transformer, the inductor, the terminal, the hybrid IC, and the resin case, for applying a high voltage based on a voltage boosted by the first transformer to the discharge lamp, wherein the hybrid IC is fixed on one face of the outer container in the outer container, wherein the transformer, the inductor, and the terminal are contained and fixed in the outer container together with the resin case, wherein the first transformer, the capacitor, and the inductor are disposed outside an outer periphery of the hybrid IC, and wherein the capacitor is located between the first transformer and the inductor.

9. A discharge lamp apparatus as in claim 8 further comprising:

another transformer connected electrically to the terminal for further boosting the voltage boosted by the DC—DC converter and for applying the high voltage to the discharge lamp, wherein the another transformer is located on an opposite side to the first-named transformer with interposition of the hybrid IC therebetween.

10. A discharge lamp apparatus as in claim 9 wherein: a minimum distance between a core of the inductor and a core of the second transformer is larger than 10 mm.

11. A discharge lamp apparatus having a DC power source and a high voltage discharge lamp comprising:

a DC—DC converter including a first transformer for boosting a voltage supplied from the power source;

a second transformer for further boosting the voltage boosted by the DC—DC converter and for applying a high voltage to the discharge lamp;

terminals connected electrically to the first transformer and the second transformer;

a hybrid IC having a circuit connected electrically to the terminals;

a resin case to which the terminals are fixed and in which the first transformer and the second transformer are contained; and an outer container for containing the first transformer, the second transformer, the terminal, the hybrid IC, and the resin case;

wherein the hybrid IC is fixed on one face of the outer container in the outer container, wherein the first and second transformers and the terminal are contained and fixed in the outer container together with the resin case, and wherein the first transformer and the second transformer are disposed outside an outer periphery of the hybrid IC.

12. A discharge lamp apparatus as in claim 11, wherein:
a minimum distance between a core of the first transformer and a core of the second transformer is larger than 10 mm.

13. A discharge lamp apparatus as in claim 11, wherein:
a core of the transformer for boosting the voltage supplied from the power source is a ring-shaped toroidal type core.

14. A discharge lamp apparatus as in claim 11, wherein:
an outer periphery of a winding of the transformer for boosting the voltage of the power source is fixed to the resin base; and
the winding fixed to the resin base is assembled in the resin case.

15. The discharge lamp apparatus as in claim 11, wherein:
saturation magnetic flux density of a core of the transformer for boosting the voltage of the power source is above 6000 gauss at a core temperature of 1000° C.

16. The discharge lamp apparatus as in claim 11, wherein:
an outside size of the outer container disposed perpendicular to one face of the outer container to which the hybrid IC is fixed is smaller than 25 mm in the case that a 35W bulb is used as the discharge lamp.

17. The discharge lamp apparatus as in claim 16, wherein:
internal volume and weight of the outer container are smaller than 300 cc and lighter than 500 g, respectively.

18. The discharge lamp apparatus as in claim 11, wherein:
an outer container is provided with a metal case having an opening on one side and a cover for covering the opening of the metal case; and
the metal case covered with the cover is assembled within a vehicle lamp fitting, with the opening of the metal case being disposed in a downward direction.

19. A discharge lamp apparatus having a DC power source and a high voltage discharge lamp comprising:
a DC—DC converter comprising a transformer for boosting a voltage supplied from the DC power source, a switching element connected to a primary winding of the transformer in series, and a capacitor connected in parallel with the transformer connected in series with the switching element, for generating the boosted voltage;
a starter circuit having a thyristor for turning on the thyristor when the high voltage discharge lamp is started to light and for applying a high voltage pulse to the high voltage discharge lamp based on the boosted voltage generated from the DC—DC converter; and
a gate circuit for generating the gate signal to turn on the thyristor,
wherein the switching element and the gate circuit are both formed on a hybrid IC board,
wherein the negative electrode side terminal of the capacitor is connected to a first wiring member and then connected to the hybrid IC board by way of the first terminal,
wherein the cathode terminal of the thyristor is connected to a second wiring member and then connected to the hybrid IC board by way of the second terminal different from the first terminal, and
wherein the first terminal and the second terminal are electrically connected on the hybrid IC board.

20. The discharge lamp apparatus as in claim 19, wherein:
the gate circuit has a third terminal to be grounded; and
the hybrid IC board includes a first wiring pattern that extends from the third terminal to the ground, and a second wiring pattern that extends from the second terminal and connected to the first wiring pattern.

21. The discharge lamp apparatus as in claim 20, wherein:
the first terminal connected to the negative electrode side of the capacitor is electrically connected to the switching element by way of a third wiring pattern formed on the hybrid IC board;
the DC—DC converter forms a current path in which a current flows in the order from the transformer, the switching element, the third wiring pattern, and to the capacitor when the switching element is turned on; and
the electrical wiring that extends from the cathode terminal to the ground including the second wiring pattern does not pass through the third wiring pattern.

22. A discharge lamp apparatus having a DC power source and a high voltage discharge lamp comprising:
a DC—DC converter comprising a transformer for boosting a voltage supplied from the DC power source, a switching element connected to a primary winding of the transformer in series, and a capacitor connected in parallel to the transformer connected in series and the switching element, for generating the boosted voltage;
a starter circuit having a thyristor for turning on the thyristor when a high voltage discharge lamp is started to light and for applying a high voltage pulse to the high voltage discharge lamp based on the boosted voltage generated from the DC—DC converter; and
a gate circuit for generating a gate signal to turn on the thyristor,
where in the switching element and the gate circuit are both formed on a hybrid IC board,
wherein a n negative electrode terminal of the capacitor is connected to the hybrid IC board by way of a first terminal to thereby form electrical connection to the switching element, and
a cathode terminal of the thyristor is connected to the hybrid IC board by way of a second terminal different from the first terminal to thereby form electrical connection to a portion to be connected to a ground formed on the hybrid IC board.

23. A discharge lamp apparatus having a DC power source and a high voltage discharge lamp comprising:
a wiring member including a positive terminal to be connected to a positive terminal of the DC power source and a negative terminal to be connected to a negative electrode of the DC power source;
a circuit functional section connected to the DC power source by way of the wiring member in series for applying a high voltage pulse to the high voltage discharge lamp based on the voltage that is obtained by boosting a voltage supplied from the DC power source to thereby light the high voltage discharge lamp; and
a metal case for containing the wiring member and the circuit functional section,
wherein a filter circuit is provided and includes an inductor connected to the circuit functional section in series between a positive electrode of the DC power source and the circuit functional section and a first capacitor connected between both ends of the positive terminal and the negative terminal so as to be connected in parallel to the circuit functional section connected in series and the inductor,
wherein a portion of the negative terminal out of the wiring member is connected to the metal case, and the first capacitor is connected directly to the portion of the negative terminal out of the wiring member.

24. The discharge lamp apparatus as in claim 23, wherein:
the circuit functional section includes a first circuit section formed on a hybrid IC board, and a second circuit section including various electrical parts connected directly to the wiring member; and
the first capacitor is connected directly to the portion of the negative terminal out of the wiring member not by way of the hybrid IC board.

25. The discharge lamp apparatus as in claim 24, wherein:
the circuit functional section comprises a transformer for boosting a voltage supplied from the DC power source, a first switching element connected in series with a primary winding of the transformer, and a second capacitor connected in parallel with the transformer connected in series and the first switching element;
the circuit functional section includes a DC—DC converter connected in series to the DC power source to which the second capacitor is connected by way of wiring member and the second switching element connected in series with the second capacitor between the second capacitor and the portion of the negative terminal out of the wring member that serves for shutting down the electrical conduction when the polarity of the DC power source is reversed; and
the first capacitor is connected to the negative terminal side with respect to the second switching element.

26. The discharge lamp apparatus as in claim 25, wherein:
the first switching element and the second switching element are included in the first circuit section; and
the transformer and the second capacitor are included in the second circuit section.

27. A discharge lamp apparatus having a DC power source and a discharge lamp comprising:
a DC power source circuit for boosting a voltage of the DC power source by means of switching of a switching element and smoothing a boosted voltage by means of a smoothing capacitor;
an H-bridge circuit for AC-lighting the discharge lamp by means of an output voltage of the DC power source circuit; and
a starter circuit provided with a capacitor that is charged by means of an output voltage of the H-bridge circuit and a high voltage generation transformer having a primary winding connected to the capacitor and a secondary winding between the H-bridge circuit and the discharge lamp, the starter circuit being for boosting a charging voltage of the capacitor by means of the high voltage generation transformer when the discharge lamp is to be lighted and for applying the high voltage to the discharge lamp,
wherein the discharge lamp is an vehicle 35W bulb, and wherein L2 (value at DC superimposition 1.5 A)$\geq 2.5 \times 10^{-3}$ (henry), capacitance C1$\geq 0.5 \times 10^{-6}$ (farad), and L2 (value at DC superimposition 0.4 A)$\times$C1$\geq 1 \times 10^{-1} \times f^{-1.68}$ are satisfied, with L2 denoting an inductance of the secondary winding of the high voltage generation transformer, C1 denoting a capacitance of the smoothing capacitor, and f denoting a switching frequency of the switching element.

28. The discharge lamp apparatus as in claim 27, wherein:
the high voltage generation transformer applies a high voltage of 17 kV or higher to the discharge lamp with a charging voltage of the capacitor of 350 V to 400 V.

29. A discharge lamp apparatus comprising:
an inverter circuit including a H-bridge circuit having four semiconductor switching elements having MOS structure disposed in a H-bridge configuration and bridge driving circuits having output terminals to be connected to the gate terminals of the semiconductor switching elements for driving the four semiconductor switching elements; and
high voltage pulse generation means for applying a high voltage pulse to a discharge lamp to start lighting the discharge lamp, the high voltage pulse generation means being contained together with the inverter circuit in the same case,
wherein the bridge driving circuits have four sets of two MOS transistors connected directly so as to correspond to the four semiconductor switching elements, respectively, and the four semiconductor switching elements are driven based on a potential of junction points of the two MOS transistors connected directly,
wherein the output terminals of the bridge driving circuits are connected to gate terminals of the semiconductor switching elements of the H-bridge circuit by way of first resistors, and
wherein, for at least any one set of the four sets of the MOS transistors connected directly of the bridge driving circuits, drains and sources of MOS transistors at a low side out of the elements connected directly are connected by way of first capacitors.

30. The discharge lamp apparatus as in claim 29, wherein:
a capacitance value of the first capacitors and a resistance value of the first resistors are set so that a time constant determined by the capacitance value of the first capacitors and the resistance value of the first resistors is at least 0.2 microsecond.

31. The discharge lamp apparatus as in claim 29, wherein:
a MOS capacitance value and a resistance value of the first resistors are set so that a time constant determined by the MOS capacitance of the semiconductor switching elements having the MOS structure and the resistance value of the first resistors is at least 0.2 microsecond.

32. The discharge lamp apparatus as in claim 29, wherein:
for two of the four driving circuits, the middle potential points of the H-bridge circuit are connected to the terminals provided as a negative electrode side reference potential, and, for other two of the four driving circuits, the ground potential point is connected to the terminals that are provided as the negative electrode side reference potential;
the four driving circuits drive the four semiconductor switching elements, respectively, based on a potential difference between the output terminals and the negative electrode side reference potential of the driving circuits; and
on at least any one of the two bridge driving circuits having the terminals provided as the negative electrode side reference potential are connected to the middle potential points of the H-bridge circuit, the middle potential points of the H-bridge circuit are connected to the terminals provided as the negative electrode side reference potential by way of second resistors, the middle points between the resistors and terminals provided as the negative electrode side reference potential are connected to the ground potential point by way of second capacitors.

33. A discharge lamp apparatus as in claim 32, wherein:
a resistance value of the second resistors and a capacitance value of the second capacitors are set so that a time constant determined by the resistance value of the second resistors and the capacitance value of the second capacitors is at least 0.01 microsecond.

34. A discharge lamp apparatus comprising:
an inverter circuit including a H-bridge circuit having four semiconductor switching elements having MOS structure disposed in a H-bridge configuration and bridge driving circuits for driving the four semiconductor switching elements; and
high voltage pulse generation means for applying a high voltage pulse to a discharge lamp to start the lighting of the discharge lamp, the high voltage pulse generation means being contained together with the inverter circuit in the same case,
  wherein the bridge driving circuits have four driving circuits for driving the four semiconductor switching elements, respectively, output terminals of the four driving circuit are connected to gate terminals of the four semiconductor switching elements, respectively, and the four semiconductor switching elements are driven based on a potential difference between the output terminals and negative electrode side reference potential of the driving circuits, respectively,
  wherein the output terminals of the bridge driving circuits are connected to the gate terminals of the semiconductor switching elements of the H-bridge circuit by way of first resistors, and
  wherein, for at least any one of the four driving circuits, the output terminal is connected to a wiring provided as the negative electrode side reference potential by way of first capacitors.

35. A discharge lamp apparatus having a discharge lamp comprising:
an inverter circuit including a H-bridge circuit having four semiconductor switching elements having MOS structure disposed in a H-bridge configuration and bridge driving circuits having output terminals to be connected to gate terminals of the semiconductor switching elements for driving the four semiconductor switching elements; and
high voltage pulse generation means for applying a high voltage pulse to the discharge lamp to start lighting the discharge lamp, the high voltage pulse generation means being contained together with the inverter circuit in the same case,
  wherein the output terminals of the bridge driving circuits are connected to gate terminals of the semiconductor switching elements of the H-bridge circuit by way of first resistors, and
  a MOS capacitance value and a resistance value of the first resistors are set so that a time constant determined by the MOS capacitance value of the semiconductor switching elements having the MOS structure and the resistance value of the first resistors is at least 0.2 microsecond.

36. A discharge lamp apparatus comprising;
an inverter circuit including a H-bridge circuit having four semiconductor switching elements having a MOS structure disposed in a H-bridge configuration and bridge driving circuits for driving the four semiconductor switching elements; and
high voltage pulse generation means for applying a high voltage pulse to a discharge lamp to start lighting the discharge lamp, the high voltage pulse generation means being contained together with the inverter circuit in a same case,
  wherein the bridge driving circuits have four driving circuits for driving the four semiconductor switching elements, respectively, output terminals of the four driving circuit are connected to gate terminals of the four semiconductor switching elements, respectively, for two of the four driving circuit middle potential points of the H-bridge circuit are connected to terminals provided as a negative electrode side reference potential, for other two of the four driving circuits a ground potential point is connected to terminals provided as a negative electrode side reference potential, the four driving circuits drive the four semiconductor switching elements, respectively, based on a potential difference between the output terminals and the negative electrode side reference potential of the driving circuits, and
  on at least any one of the two bridge driving circuits having the terminals provided as the negative electrode side reference potential are connected to the middle potential points of the H-bridge circuit, the middle potential point of the H-bridge circuit is connected to the terminals provided as the negative electrode side reference potential by way of resistors, the middle points between the resistors and terminals provided as the negative electrode side reference potential are connected to the ground potential point by way of second capacitors.

37. A discharge lamp apparatus as in claim 36, wherein:
a resistance value of the resistors and a capacitance value of the capacitors are set so that a time constant determined by the resistance value of the resistors and the capacitance value of the capacitors is at least 0.01 microsecond.

38. A discharge lamp apparatus comprising:
an inverter circuit including a H-bridge circuit having four IGBTs disposed in a H-bridge configuration and bridge driving circuits for driving the four IGBTs,
  wherein the bridge driving circuits have four driving circuits for driving the four IGBTS, respectively, output terminals of the four driving circuits are connected to gate terminals of the four IGBTS, respectively, and the four driving circuits drive the four IGBTs respectively based on a potential difference between the output terminals and negative electrode side reference potential of the driving circuits, and
  wherein, for two of the four driving circuits, middle potential points of the H-bridge circuit are connected to terminals provided as the negative electrode side reference potential, for other two of the four driving circuits a ground potential point is connected to terminals provided as the negative electrode side reference potential, and
  clamp means are connected to the terminal provided as the negative electrode side reference potential so that the terminal provided as the negative electrode side reference potential connected to the middle potential point of the H-bridge circuit in the bridge driving circuit is equalized to a predetermined voltage.

39. The discharge lamp apparatus as in claim 38, wherein:
the clamp means are diodes; and
the terminal provided as the negative electrode side reference potential is connected to the ground potential point.

40. The discharge lamp apparatus as in claim 38, wherein:
in the two bridge driving circuits in which the terminal provided as the negative electrode side reference voltage is connected to the middle potential point of the H-bridge circuit; and the middle potential point of the H-bridge circuit is connected to the terminal provided as the negative electrode side reference potential by way of resistors.

41. A discharge lamp apparatus comprising:

an inverter circuit including a H-bridge circuit having four IGBTs disposed in a H-bridge configuration and bridge driving circuits for driving the four IGBTS, wherein the bridge driving circuits have four driving circuits for driving the four IGBTs, respectively, output terminals of the four driving circuit are connected to gate terminals of the four IGBTs, respectively, and the four driving circuits drive the four IGBTs respectively based on a potential difference between the output terminals and the negative electrode side reference potential of the driving circuits, wherein, for two of the four driving circuits middle potential points of the H-bridge circuit are connected to the terminals provided as a negative electrode side reference potential, for other two of the four driving circuits a ground potential point is connected to the terminals provided as a negative electrode side reference potential, and wherein, in the two bridge driving circuits in which the terminal provided as the negative electrode side reference potential is connected to a middle potential point of the H-bridge circuit, the middle potential point of the H-bridge circuit is connected to the terminal provided as the negative electrode side reference potential by way of resistors, and a middle point between the resistors and the terminal provided as the e negative electrode side reference potential is connected to the ground potential point by way of diodes.

42. A discharge lamp apparatus having a DC power source and a discharge lamp comprising:

a DC—DC converter for boosting a voltage of the DC power source by a transformer; and an inverter circuit including a H-bridge circuit having four semiconductor switching elements disposed in a H-bridge configuration and bridge driving circuits for controlling on/off operation of the four semiconductor switching elements using the voltage boosted by the DC—DC converter as a voltage supply source, the voltage boosted by the DC—DC converter being converted to an AC voltage by the inverter circuit and the AC voltage being applied to the discharge lamp to AC-light the discharge lamp, wherein the voltage of the DC power source is applied to the DC—DC converter, on/off operation of the semiconductor switching elements is started after a predetermined time elapses from a time point when the DC—DC converter starts the operation, and the semiconductor switching elements are kept in off state before the predetermined time elapses.

43. The discharge lamp apparatus as in claim 42, further comprising:

a capacitor charged by the voltage boosted by the DC—DC converter as the voltage supply source, wherein the boosted voltage of the DC—DC converter is applied as an operating voltage of the bridge control circuits, and wherein the charging voltage of the capacitor is applied instead when the boosted voltage of the DC—DC converter drops.

44. The discharge lamp apparatus as in claim 42, further comprising:

an H-bridge control circuit for generating a control signal for controlling the bridge driving circuits, wherein the bridge driving circuit controls the on/off operation of the four semiconductor switching elements based on the control signal, and wherein the H-bridge control circuit supplies the control signal that functions to turn off all the four semiconductor switching element to the bridge driving circuits during the time before the predetermined time elapses.

45. The discharge lamp apparatus as in claim 42, further comprising:

a fail-safe circuit for detecting grounding based on the lamp voltage applied to the discharge lamp and a lamp current that flows through the discharge lamp; and a H-bridge off circuit for supplying the control signal that functions to turn off all the four semiconductor switching elements to the bridge driving circuits when grounding is detected.

* * * * *

UNITED STATES PATENT AND TRADEMARK OFFICE
CERTIFICATE OF CORRECTION

PATENT NO.    : 6,392,364 B1
DATED         : May 21, 2002
INVENTOR(S)   : Yamamoto et al.

It is certified that error appears in the above-identified patent and that said Letters Patent is hereby corrected as shown below:

<u>Title page,</u>
Item [73], add -- Koito Manufacturing Co., Ltd., Tokyo, Japan -- as another assignee.

Signed and Sealed this

Twenty-fourth Day of September, 2002

*Attest:*

JAMES E. ROGAN
*Attesting Officer*     *Director of the United States Patent and Trademark Office*